(12) United States Patent
Iwai et al.

(10) Patent No.: US 8,837,240 B2
(45) Date of Patent: *Sep. 16, 2014

(54) SEMICONDUCTOR MEMORY DEVICE AND DEFECTIVE CELL RELIEVING METHOD

(75) Inventors: Takayuki Iwai, Setagaya-ku (JP); Makoto Takahashi, Yokohama (JP); Masaharu Wada, Yokohama (JP); Mariko Iizuka, Yokohama (JP); Kimimasa Imai, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 51 days.

This patent is subject to a terminal disclaimer.

(21) Appl. No.: 13/618,976

(22) Filed: Sep. 14, 2012

(65) Prior Publication Data
US 2013/0077420 A1    Mar. 28, 2013

Related U.S. Application Data

(63) Continuation-in-part of application No. 13/425,364, filed on Mar. 20, 2012, now Pat. No. 8,675,431.

(30) Foreign Application Priority Data

Aug. 31, 2011    (JP) .................................. 2011-188096

(51) Int. Cl.
*G11C 7/00*    (2006.01)
*G11C 29/00*    (2006.01)
*G11C 29/04*    (2006.01)

(52) U.S. Cl.
CPC .......... *G11C 29/76* (2013.01); *G11C 2229/743* (2013.01); *G11C 29/78* (2013.01); *G11C 29/785* (2013.01); *G11C 2229/746* (2013.01); *G11C 2029/0401* (2013.01); *G11C 29/789* (2013.01)
USPC ..................................... 365/200; 365/230.06

(58) Field of Classification Search
CPC .................................. G11C 29/04; G11C 8/08
USPC ............................................. 365/200, 230.06
See application file for complete search history.

(56) References Cited

U.S. PATENT DOCUMENTS 5,134,616 A    7/1992    Barth et al.
(Continued)

FOREIGN PATENT DOCUMENTS

JP    2006-186247    7/2006
JP    2012-064282    3/2012

OTHER PUBLICATIONS

U.S. Appl. No. 13/425,364, filed Mar. 20, 2012, Iwai et al.

*Primary Examiner* — Michael Tran
(74) *Attorney, Agent, or Firm* — Knobbe, Martens, Olson & Bear LLP

(57) ABSTRACT

A memory cell array of a first semiconductor chip includes a normal cell array and a spare cell array. A first defect address data storage circuit outputs first defect address data indicating an address of a defective memory cell in the memory cell array. A first comparison circuit compares address data with the first defect address data and outputs a first match signal in case of matching. A second defect address data storage circuit outputs second defect address data indicating an address of a defective memory cell in the memory cell array. A second comparison circuit compares the address data with the second defect address data and outputs a second match signal in case of matching.

18 Claims, 56 Drawing Sheets

(56) References Cited

U.S. PATENT DOCUMENTS

| | | |
|---|---|---|
| 8,644,086 B2 | 2/2014 | Ide et al. |
| 2003/0014687 A1 | 1/2003 | Wu |
| 2006/0064539 A1* | 3/2006 | Mukaida et al. ............ 711/103 |
| 2008/0170448 A1* | 7/2008 | Barth et al. ................. 365/200 |
| 2008/0279020 A1* | 11/2008 | Ogawa et al. ............... 365/200 |
| 2009/0213634 A1 | 8/2009 | Shibata |
| 2011/0087835 A1* | 4/2011 | Sato et al. .................. 711/106 |
| 2013/0051167 A1 | 2/2013 | Iwai et al. |

* cited by examiner

FIG. 35

| Order of Address Set | D_SWLB | Addfsrow | | |
|---|---|---|---|---|
| 1 | 1 | — | SWL[0] | |
| — | 1 | — | SWL[1] | |
| — | 0 | — | SWL[2] | ✗ Wafer-level Defect |
| — | 1 | — | SWL[3] | |
| — | 0 | — | SWL[4] | |
| ⋮ | ⋮ | ⋮ | | |
| — | 0 | — | SWL[m−i−1] | |
| — | 0 | 0 | SWL[m−i] | |
| ⋮ | ⋮ | ⋮ | | |
| 3 | 1 | 0 | SWL[m−3] | |
| 2 | 1 | 0 | SWL[m−2] | |
| — | 0 | 1 | SWL[m−1] | ✗ Wafer-level Defect |
| 1 | 1 | 0 | SWL[m] | |

Available for Defect Relief After PKG

FIG. 39

| Addrow[e] | DSWLB | | | | | | | | | | | | | |
|---|---|---|---|---|---|---|---|---|---|---|---|---|---|---|
| | | 1 | 1 | 0 | 1 | 0 | ... | 0 | 0 | ... | 1 | 1 | 1 | 0 |
| | | - | - | - | - | - | ... | - | 1 | ... | 0 | 0 | 0 | 0 |
| | | SWL[0] | SWL[1] | SWL[2] | SWL[3] | SWL[4] | | SWL[m-i-1] | SWL[m-i] | | SWL[m-3] | SWL[m-2] | SWL[m-1] | SWL[m] |

Defect at PKG ✗

⋮

| Addrow[1] | - | - | - | - | - | ... | - | 1 | ... | 1 | 1 | 0 | 0 |
|---|---|---|---|---|---|---|---|---|---|---|---|---|---|
| Addrow[0] | - | - | - | - | - | ... | 1 | 1 | ... | 1 | 0 | 1 | 0 |

Available for Defect Relief After PKG

SEMICONDUCTOR MEMORY DEVICE AND DEFECTIVE CELL RELIEVING METHOD

CROSS REFERENCE TO RELATED APPLICATIONS

This application is continuation-in-part of U.S. patent application Ser. No. 13/425,364 filed on Mar. 20, 2012, which claims the benefit of priority of Japanese Patent Application No. 2011-188096, filed on Aug. 31, 2011, the entire contents of each of which are incorporated herein by reference.

FIELD

Embodiments described herein relate generally to a semiconductor device and a defective cell relieving method.

BACKGROUND

In recent years, multi-chip modules (MCM) formed by stacking a plurality of semiconductor chips on a substrate have been gaining more and more importance. The MCM technique allows plural types of semiconductor chips manufactured by different manufacturing processes to be stacked on one substrate and formed as one module. For example, it is possible to manufacture chips including a logic circuit (logic chips) and chips including a semiconductor memory device (memory chips) by different manufacturing processes respectively. Then, after passing them through a test process, it is possible to combine different types of non-defective chips to form one module. This process can achieve a higher yield than that achieved when forming a logic circuit and a circuit including a memory on one substrate by a series of manufacturing processes.

However, the problem of this process is that if an after-wafer-level defect occurs during a packaging process or after the packaging process due to a thermal stress or the like, such a defect cannot be relieved, resulting in defective products and a yield drop.

BRIEF DESCRIPTION OF THE DRAWINGS

FIG. 35 is a schematic view showing operation in the sixteenth embodiment.

FIG. 39 is a schematic view showing operation in the eighteenth embodiment.

DETAILED DESCRIPTION

The semiconductor device according to the embodiments to be described below includes a first semiconductor chip including a semiconductor memory device and provided in a package, and a second semiconductor chip including a control circuit configured to control the semiconductor memory device and provided in the package.

The first semiconductor chip includes a memory cell array, a first defect address data storage circuit, a first comparison circuit, and a decoder. The memory cell array includes a normal cell array configured by arranging memory cells at the intersections of a plurality of first lines and a plurality of second lines, and a spare cell array configured by arranging spare cells for replacing the normal cell array. The first defect address data storage circuit outputs first defect address data indicating the address of a defective memory cell in the memory cell array.

The first comparison circuit compares address data indicating the address of a memory cell with the first defect address data to output a first match signal in case of matching.

The decoder decodes the address data and selects the memory cell in the normal cell array, or when the first match signal is output, selects a first spare cell in the spare cell array instead of the memory cell in the normal cell array.

The second semiconductor chip includes a control circuit, a second defect address data storage circuit, and a second comparison circuit. The control circuit controls the operation of the first semiconductor chip. The second defect address data storage circuit outputs second defect address data indicating the address of a defective memory in the memory cell array. The second comparison circuit compares the address data with the second defect address data and outputs a second match signal in case of matching. The decoder is configured to select a second spare cell in the spare cell array when the second match signal is output.

The embodiments of the present invention will now be explained in detail with reference to the drawings.

[First Embodiment]

Figure 1A:
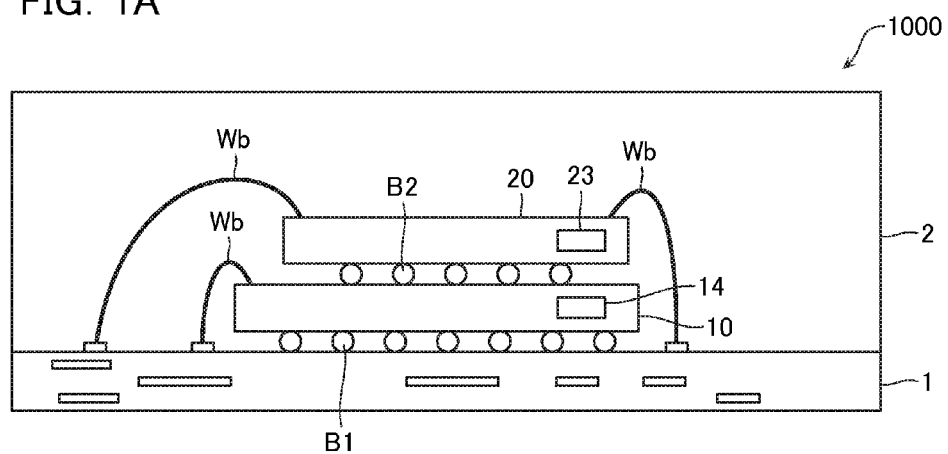
FIG. 1A is a schematic diagram showing the whole configuration of a semiconductor device 1000 according to a first embodiment.

FIG. 1A is a schematic diagram showing the whole configuration of a semiconductor device 1000 according to the first embodiment. For example, the semiconductor device 1000 according to the present embodiment is a multi-chip module (MCM) formed by mounting a memory chip 10 and a logic chip 20 on a principal surface of a package substrate 1 in their bare chip state so as to be stacked in this order, and covering them with a sealing resin 2. The memory chip 10 is a semiconductor chip including a semiconductor memory device (memory circuit), and the logic chip 20 is a semiconductor chip including a memory controller configured to control the memory circuit.

In the semiconductor device 1000, the memory circuit in the memory chip 10 is tested before packaging. According to the result of the test, address data of a defective memory cell is written into a fuse circuit 14 in the memory chip 10. Furthermore, the semiconductor device 1000 according to the present embodiment is capable of writing address data of a defective memory cell that occurs during packaging or after packaging into a fuse circuit 23 (Fuse Block (eFuse)) in the logic chip 20 after packaging is completed. This can improve the redundancy rate and the yield. Note that the fuse circuit 23 may be a circuit including a fuse element and a latch circuit, for example. The fuse circuit 23 may be configured by a non-volatile memory instead of a fuse element.

The package substrate 1 is a multilayer interconnect substrate made of a glass epoxy resin or the like, and multilayer interconnections are formed thereon and therein in several layers.

In FIG. 1A, the memory chip 10 is mounted on the package substrate 1 through solder bumps B1. The solder bumps B1 electrically connect the multilayer interconnections in the package substrate 1 and the terminals of the memory chip 10.

Figure 1B:
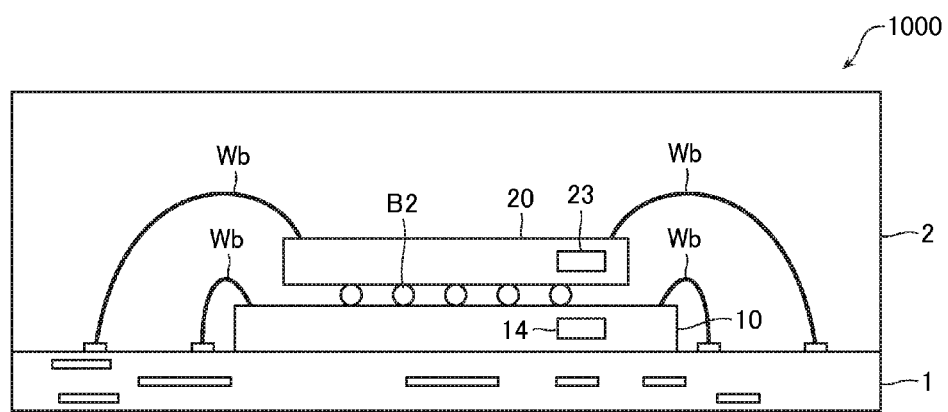
FIG. 1B is a schematic diagram showing another example of the whole configuration of the semiconductor device 1000 according to the first embodiment.

The logic chip 20 is stacked on the upper surface of the memory chip 10 through solder bumps B2. As shown in FIG. 1A, the memory chip 10 and the logic chip 20 can be electrically connected to the package substrate 1 by wire bonding Wb. The MCM shown in FIG. 1A is merely one example, and it is also possible to employ a configuration in which the memory chip 10 and the logic chip 20 are both formed on the package substrate 1 in parallel and the memory chip 10 and the logic chip 20 are connected only by wire bonding. Moreover, the embodiments to be described below can be applied to a semiconductor device having a configuration in which the memory chip 10 and the logic chip 20 packaged with the sealing resin 2 individually are disposed on a printed substrate. In FIG. 1A, the memory chip 10 is electrically connected to the substrate 1 through the semiconductor bumps B1 formed in through-silicon vias. However, it is also possible to employ a configuration shown in FIG. 1B in which no through-silicon vias are used and the memory chip 10 and the substrate 1 are connected only by wire bonding Wb. Furthermore, it is also possible to connect the memory chip 10 and the logic chip 20 by a wireless communication means instead of a physical electric connection means using a conductive material.

Figure 2:
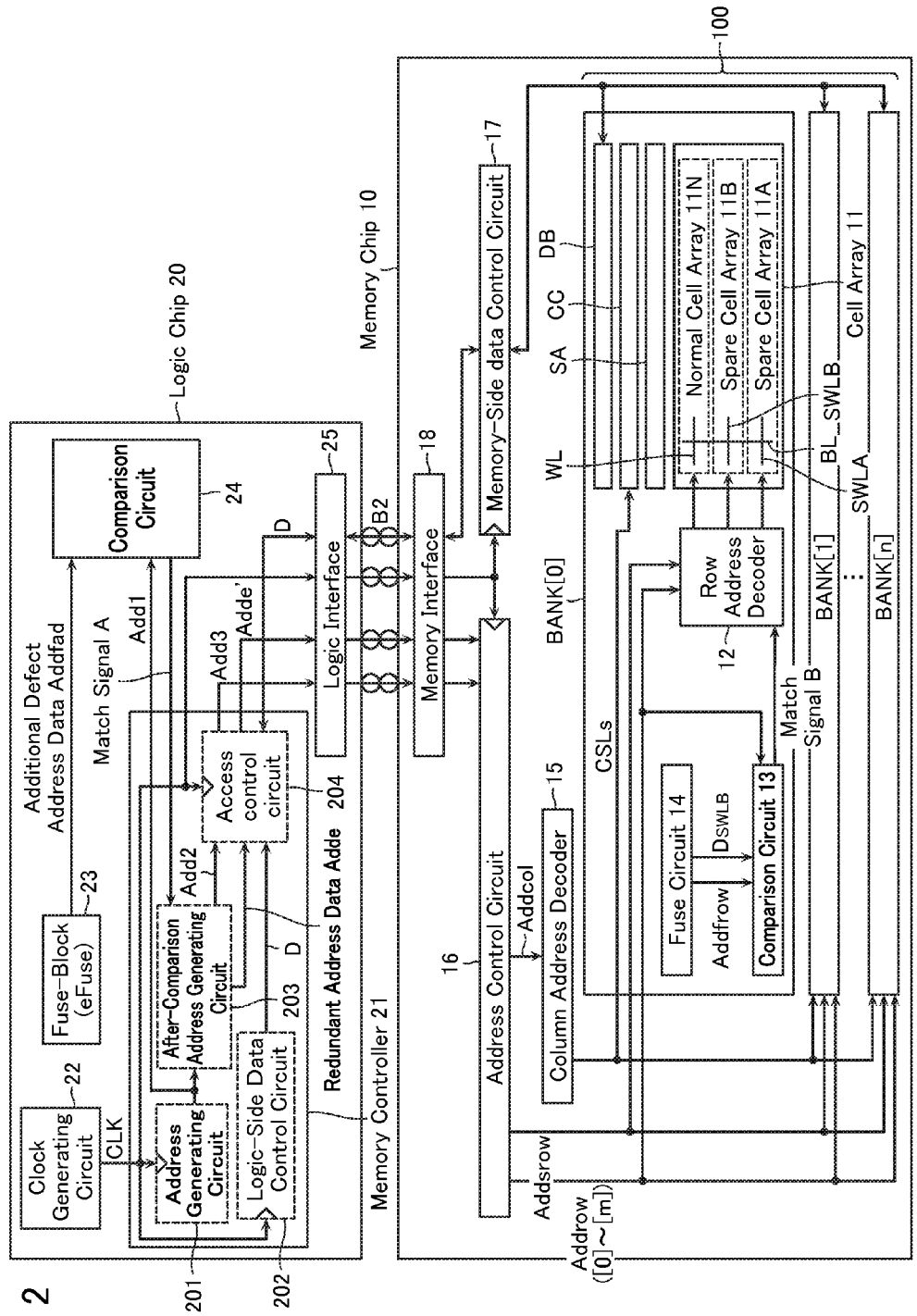
FIG. 2 is a block diagram showing an example of specific configurations of a memory chip 10 and a logic chip 20 included in the semiconductor device 1000 according to the first embodiment.

FIG. 2 is a block diagram showing an example of specific configurations of the memory chip 10 and the logic chip 20. As shown in FIG. 2, the memory chip 10 includes a memory circuit 100. The memory circuit 100 is divided into a plurality of banks BANK[0] to BANK[n]. Each of the banks BANK[0] to BANK[n] includes a memory cell array 11, a row address decoder 12, a comparison circuit 13, and a fuse circuit 14.

The memory cell array 11 is, for example, a DRAM (Dynamic Random Access Memory), and configured by arranging DRAM memory cells (for example, 1T1C cells formed of a capacitor and a transistor) at the intersections of bit lines BL and word lines WL.

The memory cell array 11 includes a normal cell array 11N for storing data, and spare cell arrays 11A and 11B for replacing defective cells in the normal cell array 11N. Here, explanation will be given by taking, for example, a case where a defective cell detected during a wafer process before a packaging process is replaced by the spare cell array 11B, and a defective cell detected during or after a packaging process is replaced by the spare cell array 11A. However, the present invention is not limited to this case.

It is only necessary that the two spare cell arrays 11A and 11B be divided into individual address spaces, and it is not necessary that these spare cell arrays be divided physically. For example, it is possible to employ a configuration in which spare cell arrays SWLA and SWLB are arranged physically alternately.

A sense amplifier circuit SA configured to sense and amplify the potentials of the bit lines BL, a column control circuit CC configured to control the potentials of the bit lines BL, and a data buffer DB configured to temporarily retain data read out by the sense amplifier circuit SA are provided on the extended lines of the bit lines BL of the memory cell array 11.

The fuse circuit 14 retains defective row address data Addfrow indicating the address of a word line WL connected to a defective cell in the normal cell array 11N. The fuse circuit 14 also retains information (spare word line usage information $D_{SWLB}$) indicating whether each one of the plurality of spare word lines SWLB in the spare cell array 11B is used or not. The spare word line usage information $D_{SWLB}$ corresponds to the defective row address data Addfrow.

The comparison circuit 13 has a function of comparing row address data Addrow indicating the address of a word line WL to be accessed and spare row address data Addsrow with defective row address data Addfrow written in the fuse circuit 14. The spare row address data Addsrow is data indicating that the address of a defective cell has been given designated by an address data in the logic chip 20, and is data for indicating the address of a spare word line SWLA in the spare cell array 11A. That is, address data (additional defect address data) Addfad of a defective cell detected during or after a packaging process is stored in the logic chip 20. The spare row address data Addsrow becomes "1" when additional defect address data Addfad and the designated address match, and becomes "0" otherwise.

When the row address data Addrow and defective row address data Addfrow match, the comparison circuit 13 generates and outputs a match signal B="1". When the spare row address data Addsrow is "1", the comparison circuit 13 outputs a match signal B by setting it to B="0".

The row address decoder 12 receives and decodes the row address data Addrow, the spare row address data Adds row, and the match signal B, and selects a word line WL in the normal cell array 11N or a spare word line SWLA or SWLB in the spare cell array 11A or 11B and the memory cells connected to such a word line. As will be described later, row address data Addrow and spare row address data Addsrow are generated based on address data sent from the logic chip 20.

The memory chip 10 includes a column address decoder 15, an address control circuit 16, a memory-side data control circuit 17, and a memory interface 18 which are provided commonly for the plurality of banks BANK.

The column address decoder 15 outputs a column selecting signal CSLs in accordance with column address data Addcol received from the address control circuit 16. The address control circuit 16 receives address data Add3 and redundant address data Adde' from the logic chip 20 through the memory interface 18, generates row address data Addrow[0] to Addrow[m], spare row address data Addsrow, and column address data Addcol based on the received data, and outputs them.

The memory-side data control circuit 17 has a function of feeding data D supplied from the logic chip 20 to the memory cell array 11 as write data, and conversely feeding data read out from the memory cell array 11 to the logic chip 20 as read-out data.

The memory interface 18 is in charge of sending and receiving address data and write/read-out data D to be exchanged between the logic chip 20 and the memory chip 10.

Next, a specific configuration of the logic chip 20 will be explained. The logic chip 20 includes a memory controller 21, a clock generating circuit 22, a fuse circuit 23, a comparison circuit 24, and a logic interface 25.

The logic chip 20 is configured to be capable of storing the address of a defective memory cell which occurs in the memory cell array 11 during or after a packaging process of the memory chip 10 and logic chip 20 in the fuse circuit 23 as additional defect address data Addfad. The comparison circuit 24 compares additional defect address data Addfad stored in the fuse circuit 23 with address data Add1 supplied from the memory controller 21, and outputs a match signal A when both the signals match. The match signal A is sent to the memory controller 21.

The memory controller 21 has a function of supplying address data, command data, and data D to be written into the memory cell array 11 to the memory chip 10 and thereby controlling the memory chip 10. The memory controller 21 further includes an address generating circuit 201, a logic-side data control circuit 202, an after-comparison address generating circuit 203, and an access control circuit 204.

The address generating circuit 201 generates address data Add1 in accordance with address data received from an unillustrated host device or the like. The logic-side data control circuit 202 generates data D including data to be written into the memory cell array 11, etc. based on data received from an unillustrated host device or the like.

The after-comparison address generating circuit 203 converts the address data Add1 based on the match signal A and thereby outputs address data Add2 and redundant address data Adde. When the address data Add1 doesn't match additional defect address data Addfad, the address data Add1 is used as it is as the address data Add2. When the address data Add1 matches additional defect address data Addfad, the address data Add1 is converted to address data Add2 indicating an address in the spare cell array 11A of the memory cell array 11. The redundant address data Adde is one-bit data which becomes "1" when it is confirmed that additional defect address data Addfad matches the address data Add1, and becomes "0" otherwise.

The access control circuit 204 receives the address data Add2, the redundant address data Adde, and the data D, and supplies address data Add3 corresponding to the address data Add2, redundant address data Adde' corresponding to the redundant address data Adde, and the data D to the memory chip 10 through the logic interface 25 and the memory interface 18 at a certain timing. The data D having passed through the memory interface 18 is transferred by the memory-side data control circuit 17 in synchronization with a clock CLK, and sent to the memory cell array 11 of each bank BANK[0] to BANK[n]. The address data Add3 and the redundant address data Adde' are controlled by the address control circuit 16 in the memory chip 10 in synchronization with the clock CLK.

The clock generating circuit 22 generates the clock CLK, and supplies it to the address generating circuit 201, the logic-side data control circuit 202, and the access control circuit 204, and to the address control circuit 16 and the memory-side data control circuit 17. The address generating circuit 201, the logic-side data control circuit 202, and the access control circuit 204 operate at the timings defined by the clock CLK.

Figure 3A:
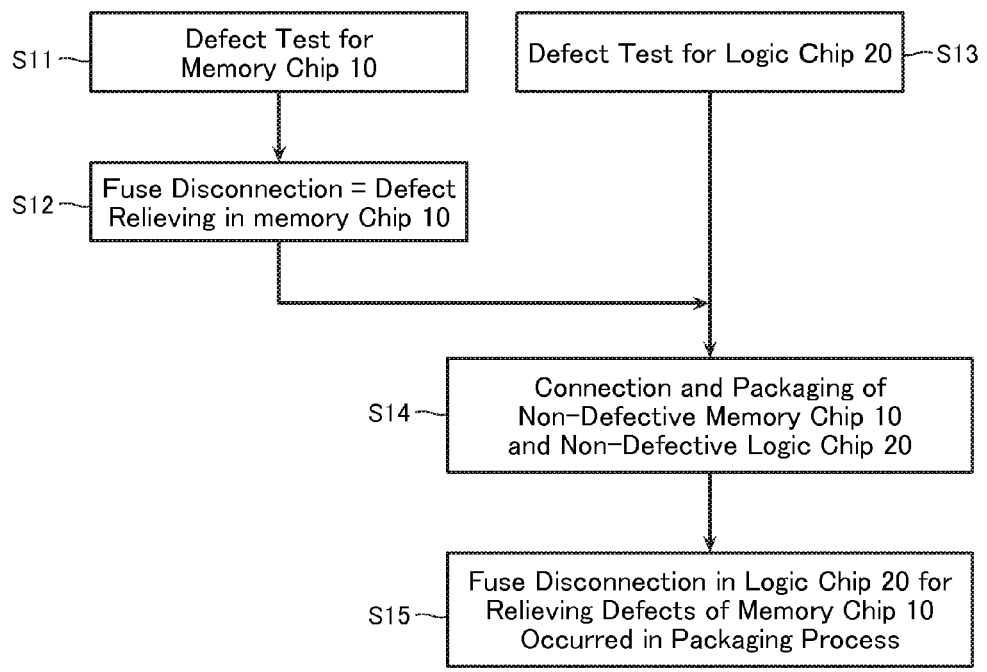
FIG. 3A explains a defective cell relieving procedure of the semiconductor device 1000 according to the first embodiment.

Next, a defective cell relieving procedure of the semiconductor device 1000 according to the present embodiment will be explained with reference to FIG. 3A. Presence or absence of defective memory cell in the memory cell array 11 in the memory chip 10 included in the semiconductor device 1000 is checked in a stage which is before a packaging process is carried out and in which memory chips 10 have not yet been diced from the wafer (wafer process) (S11). When presence of a defective cell is identified in this test in the wafer process, the address of this defective cell (defective row address data Addfrow) is stored in the fuse circuit 14 by fuse disconnection or the like in the fuse circuit 14 (S12).

In parallel with this, a defect test for the various circuits constituting the logic chip 20 is performed (S13). In this way, a memory chip 10 having undergone the defect test (and a defect relieving operation) and a logic chip 20 likewise having undergone the defect test are mounted on one package substrate 1, electrically connected through the solder bumps B1 and B2, the wire bonding Wb, etc., and then packaged by the sealing resin 2 (S14). Thereby, the semiconductor device 1000 is completed. A defective cell might occur while the packaging process of S14 is carried out or after the packaging process is completed.

In the present embodiment, a defect test for the memory cell array 11 is performed after packaging is completed, in order to relieve after-wafer-level defective cells which might occur during or after the packaging process (S15). The address of a defective cell detected in such an after-wafer-level test is stored in the fuse circuit 23 of the logic chip 20 as additional defect address data Addfad. In this way, according to the semiconductor device 1000 of the present embodiment, even if an after-wafer-level defect occurs during or after the packaging process due to a thermal stress or the like, it is possible to prevent a yield drop by relieving the defect.

Figure 3B:
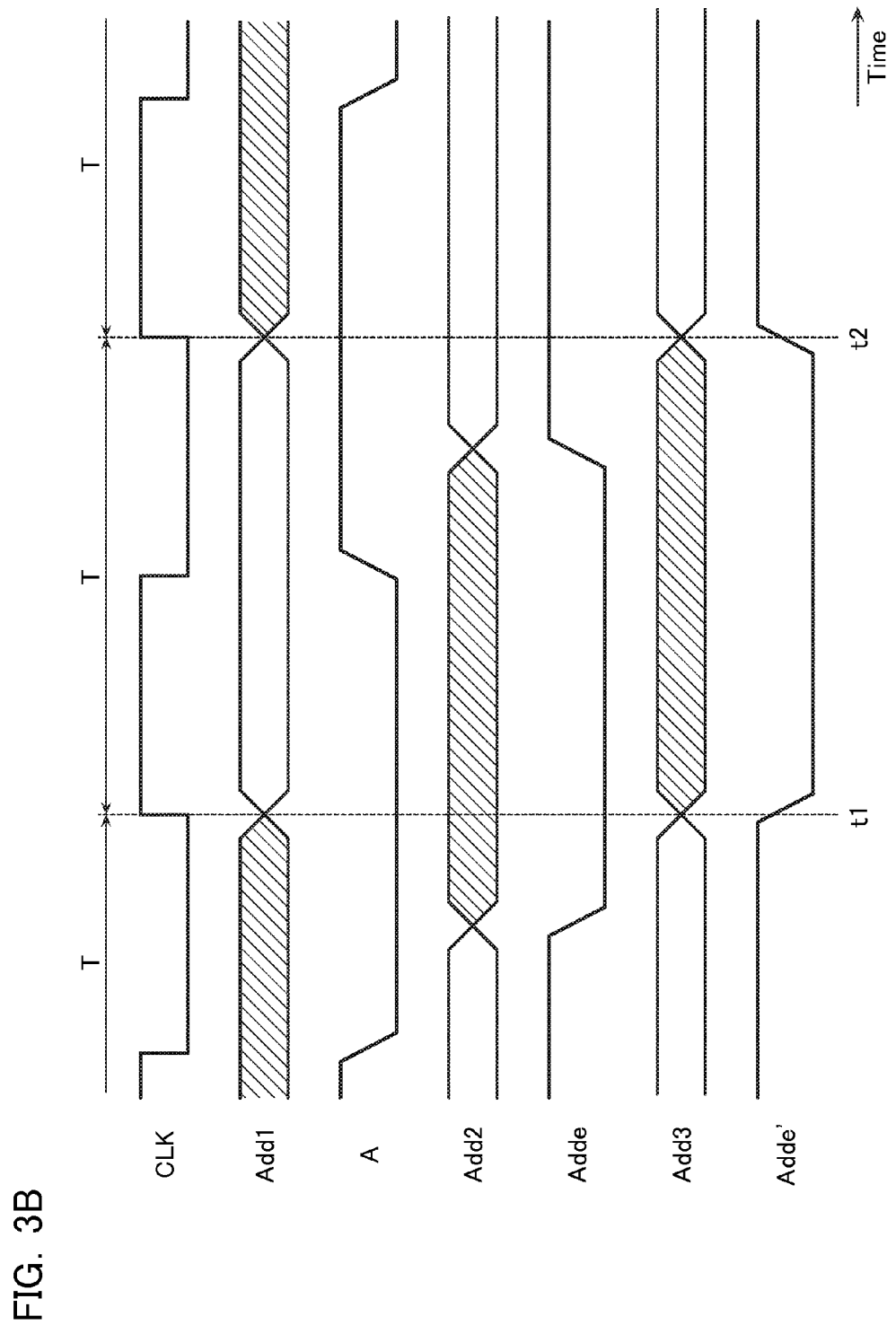
FIG. 3B is a timing chart showing an operation of the logic chip 20.

FIG. 3B is a timing chart showing operations in the logic chip 20. As shown in FIG. 3B, generation of address data Add1 by the address generating circuit 201, issuance of a match signal A by the comparison circuit 24, generation of address data Add2 and Add3 and generation of redundant address data Adde and Adde' by the after-comparison address generating circuit 203 and the access control circuit 204 are performed within one cycle (cycle T) of the clock CLK. With the operations performed in this way, the access control circuit 204 can let the comparison circuit 24 complete the comparison and issue address data Add3 and redundant address data Adde' before the timing at which the logic chip 20 accesses the memory chip 10, which can improve the operation speed.

Figure 4:
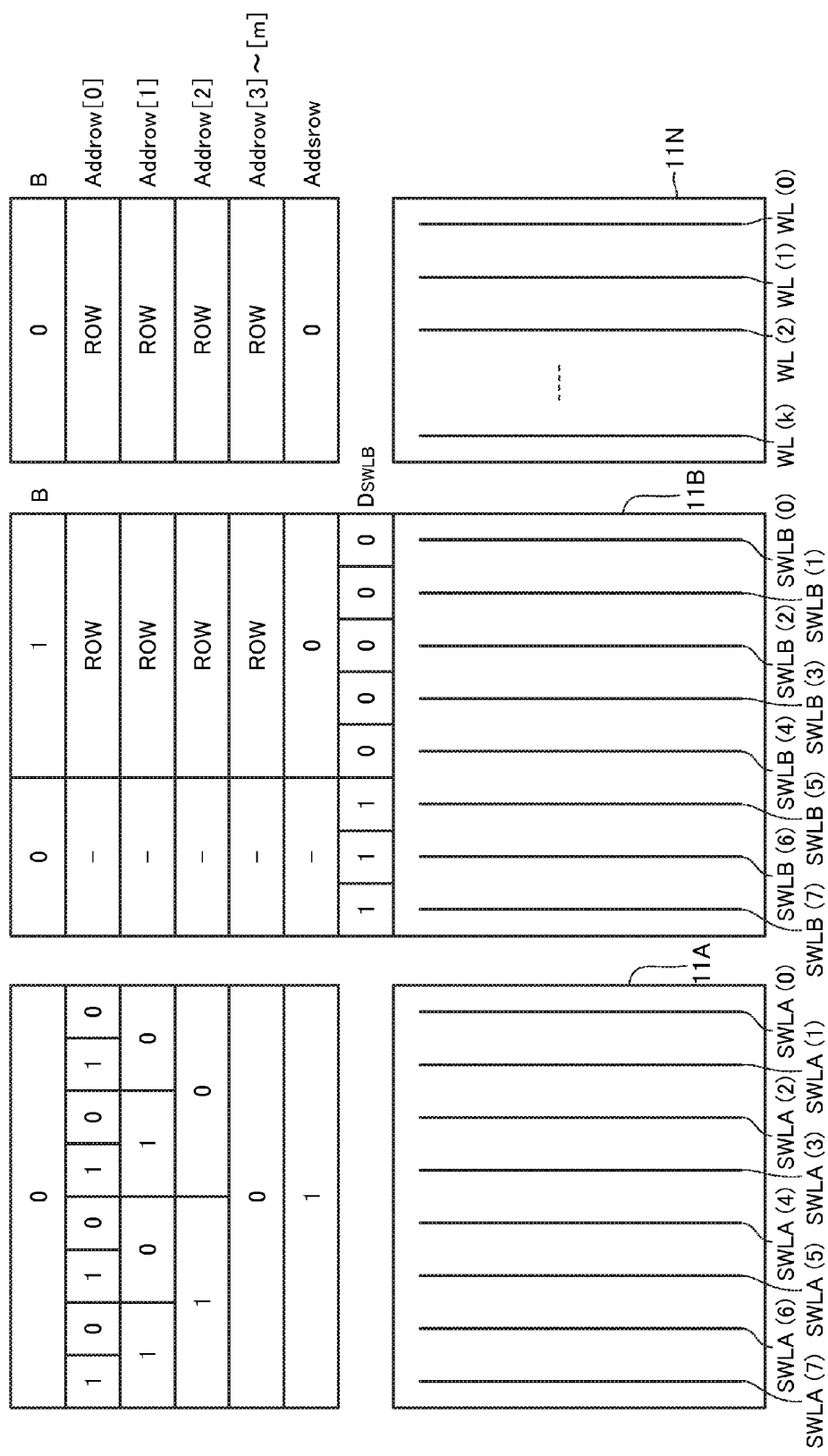
FIG. 4 shows an outline of a defect relieving procedure of a memory cell array 11 of the semiconductor device according to the first embodiment.

FIG. 4 shows an outline of a defect relieving procedure of the memory cell array 11 to be performed in accordance with row address data Addrow, spare address data Addsrow, and a match signal B. Here, explanation will be given by taking, for example, a case where the normal cell array 11 includes $k=2^{(m+1)}$ number of word lines WL(0) to WL(k), and the spare cell arrays 11A and 11B include eight spare word lines SWLA(0) to SWLA(7) and SWLB(0) to SWLB(7) respectively. As described above, the spare cell array 11A is used for relieving a defective cell that occurs during or after a packaging process, and the spare cell array 11B is used for relieving a defective cell that occurs before the packaging process (during a wafer process). Here, the number of word lines WL and the number of spare word lines SWLA and SWLB are specified for the sake of convenience of explanation, but needless to say, the present invention is not limited to cases in which any specific number of word lines are provided.

First, a defect relieving operation for defective cells detected during a wafer process will be explained. For example, assume a case where defective cells occur during a wafer process in the normal cell array 11N of a given bank BANK[j] (j=0 to n), and five word lines WL are connected to these defective cells. In this case, the addresses of these five defective word lines WL are specified in a defect test performed in the wafer process, and written into the fuse circuit 14 as defective row address data Addfrow. The five word lines WL are relieved by using, for example, five spare word lines SWLB(0) to SWLB(4) in the spare cell array 11B. The spare word lines SWLB(0) to SWLB(4) used for relieving the five defective word lines WL are assigned "0" as the spare word line usage information $D_{SWLB}$. The other unused spare word lines SWLB(5) to SWLB(7) are assigned "1" as the spare word line usage information $D_{SWLB}$. The spare word lines SWLB assigned "1" as the spare word line usage information $D_{SWLB}$ are not used for defect relieving.

In a later reading or writing operation, if a match between defective row address data Addfrow and row address data Addrow is judged by the comparison circuit 13, a match signal B="1" is output. The row address decoder 12 selects the spare word line SWLB(0) to SWLB(4) in the spare cell array 11B instead of the defective word line WL in the normal cell array 11N based on the match signal B="1", the row address data Addrow, and spare row address data Adds row.

Next, a defect relieving operation for defective cells detected during or after a packaging process will be explained. For example, assume a case where defective cells occur during or after a packaging process in the normal cell array 11N of a given bank BANK[j] (j=0 to n), and two word lines WL are connected to the defective cells. In this case, these two word lines WL are relieved by using two spare word lines SWLA (for example, SWLA(0) and SWLA(1)) in the spare cell array 11A.

In this case, the addresses of the two defective word lines WL are specified in a defect test performed after the packaging process, and written into the fuse circuit 23 as additional defect address data Addfad. In a later reading or writing operation, if a match between additional defect address data Addfad and address data Add1 is judged by the comparison circuit 24, a match signal A="1" is output by the comparison circuit 24. Based on the match signal A="1", the after-comparison address generating circuit 203 generates address data Add2 designating a spare word line SWLA in the spare memory cell array 11A, and redundant address data Adde. The access control circuit 204 outputs address data Add3 and redundant address data Adde' based on the address data Add2 and the redundant address data Adde. The address data Add3 and the redundant address data Adde' are sent to the address control circuit 16 through the logic interface 25 and the memory interface 18. The address control circuit 16 generates column address data Addcol, row address data Addrow, and spare row address data Addsrow="1" based on the address data Add3 and the redundant address data Adde'. The spare row address data Addsrow is data which is set to "0" when no match between additional defect address data Addfad and the address data Add1 is detected.

The row address decoder 12 selects a spare word line SWLA in the spare cell array 11A in accordance with the row address data Addrow and the spare row address data Addsrow.

[The Effect of First Embodiment]

As explained above, according to the semiconductor device of the first embodiment, the result of a defect test in a wafer process is stored in the fuse circuit 14 in the memory chip 10, and thereby a defective cell that has occurred in the wafer process is relieved. Furthermore, a defective cell that has occurred during or after a packaging process is identified in a defect test performed after the packaging process. The result of the defect test is stored in the fuse circuit 23 in the logic chip 20, and compared by the comparison circuit 24 with address data designated in a later writing or reading operation. In this way, the judgment of whether a match with the address of a defective cell identified during or after a packaging process is found or not is performed by the comparison circuit 24 in the logic chip 20 different from the comparison circuit 13 in the memory chip 10. Hence, it is possible to efficiently relieve not only a defective cell that has occurred in a wafer process but also a defective cell that has occurred during or after a packaging process. Furthermore, since the logic chip 20 can judge within one cycle of the clock CLK whether a match with additional defect address data Addfad is found, it is possible to perform the judgment of match without lowering the operation speed.

[Second Embodiment]

Figure 5:
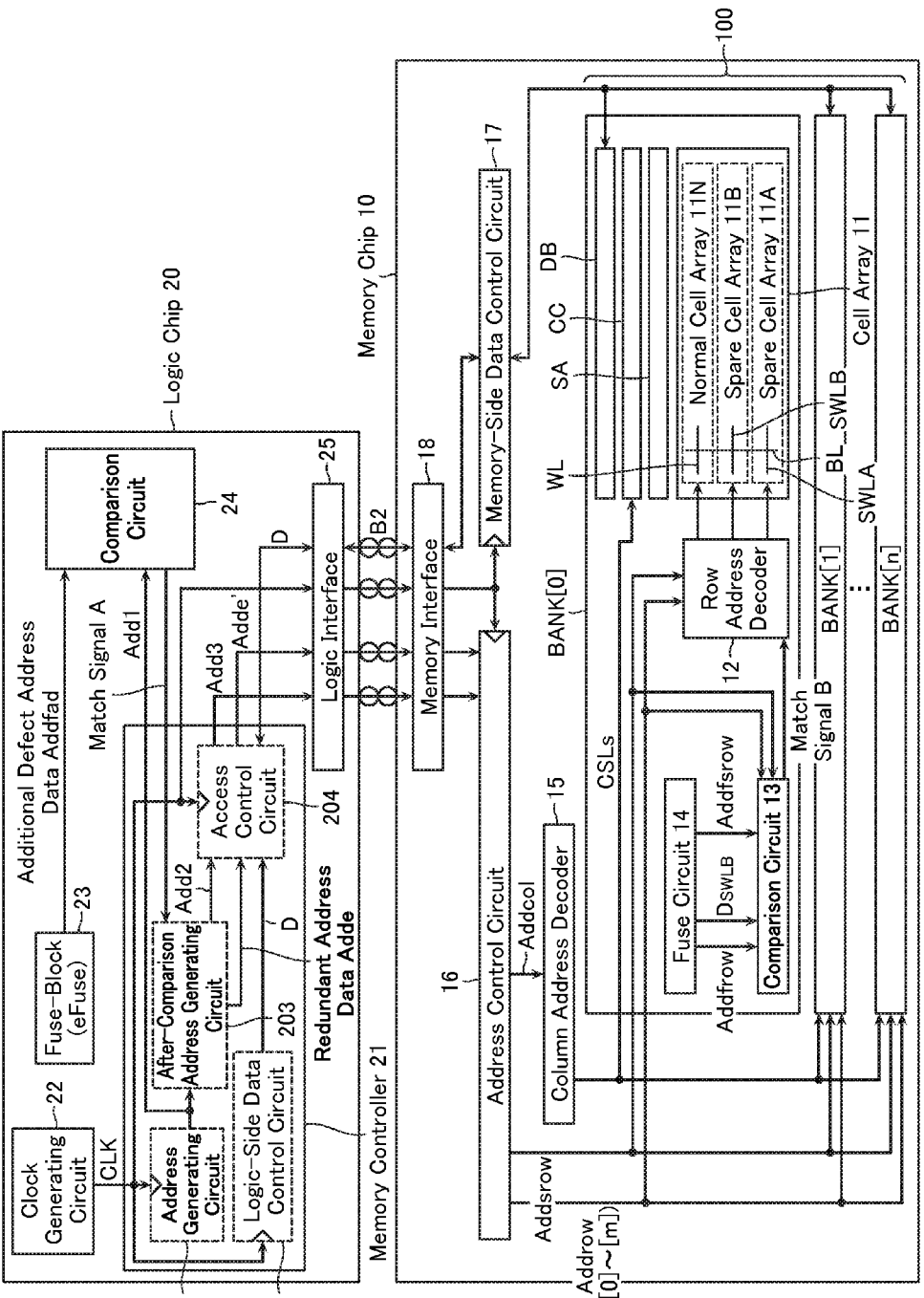
FIG. 5 is a block diagram showing an example of specific configurations of a memory chip 10 and a logic chip 20 included in a semiconductor device 1000 according to a second embodiment.
Figure 6:
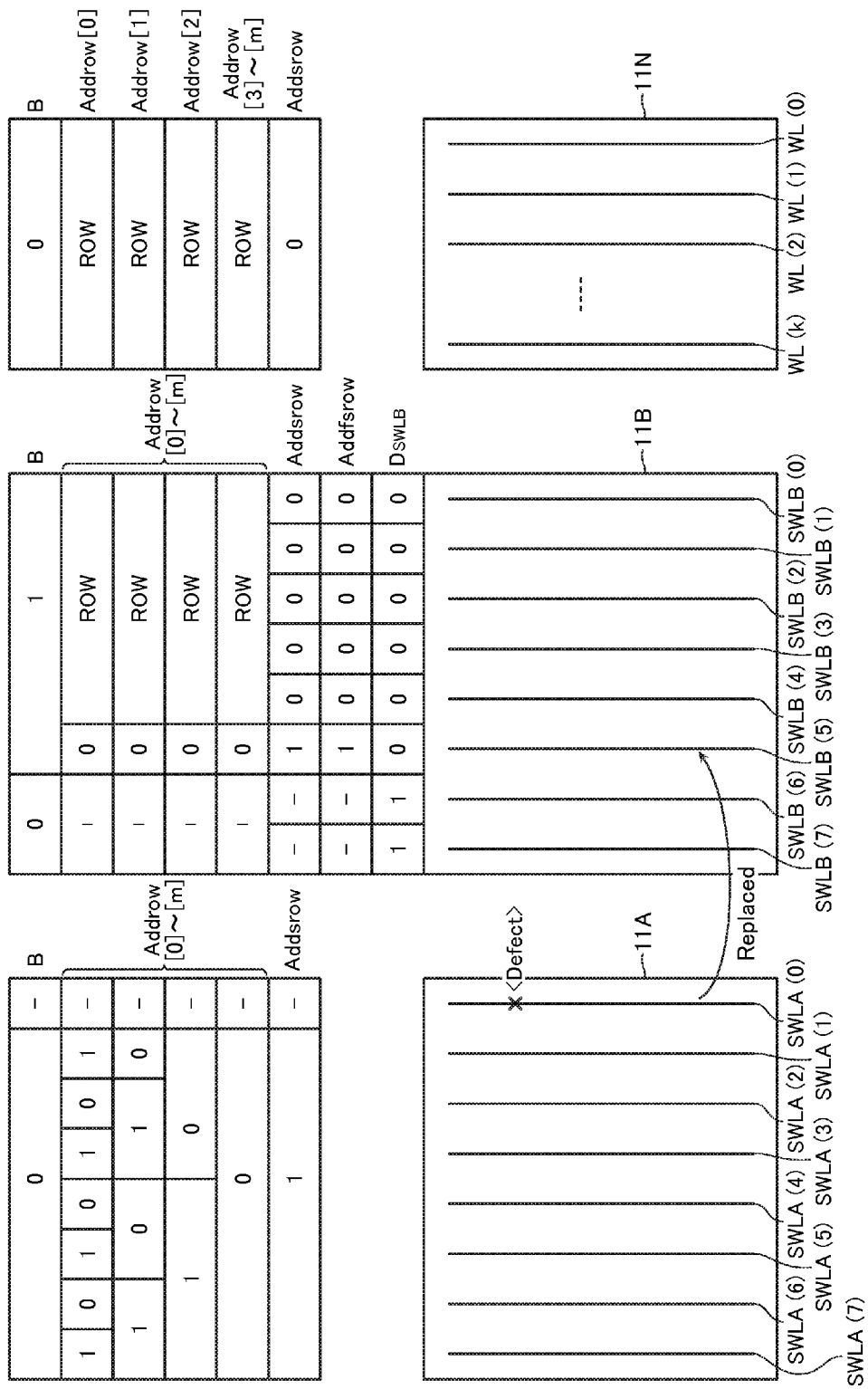
FIG. 6 shows an outline of a defect relieving procedure of a memory cell array 11 of the semiconductor device according to the second embodiment.

Next, a semiconductor device according to the second embodiment will be explained with reference to FIG. 5 and FIG. 6. The whole configuration of the present embodiment is the same as the first embodiment (FIG. 1). Furthermore, the internal configurations of the memory chip 10 and logic chip 20 are substantially the same as the first embodiment except the following point. In FIG. 5, any components that are the same as the components in FIG. 2 are denoted by the same reference numerals, and hence a detailed explanation about them will not be provided.

The second embodiment is different from the first embodiment in that when a defective spare word line WL including a defective cell occurs in the spare cell array 11A, it is relieved by another spare cell array 11B. The fuse circuit 14 stores defective spare row address data Addfsrow indicating whether a defective spare word line SWLA is present or not in the spare cell array 11A, in addition to defective row address data Addfrow and spare word line usage information $D_{SWLB}$.

Next, an outline of a defect relieving procedure according to the second embodiment will be explained with reference to FIG. 6. Here, explanation will be given by taking, for example, a case where a defect is detected in one spare word line SWLA(0) in the spare cell array 11A, and this defective spare word line SWLA (0) is replaced with a spare word line SWLB(5) in the spare cell array 11B.

The operation for accessing the normal cell array 11N and the operation for accessing the spare cell array 11B after a match with an address of a defective cell detected in a test performed in a wafer process is found are the same as in the first embodiment (FIG. 4), and hence will not be explained again.

When spare row address data Addsrow is "1", the row address decoder 12 selects the spare cell array 11A as the accessing target. However, when designated row address data Addrow indicating an address in the spare cell array 11A indicates the defective spare word line SWLA(0), the row address decoder 12 selects one of unused spare word lines SWLB in the spare cell array 11B, for example, the spare word line SWLB(5), instead of the spare word line SWLA(0). The spare word line usage information $D_{SWLB}$ of the replacing spare word line SWLB is set to "0" and not to "1".

[The Effect of Second Embodiment]

According to the present embodiment, it is possible to achieve the same effect as the first embodiment. Besides, it is also possible to replace a defective spare word line SWLA in the spare cell array 11A, which further improves the redundancy rate and the yield.

[Third Embodiment]

Figure 7:
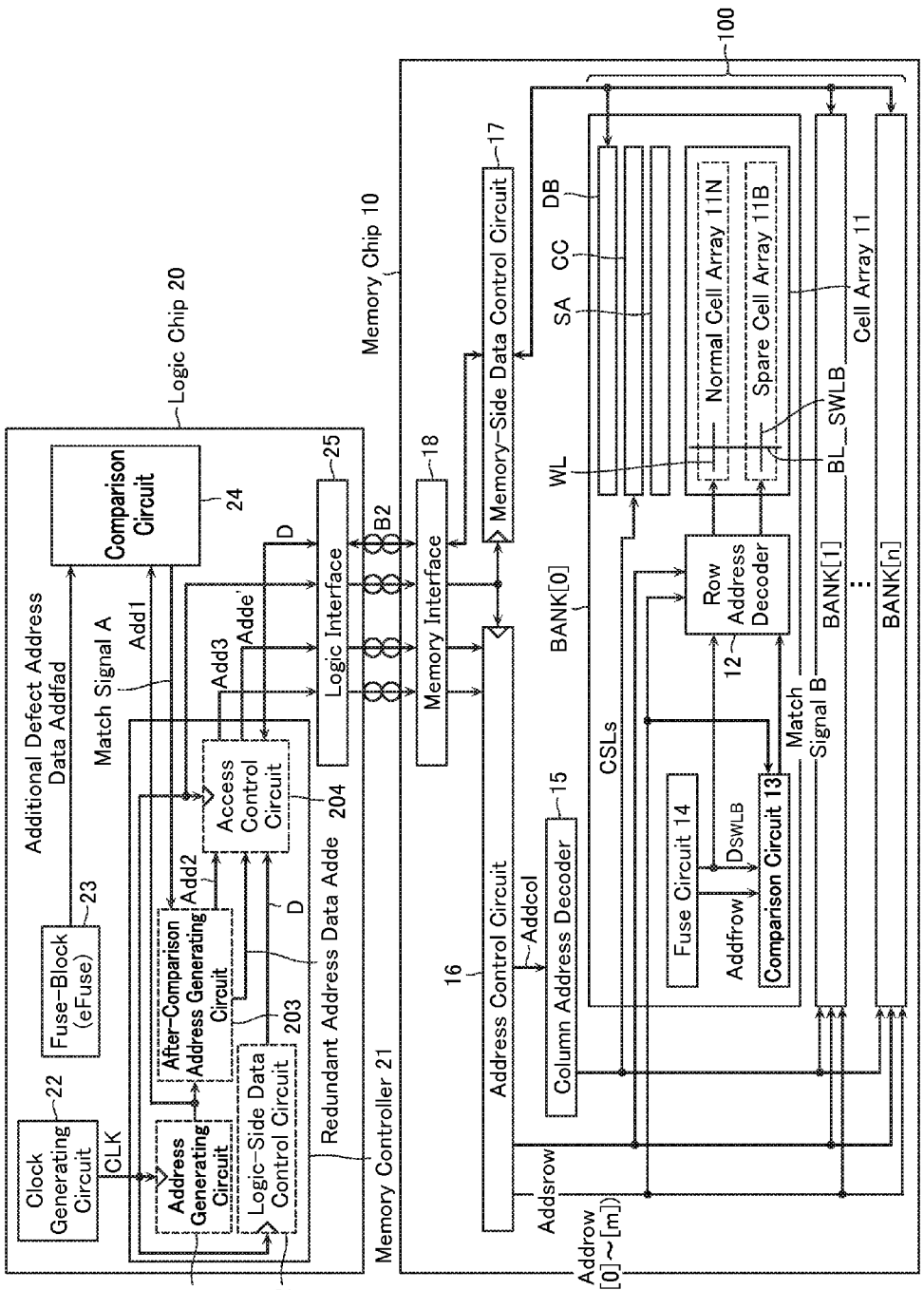
FIG. 7 is a block diagram showing an example of specific configurations of a memory chip 10 and a logic chip 20 included in a semiconductor device 1000 according to a third embodiment.

Next, a semiconductor device according to the third embodiment will be explained with reference to FIG. 7 and FIG. 8. The whole configuration of the present embodiment is the same as the first embodiment (FIG. 1). Furthermore, the internal configurations of the memory chip 10 and logic chip 20 are substantially the same as the first embodiment except the following point. In FIG. 7, any components that are the same as the components in FIG. 2 are denoted by the same reference numerals, and hence a detailed explanation about them will not be provided.

The third embodiment is different from the first embodiment in that the memory cell array 11 is constituted by a normal cell array 11N and one spare cell array 11B. A defective cell that occurs in the normal cell array 11N during a wafer process and a defective cell that occurs in the normal cell array 11N during or after a packaging process are both relieved by one spare cell array 11B.

Figure 8:
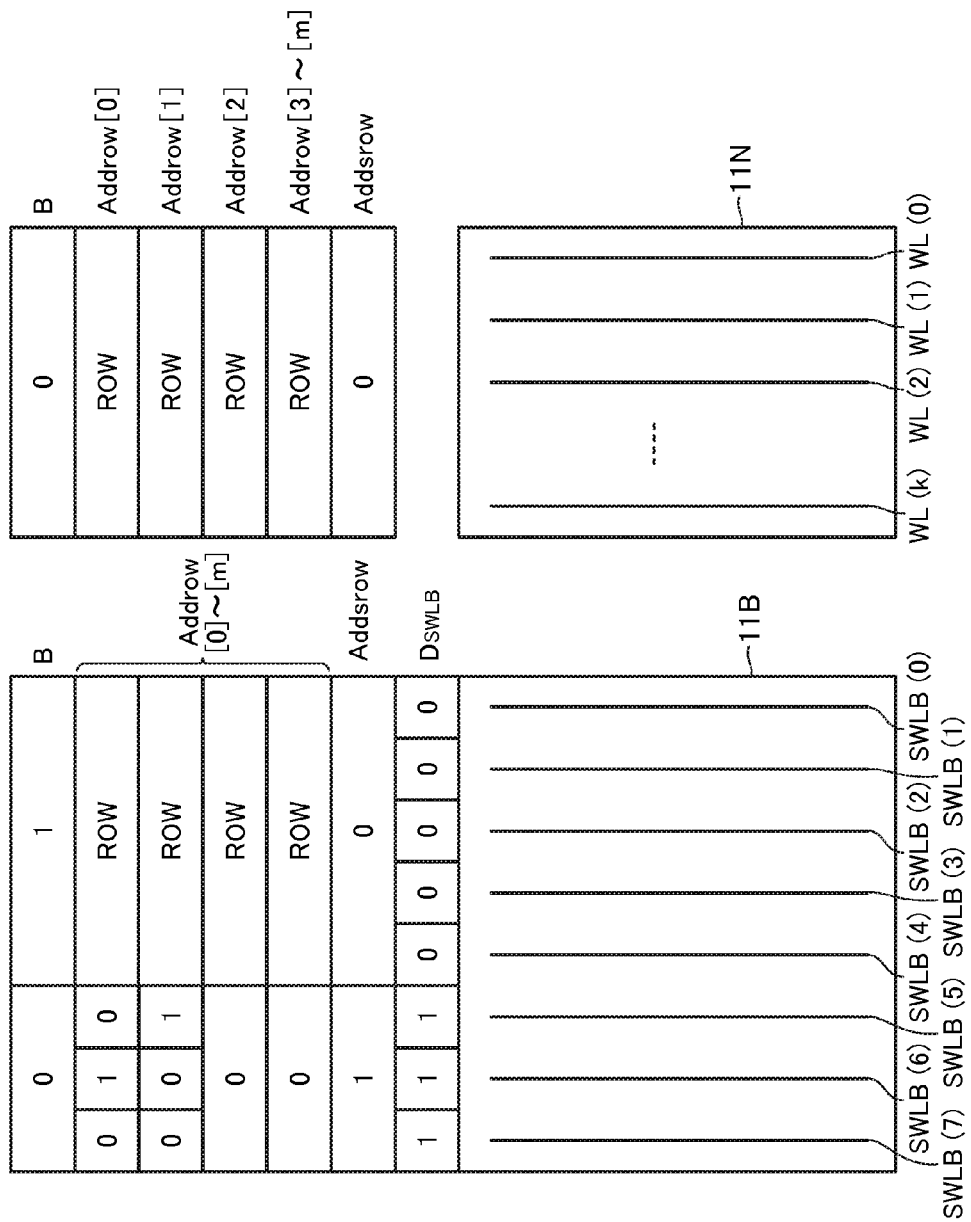
FIG. 8 shows an outline of a defect relieving procedure of a memory cell array 11 of the semiconductor device according to the third embodiment.

FIG. 8 shows an outline of a defective cell relieving procedure of a semiconductor device according to the third embodiment. Here, explanation will be given by taking, for example, a case where the normal cell array 11N includes k number of word lines WL, and the spare cell array 11B includes eight spare word lines SWLB. It should be noted that, in a defect relieving operation performed during a wafer process, the spare word line SWL[0] is used first, and other spare word lines are used in an ascending order, in order to improve the relief efficiency. In a defect relieving operation performed during a packaging process or thereafter, the spare word line SWL[7] is used first, and other spare word lines are used in an descending order, in order to improve the relief efficiency.

First, a defect relieving operation for defective cells detected in the normal cell array 11N during a wafer process will be explained. For example, assume a case where five defective word lines WL occur in the normal cell array 11N, like in the first embodiment. In this case, the addresses of these five defective word lines WL are specified in a defect test performed in the wafer process, and written in the fuse circuit 14 as defective row address data Addfrow. These five word lines WL are relieved by using, for example, five spare word lines SWLB(0) to SWLB(4) in the spare cell array 11B. The spare word lines SWLB(0) to SWLB(4) used for relieving the five defective word lines WL are assigned "0" as the spare word line usage information $D_{SWLB}$.

In a later reading or writing operation, if a match between defective row address data Addfrow and row address data Addrow is judged by the comparison circuit 13, a match signal B="1" is output. The row address decoder 12 selects a spare word line SWLB (0) to SWLB (4) in the spare cell array 11B instead of the defective word line WL based on the match signal B="1", the row address data Addrow, and spare row address data Addsrow.

Next, a defect relieving operation for defective cells detected during or after a packaging process will be explained. For example, assume a case where defective cells occur in the normal cell array 11N during or after a packaging process, and three word lines WL are connected to these defective cells. In this case, these three word lines WL are relieved by using three spare word lines SWLB (for example, SWLB(5) to SWLB(7)) in the spare cell array 11B.

In this case, the addresses of the three defective word lines WL are specified in a defect test performed after the packaging process, and written in the fuse circuit 23 as additional defect address data Addfad. In a later reading or writing operation, if a match between additional defect address data Addfad and address data Add1 is judged by the comparison circuit 24, a match signal A="1" is output by the comparison circuit 24. Based on the match signal A="1", the after-comparison address generating circuit 203 generates address data Add2 designating a word line SWLB(5) to SWLB(7) in the spare memory cell array 11B, and redundant address data Adde. The access control circuit 204 outputs address data Add3 and redundant address data Adde' based on the address data Add2 and the redundant address data Adde. The address data Add3 and the redundant address data Adde' are sent to the address control circuit 16 through the logic interface 25 and the memory interface 18.

The address control circuit 16 generates column address data Addcol and row address data Addrow based on the address data Add3 and the redundant address data Adde', and also generates spare row address data Addsrow="1". The row address decoder 12 selects any one of the three spare word lines SWLB(5) to SWLB(7) based on the spare row address data Addsrow="1" and row address data Addrow[0] to [1]. Row address data Addrow[2] to [m] are set to "0".

Figure 9:
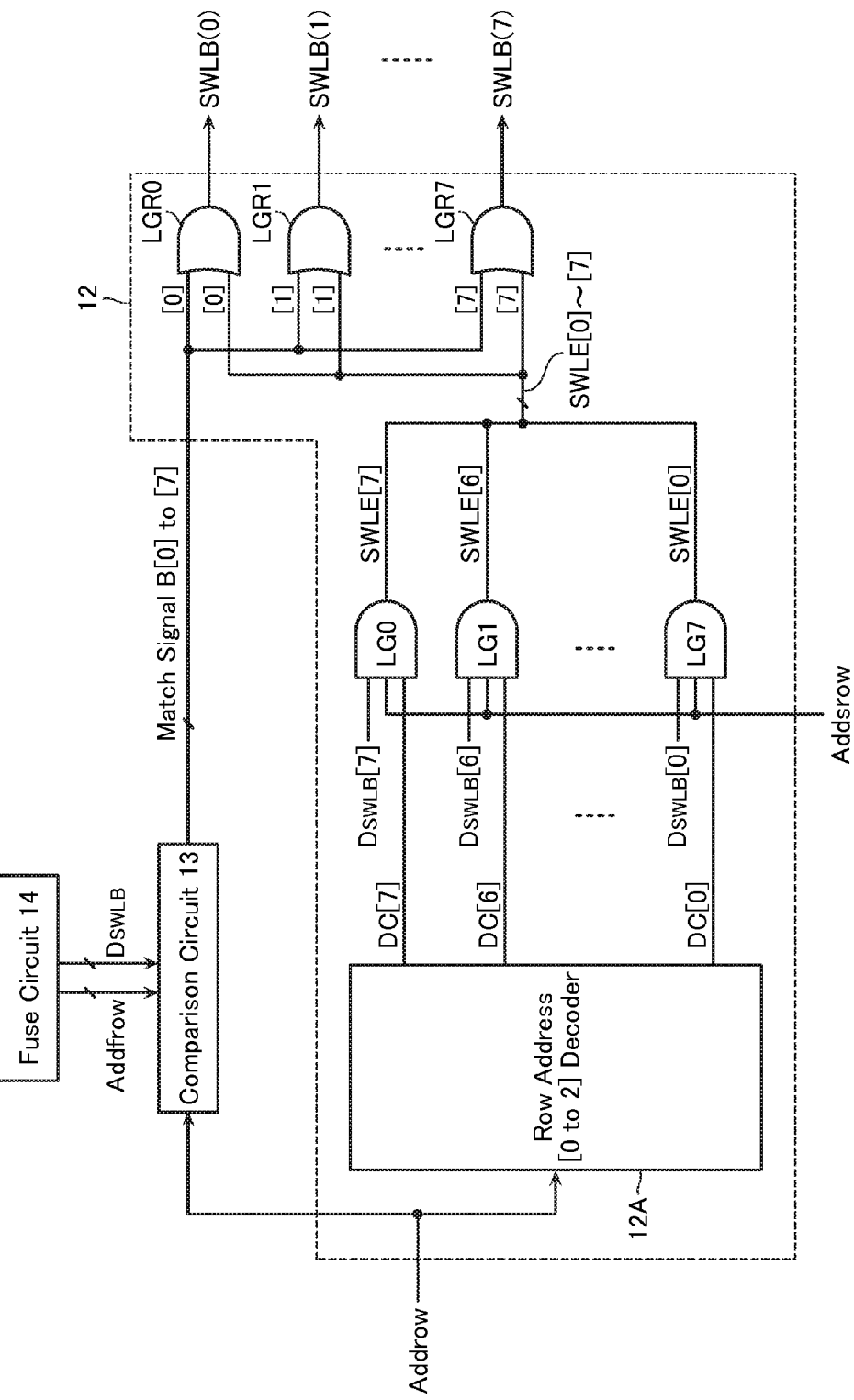
FIG. 9 shows a specific example of the configuration of a row address decoder 12 of the semiconductor device 1000 according to the third embodiment.

FIG. 9 shows an example of a specific configuration of the row address decoder 12 for realizing the defect relieving operation according to the third embodiment.

Row address data Addrow is decoded by a row address [0 to 2] decoder 12A in the row address decoder 12 and is output as a decode signal DC[0] to DC[7]. The row address [0 to 2] decoder 12A has a function of decoding three-bit row address data Addrow[0] to [2] among (m+1)-bit row address data Addrow[0] to [m] in order to select the eight spare word lines SWLB(0) to SWLB(7) in the spare cell array 11B.

The row address data Addrow is also sent to the comparison circuit 13 and compared with defective row address data Addfrow. If the row address data Addrow matches with defective row address data Addfrow, any one of match signals B[0] to B[7] that corresponds to any of the spare word lines SWLB[0] to SWLB[7] that is previously determined to be the replacer is activated.

The spare row address data Addsrow is sent to logical gates LG0 to LG7 in the row address decoder 12. The logical gates LG0 to LG7 output enable signals SWLE[0] to SWLE[7] which are the logical ANDs of the spare row address data Addsrow, the spare word line usage information $D_{SWLB[0]}$ to $D_{SWLB}[7]$ and the decode signals DC[0] to DC[7] respectively. The enable signals SWLE[0] to SWLE[7] are sent to logical gates LGR[0] to LGR[7]. The logical gates LGR[0] to LGR[7] activate or deactivate the spare word lines SWLB which are logical ORs of the match signals B[0] to B[7] and the enable signals SWLE[0] to SWLE[7] respectively.

When the spare row address data Addsrow is "1", i.e., when the address (additional defect address data Addfad) of a defective cell detected during or after a packaging process and designated address data match, all of the match signals B[0] to B [7] become "0". Hence, the enable signals SWLE[0] to SWLE[7] are output as they are from the logical gates LGR0 to LGR7 to the spare word lines SWLB(0) to SWLB (7).

On the other hand, when the spare row address data Addsrow is "0", the enable signals SWLE[0] to SWLE[7] change in accordance with the match signals B.

[Fourth Embodiment]

Figure 10:
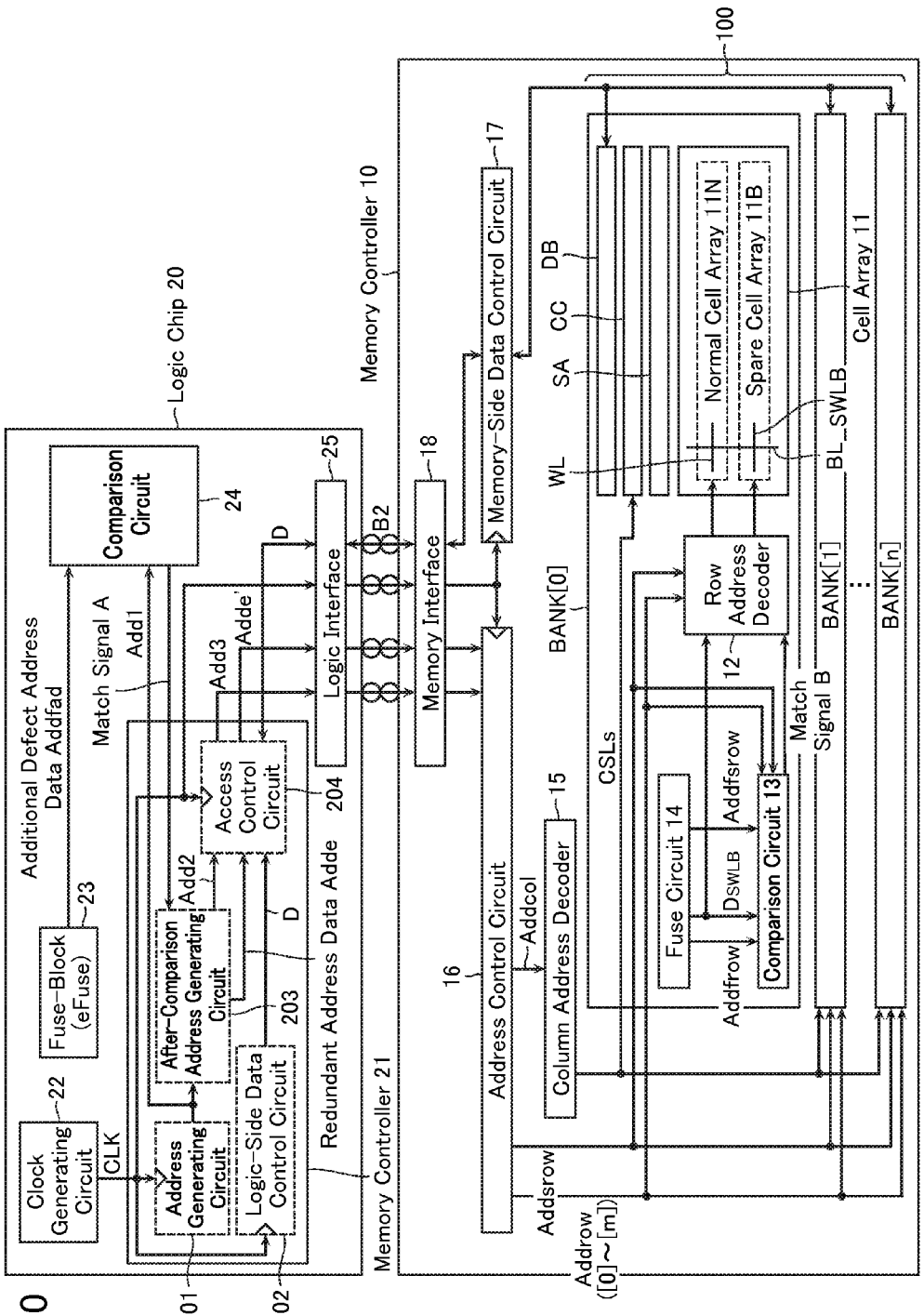
FIG. 10 is a block diagram showing an example of specific configurations of a memory chip 10 and a logic chip 20 included in a semiconductor device 1000 according to a fourth embodiment.

Next, a semiconductor device according to the fourth embodiment will be explained with reference to FIG. 10 to FIG. 12. The whole configuration of the present embodiment is the same as the first embodiment (FIG. 1). The internal configurations of the memory chip 10 and logic chip 20 are substantially the same as the configurations (FIG. 2) of the first embodiment except the flowing point. In FIG. 10, any components that are the same as the components in FIG. 2 are denoted by the same reference numerals, and hence a detailed explanation about them will not be provided below.

The fourth embodiment is the combination of the second embodiment and the third embodiment. That is, the present embodiment is the same as the second embodiment in that the fuse circuit 14 stores defective spare row address data Addfsrow, and the same as the third embodiment in that the memory cell array 11 is constituted by a normal cell array 11N and one spare cell array 11B. A defective cell that occurs in the normal cell array 11N during a wafer process and a defective cell that occurs in the normal cell array 11N during or after a packaging process are both relieved by the one spare cell array 11B. Furthermore, when a defective spare word line SWLB is detected in the spare cell array 11B, it is relieved by an unused spare word line SWLB in the same spare cell array 11B.

Figure 11:
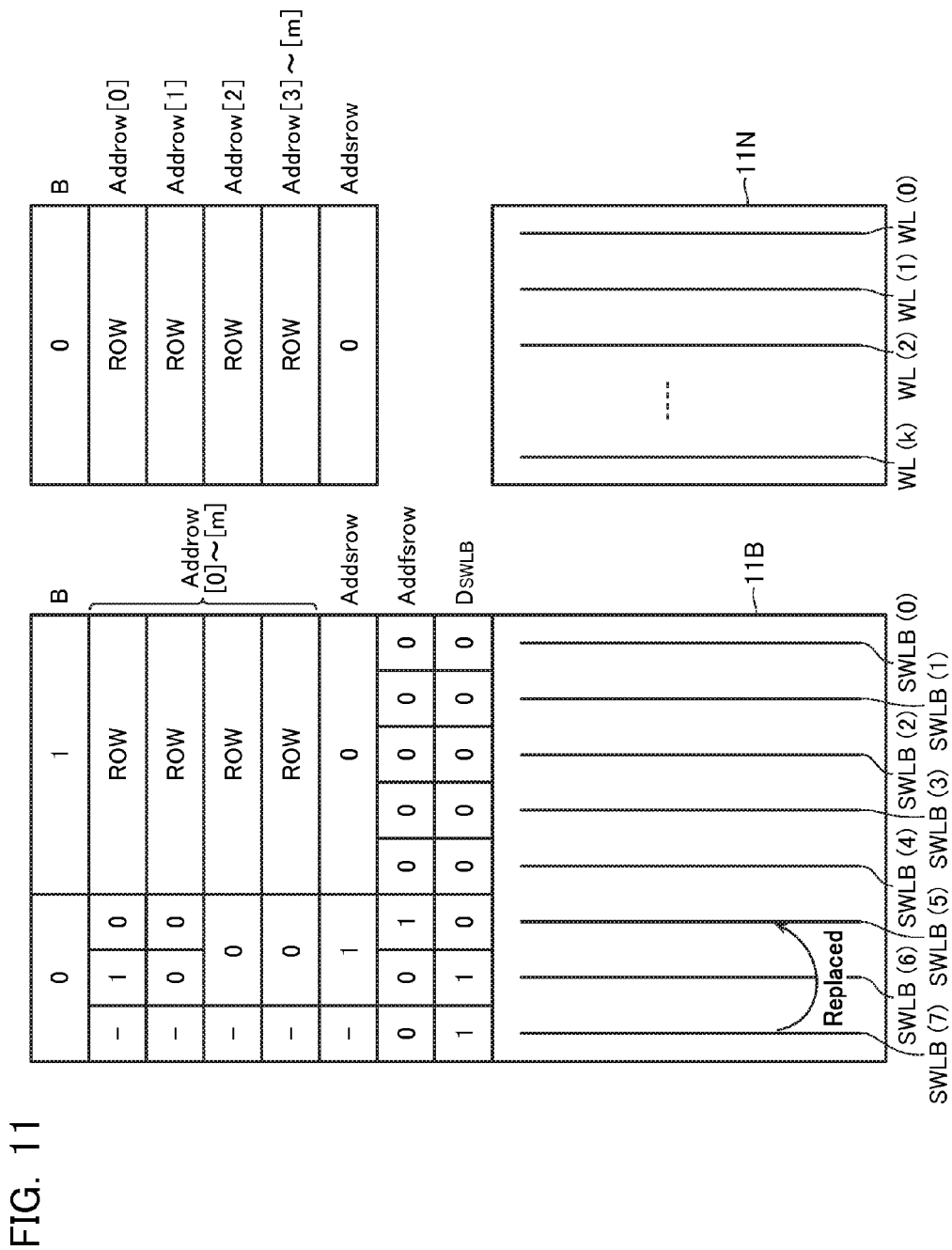
FIG. 11 shows an outline of a defect relieving procedure of a memory cell array 11 of the semiconductor device according to the fourth embodiment.

FIG. 11 shows a defect relieving method according to the fourth embodiment. Here, for example, a case where a spare word line SWLB(7) is a defective spare word line that occurs during a wafer process and is to be replaced by a spare word line SWLB(5) is shown.

A defective word line WL that occurs in the normal cell array 11N during a wafer process is relieved by a spare word line SWLB(0) to SWLB(4) in the same way as in the first to third embodiments.

On the other hand, a defective word line WL that occurs in the normal cell array 11N during or after a packaging process is replaced by a spare word line SWLB(6) to SWLB(7). However, if the spare word line SWLB(7) is defective, the row address decoder 12 selects the spare word line SWLB(5) instead of the spare word line SWLB(7) based on defective spare row address data Addfsrow. As shown in FIG. 11, the spare word line SWLB(5) is assigned "1" as defective spare row address data Addfsrow to indicate that the spare word line SWLB(5) has relieved the spare word line SWLB(7), and also assigned "0" as spare word line usage information $D_{SWLB}$.

Figure 12:
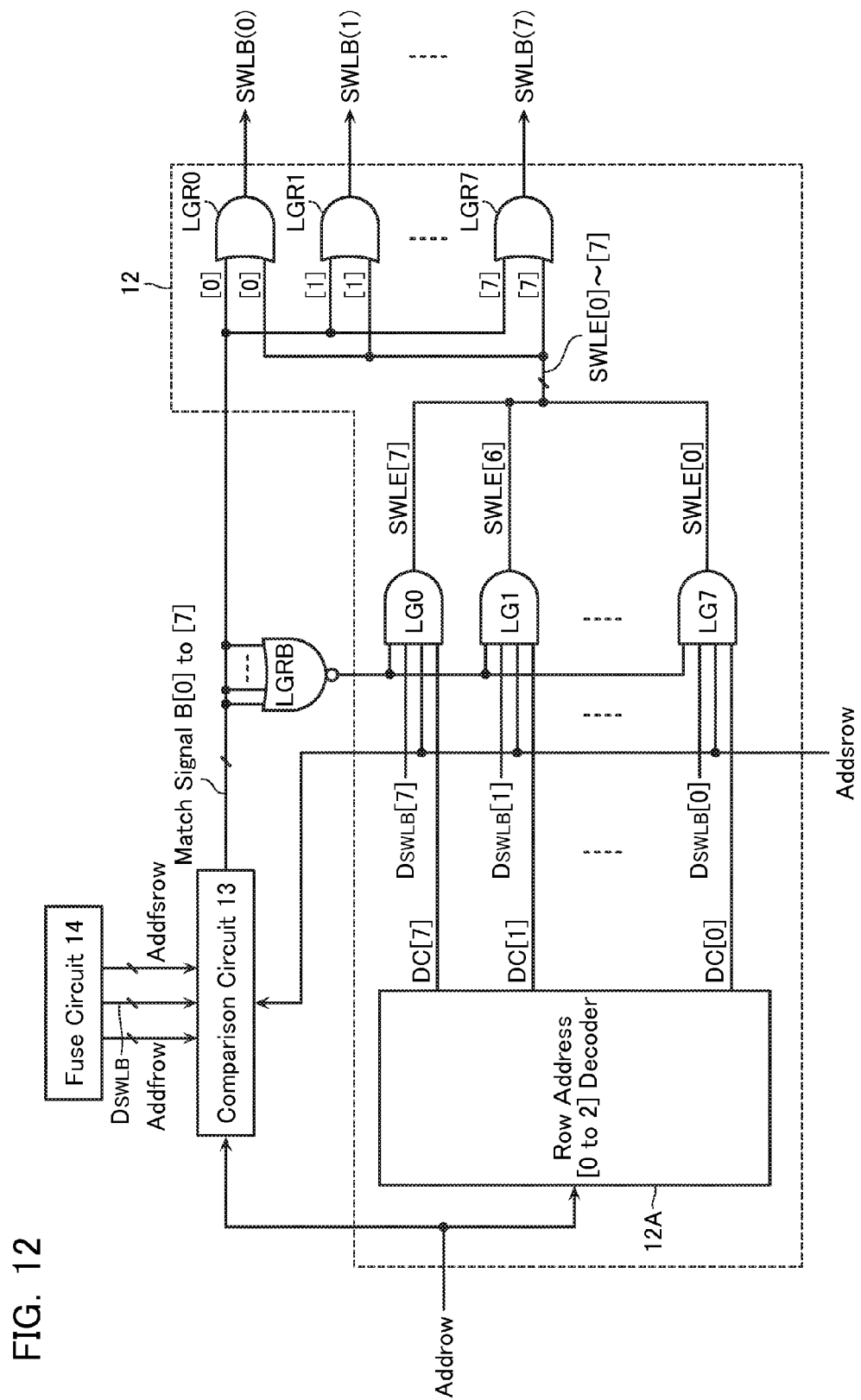
FIG. 12 shows a specific example of the configuration of a row address decoder 12 of the semiconductor device 1000 according to the fourth embodiment.

FIG. 12 shows an example of a specific configuration of the row address decoder 12 for realizing the defect relieving operation according to the fourth embodiment. This row address decoder 12 is different from the circuit of FIG. 9 in that the match signals B[0] to B[7] are input into a NOR gate LGRB, and an output signal from the NOR gate LGRB is supplied as an input signal into logical gates LG0 to LG7. That is, when any of the match signals B[0] to B[7] is "1", an output signal from the NOR gate LGRB becomes "0" to make all the enable signals SWLE[0] to SWLE[7] "0" (=disable signals). Hence, the spare word lines SWLB(0) to SWLB(7) are controlled in accordance with the match signals B[0] to B[7].

When row address data Addrow designating the spare word line SWLB(7) and spare row address data Addsrow="1" are input into the comparison circuit 13, the comparison circuit 13 judges whether or not defective row address data Addfrow and the row address data Addrow match, and after this, sets the match signal B[5] to "H" in order to designate the spare word line SWLB(5) instead of the spare word line SWLB(7) based on the defective spare row address data Addfsrow and the spare word line usage information $D_{SWLB}$. At this time, all of the enable signals SWLE[0] to SWLE [7] become "0" (=disable signals) due to the operation of the NOR gate LGRB, and hence the spare word line SWLB(5) is selected based on the match signal B[5].

[Fifth Embodiment]

Figure 13:
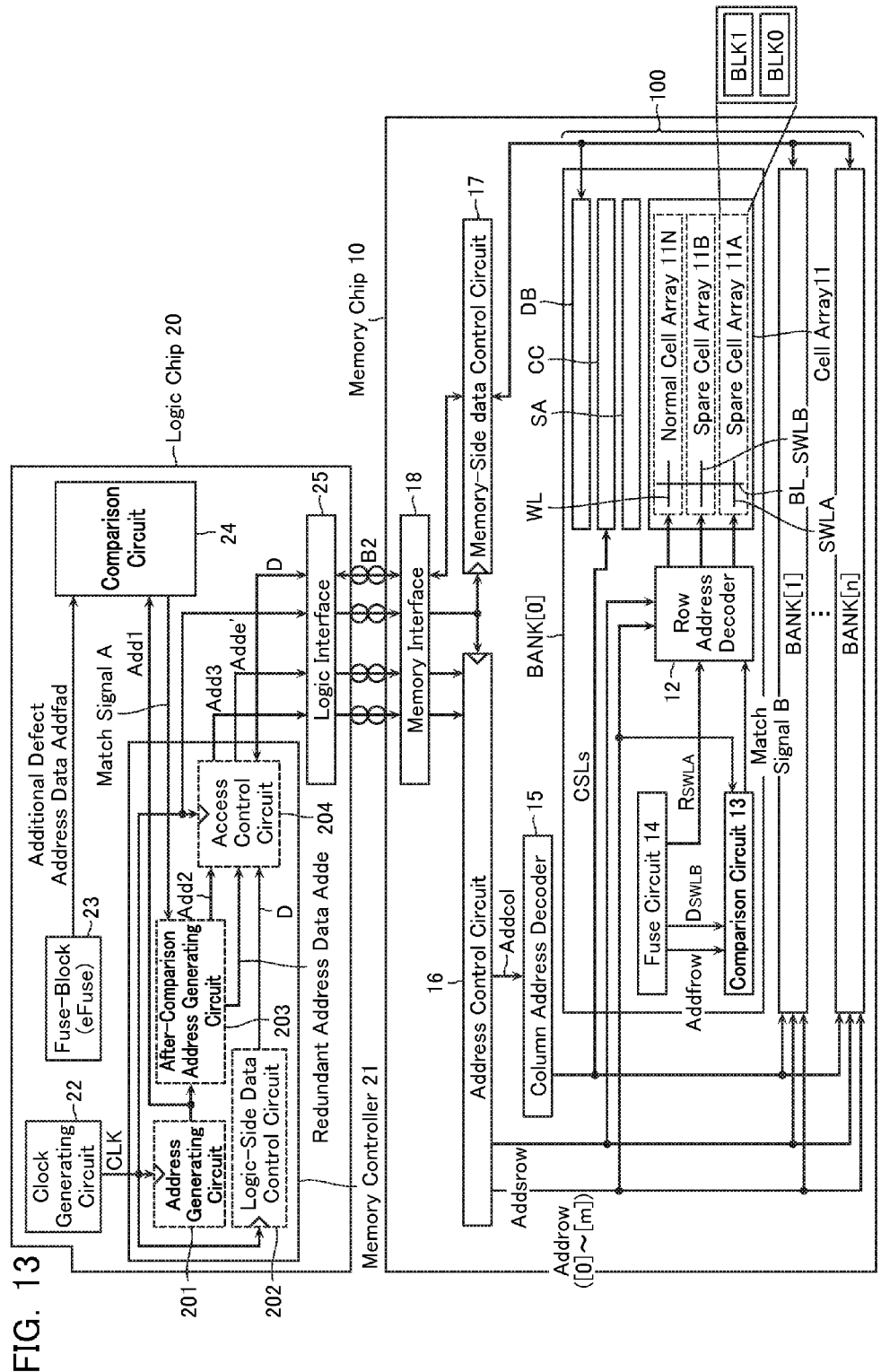
FIG. 13 is a block diagram showing an example of specific configurations of a memory chip 10 and a logic chip 20 included in a semiconductor device 1000 according to a fifth embodiment.
Figure 14:
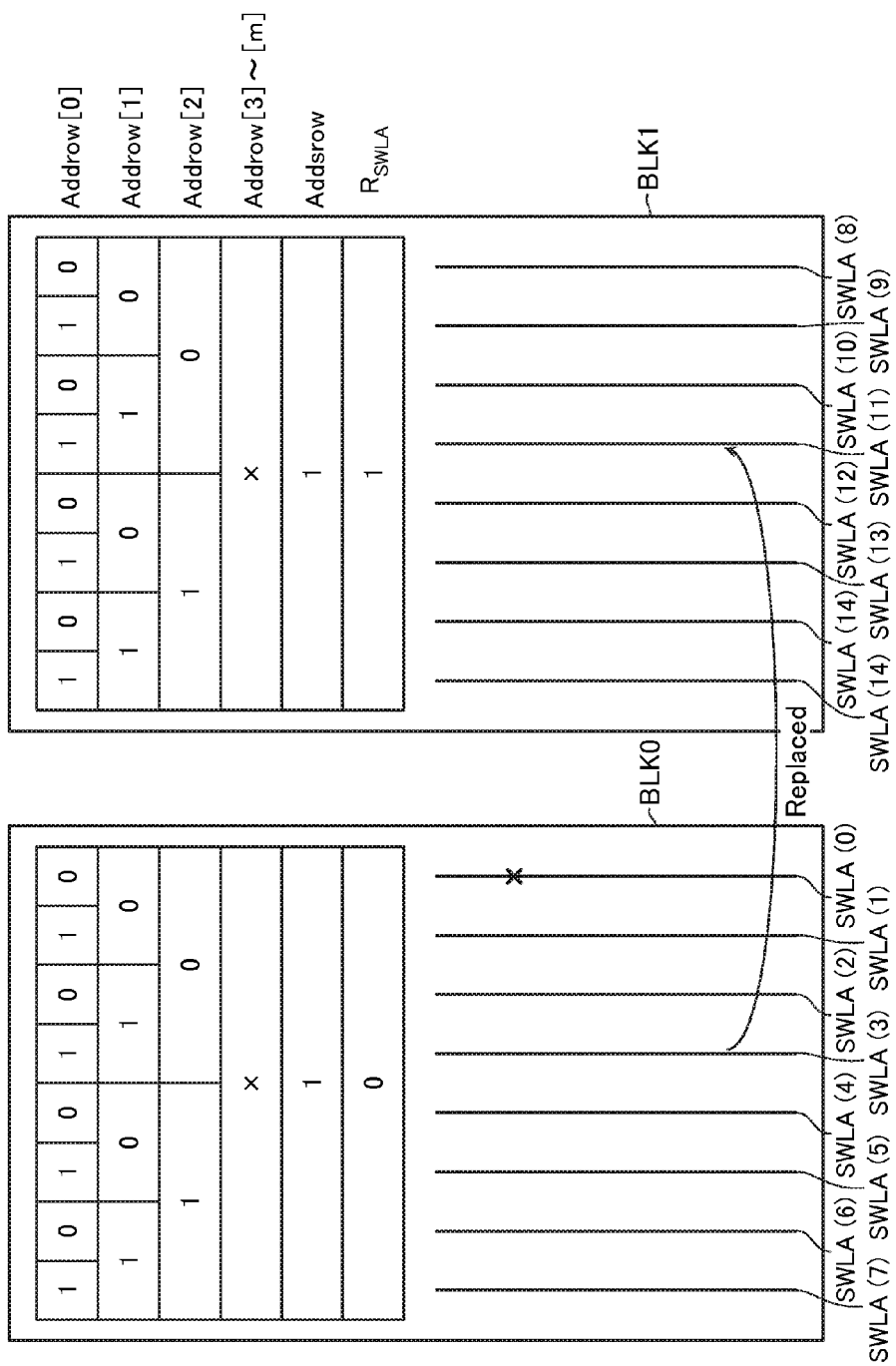
FIG. 14 shows an outline of a defect relieving procedure of a memory cell array 11 of the semiconductor device according to the fifth embodiment.

Next, a semiconductor device according to the fifth embodiment will be explained with reference to FIG. 13 and FIG. 14. The whole configuration of the present embodiment is the same as the first embodiment (FIG. 1). Furthermore, the internal configurations of the memory chip 10 and logic chip 20 are substantially the same as the first embodiment except the following point. In FIG. 13, any components that are the same as the components in FIG. 2 are denoted by the same reference numerals, and hence a detailed explanation about them will not be provided below.

In the semiconductor device according to the fifth embodiment, the spare cell array 11A is divided into a plurality of blocks BLK (for example, two blocks BLK0 and BLK1). If a defective spare word line SWLA is included in one block BLK0 of the spare cell array 11A, the block BLK0 is disposed of as a defective block, and the block BLK1 is used instead of the block BLK0 for relieving a word line WL (see FIG. 14). The fuse circuit 14 stores block replacement information $R_{SWLA}$ as information for replacing a defective block BLK0 with a non-defective block BLK1.

[Sixth Embodiment]

Figure 15:
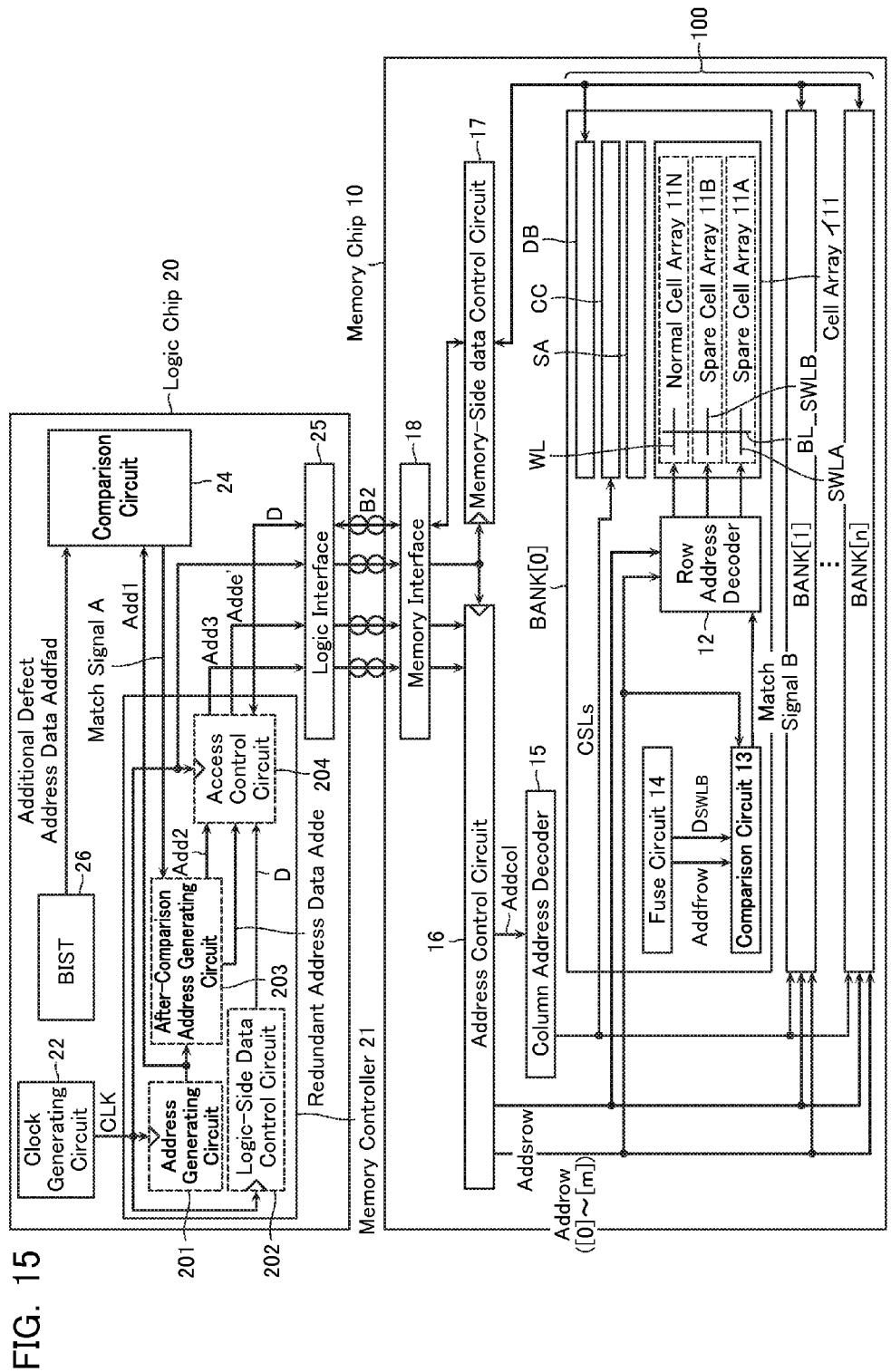
FIG. 15 is a block diagram showing an example of specific configurations of a memory chip 10 and a logic chip 20 included in a semiconductor device 1000 according to a sixth embodiment.
Figure 16:
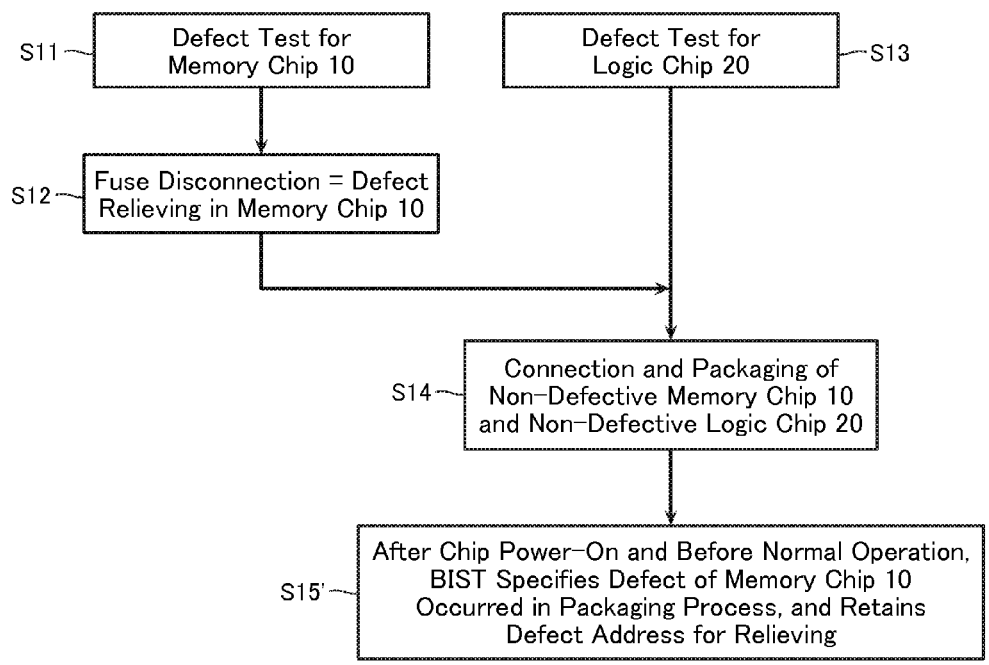
FIG. 16 explains a defective cell relieving procedure of the semiconductor device 1000 according to the sixth embodiment.

Next, a semiconductor device according to the sixth embodiment will be explained with reference to FIG. 15 and FIG. 16. The whole configuration of the present embodiment is the same as the first embodiment (FIG. 1). Furthermore, the configurations of the memory chip 10 and logic chip 20 are substantially the same as the configurations of the first embodiment (FIG. 2) except the following point. In FIG. 15, any components that are the same as the components in FIG.

2 are denoted by the same reference numerals, and hence a detailed explanation about them will not be provided below.

The sixth embodiment is characterized in that the logic chip 20 includes a so-called BIST circuit (Built-in Self Testing circuit) 26 instead of the fuse circuit 23. A BIST circuit is a circuit having a function of testing a memory such as DRAM. According to the semiconductor device of the sixth embodiment, after turned on, the semiconductor device 1000 activates the BIST circuit 26 before entering a normal operation, in order to let the BIST circuit 26 specify a defective cell that has occurred in the memory cell array 11 during or after a packaging process and store the address of the defective cell as additional defect address data Addfad. Hence, it is possible to achieve the same effect as that achieved by the embodiments described above. In the present embodiment, the use of the BIST circuit 26, which has been used in the conventional tests for memory chips, eliminates the need for newly adding a fuse circuit 23, which makes it possible to reduce the circuit area. Furthermore, the operation of writing into the fuse circuit 23 becomes unnecessary, which contributes to reducing the test time before shipment.

Next, a defective cell relieving procedure of the semiconductor device 1000 according to the present embodiment will be explained with reference to FIG. 16. Steps S11 to S14 are the same as in the first embodiment. In the present embodiment, at step S15' after step S14, after the semiconductor device is turned on (power on), before a normal operation is entered, the BIST circuit 26 specifies a defective cell that has occurred during or after a packaging process, and retains the address of the defective cell as additional defect address data Addfad. The additional defect address data Addfad is supplied to the comparison circuit 24 as in the embodiments described above.

[Seventh Embodiment]

Figure 17:
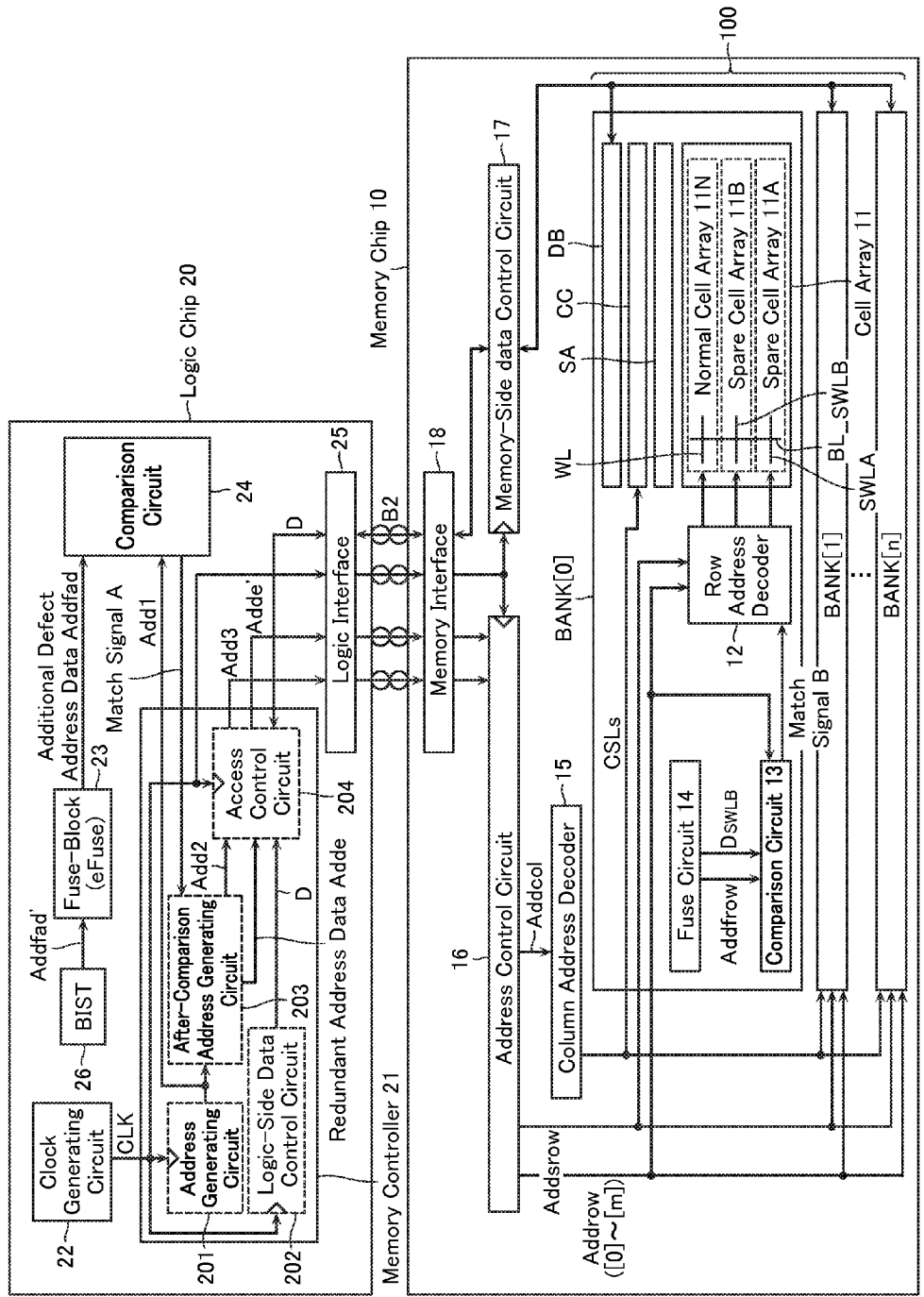
FIG. 17 is a block diagram showing an example of specific configurations of a memory chip 10 and a logic chip 20 included in a semiconductor device 1000 according to a seventh embodiment.

Next, a semiconductor device according to the seventh embodiment will be explained with reference to FIG. 17. The present embodiment is the same as the sixth embodiment except the following point. In the configuration of the seventh embodiment, additional defect address data Addfad' specified by the BIST circuit 26 can be written into the fuse circuit 23 automatically. The present embodiment is the same as the sixth embodiment in the other points. According to this configuration, it is unnecessary to activate the BIST circuit 26 every time the power is turned on, which makes it possible to reduce the time taken for moving from the power-on of the semiconductor device 1000 to a normal operation.

[Eighth Embodiment]

Figure 18:
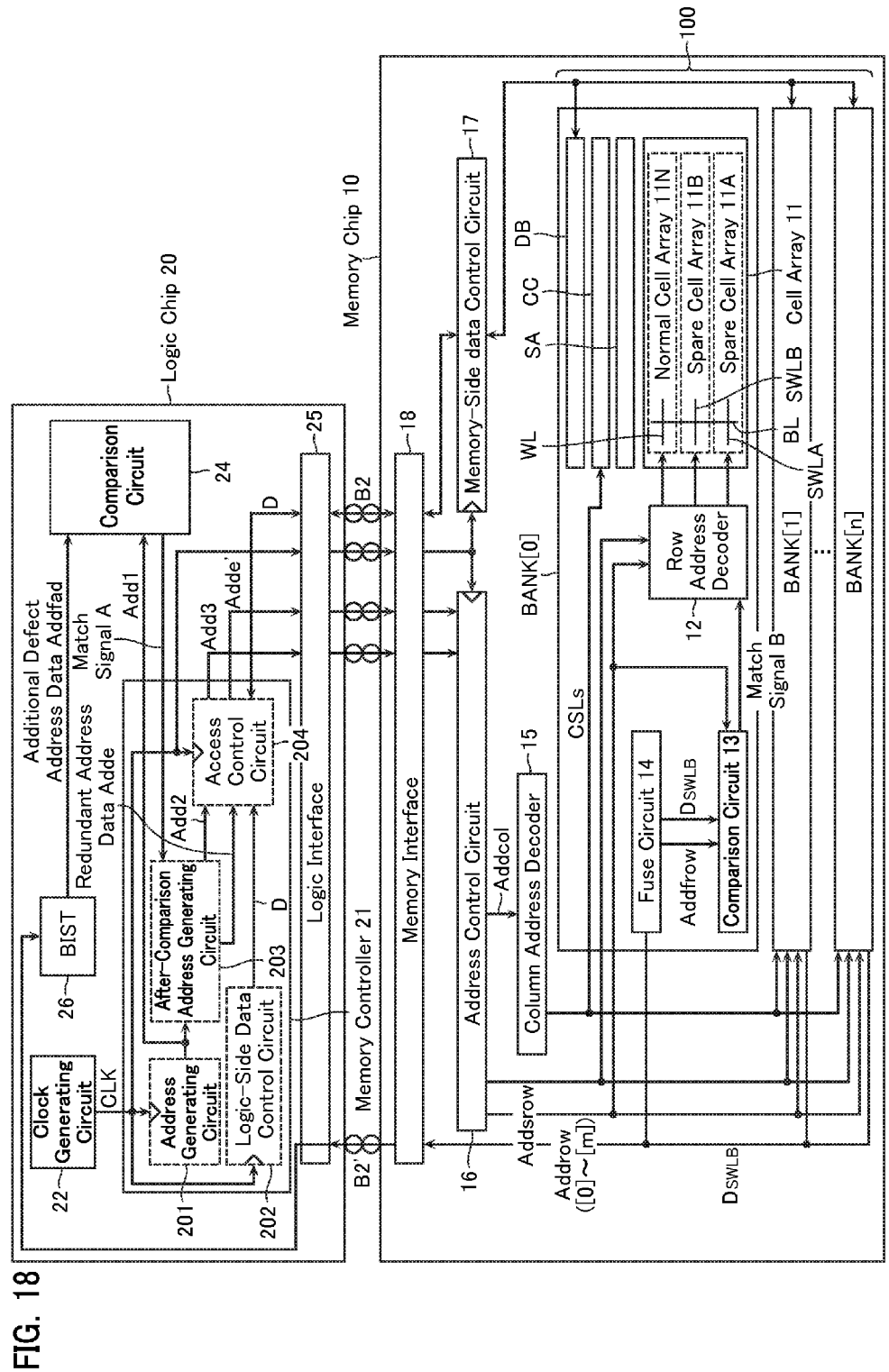
FIG. 18 is a block diagram showing an example of specific configurations of a memory chip 10 and a logic chip 20 included in a semiconductor device 1000 according to an eighth embodiment.

Next, a semiconductor device according to the eighth embodiment will be explained with reference to FIG. 18. The present embodiment is the same as the sixth embodiment except the following point. In the eighth embodiment, the spare word line usage information $D_{SWLB}$ is sent from the fuse circuit 14 of the memory chip 10 to the BIST circuit 26 of the logic chip 20 to be used for testing the memory chip 10 and generating additional defect address data Addfad.

Once the spare word line usage information $D_{SWLB}$ is sent to the BIST circuit 26, the same operation as in the fourth embodiment becomes available. That is, when the spare word line SWLB(6) or SWLB(7) allocated for replacing a defective word line WL that occurs in the normal cell array 11N during or after a packaging process becomes defective, the memory controller 21 can select any other spare word line SWLB than the defective spare word line SWLB based on the received spare word line usage information $D_{SWLB}$.

[Ninth Embodiment]

Figure 19:
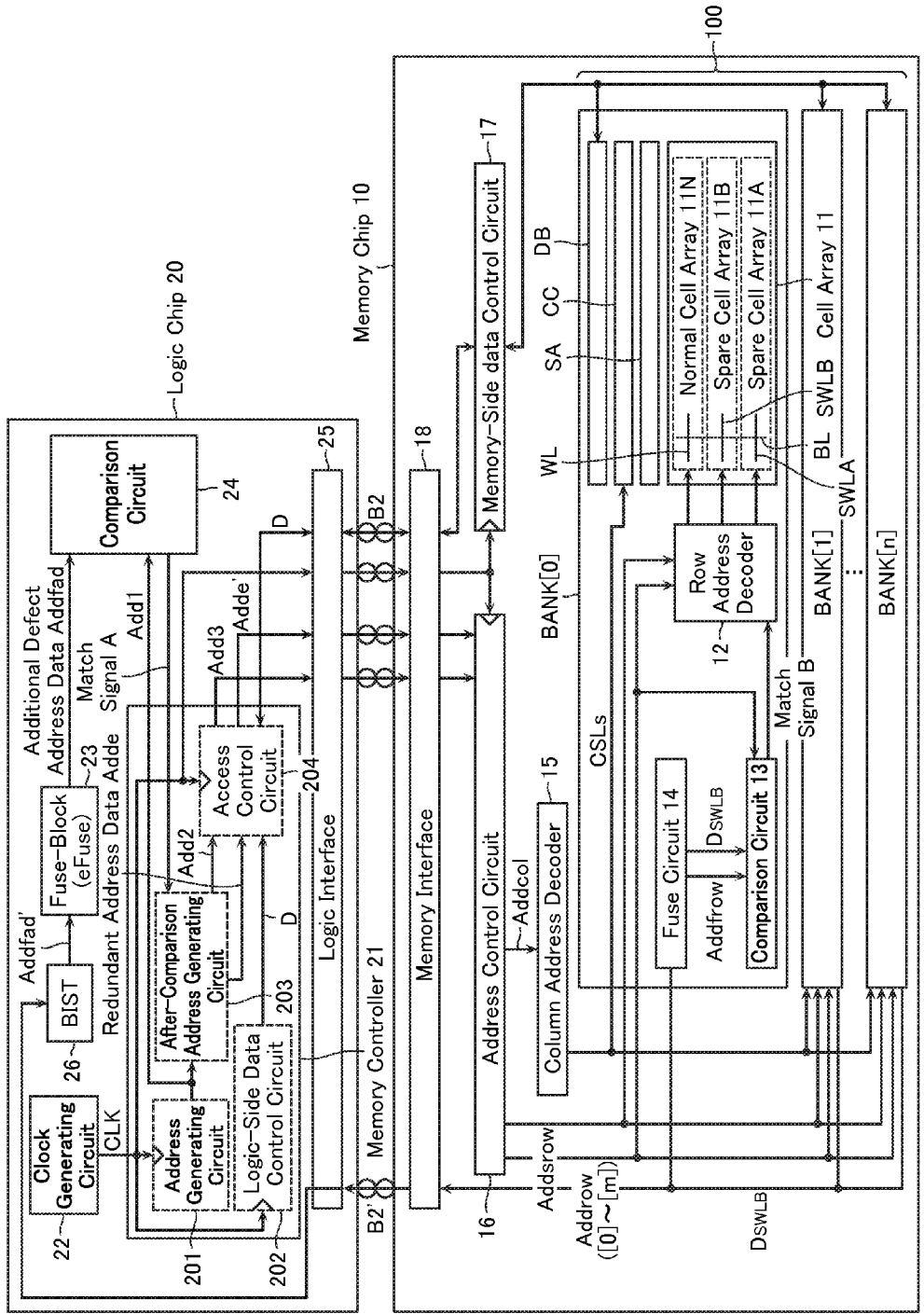
FIG. 19 is a block diagram showing an example of specific configurations of a memory chip 10 and a logic chip 20 included in a semiconductor device 1000 according to a ninth embodiment.

Next, a semiconductor device according to the ninth embodiment will be explained with reference to FIG. 19. In the present embodiment, the spare word line usage information $D_{SWLB}$ is sent from the fuse circuit 14 of the memory chip 10 to the BIST circuit 26 of the logic chip 20 to be used for testing the memory chip 10 and generating additional defect address data Addfad. However, in the present embodiment, both the BIST circuit 26 and the fuse circuit 23 are provided.

[Tenth Embodiment]

Figure 20:
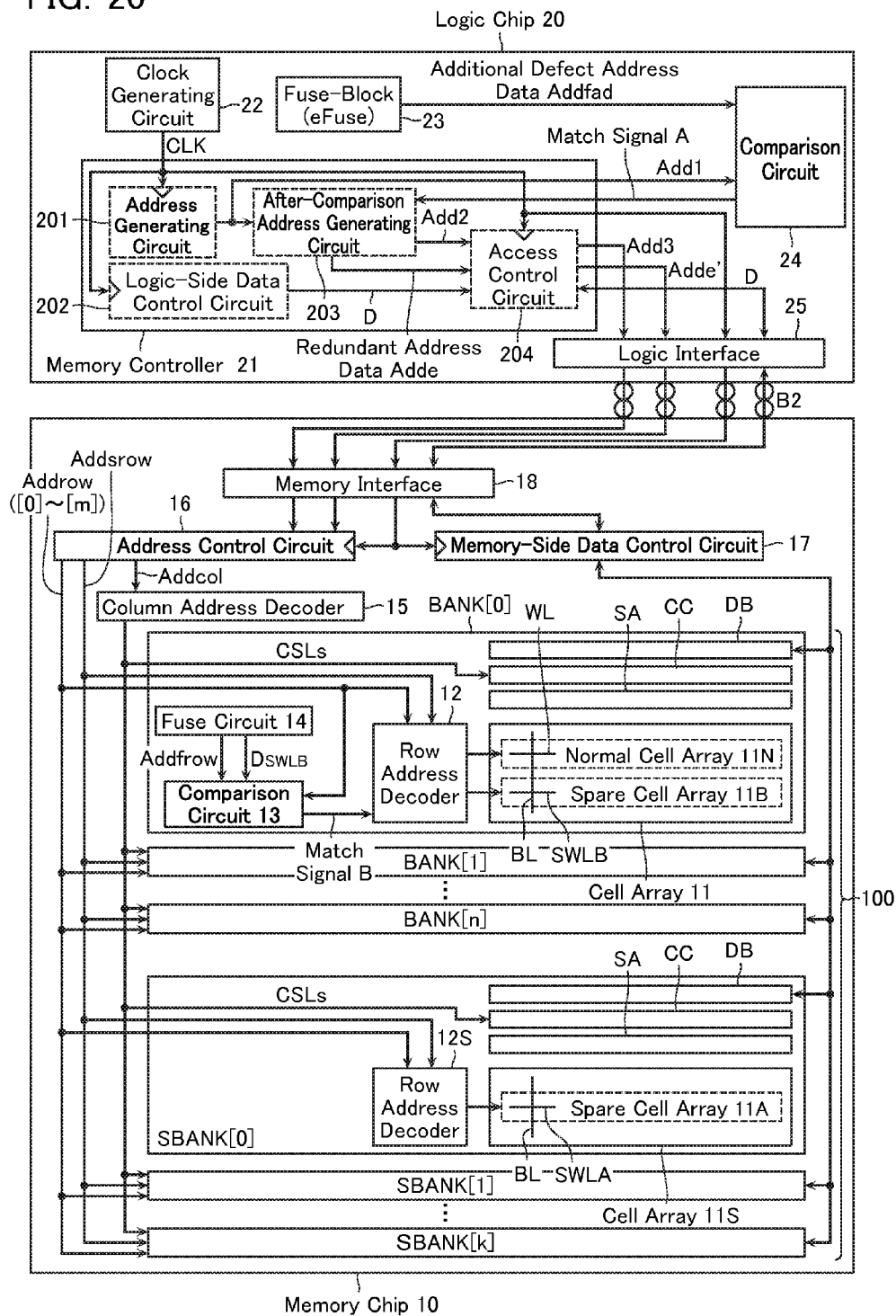
FIG. 20 is a block diagram showing an example of specific configurations of a memory chip 10 and a logic chip 20 included in a semiconductor device 1000 according to a tenth embodiment.

Next, a semiconductor device 1000 according to the tenth embodiment will be explained with reference to FIG. 20. In FIG. 20, any components that are the same as the components in FIG. 2 are denoted by the same reference numerals, and hence a detailed explanation about them will not be provided below. In the present embodiment, spare banks SBANK[0] to SBANK[k] are provided in addition to the banks BANK[0] to BANK[n] (normal banks) which are the same as those in the embodiments described above. The memory cell array 11 in each of the normal banks BANK[0] to BANK[n] includes a normal cell array 11N and one spare cell array 11B used for relieving a defective cell that occurs during a wafer process.

As compared with this, a memory cell array 11S in each of the spare banks SBANK[0] to SBANK[k] includes a spare cell array 11A used for relieving a defective cell that occurs during or after a packaging process. In this way, in the tenth embodiment, the spare cell arrays 11A and 11B are provided in different banks SBANK and BANK, which is the difference from the embodiments described above. In the present embodiment, for example, when a certain normal bank BANK[j] (j=0 to n) includes a defective cell that has occurred during or after a packaging process, the normal cell is relieved by accessing any of the spare banks SBANK instead of the normal bank BANK[j].

Each spare bank SBANK includes a row address decoder 12S.

When address data Add1 and additional defect address data Addfad match in the logic chip 20, the logic chip 20 inputs row address data Addrow[0] to [m] designating a spare word line SWLA in the spare cell array 11A and spare row address data Addsrow.

The row address decoder 12S selects a desired spare word line SWLA based on the row address data Addrow[0] to [m] and the spare row address data Addsrow.

[Eleventh Embodiment]

Figure 21:
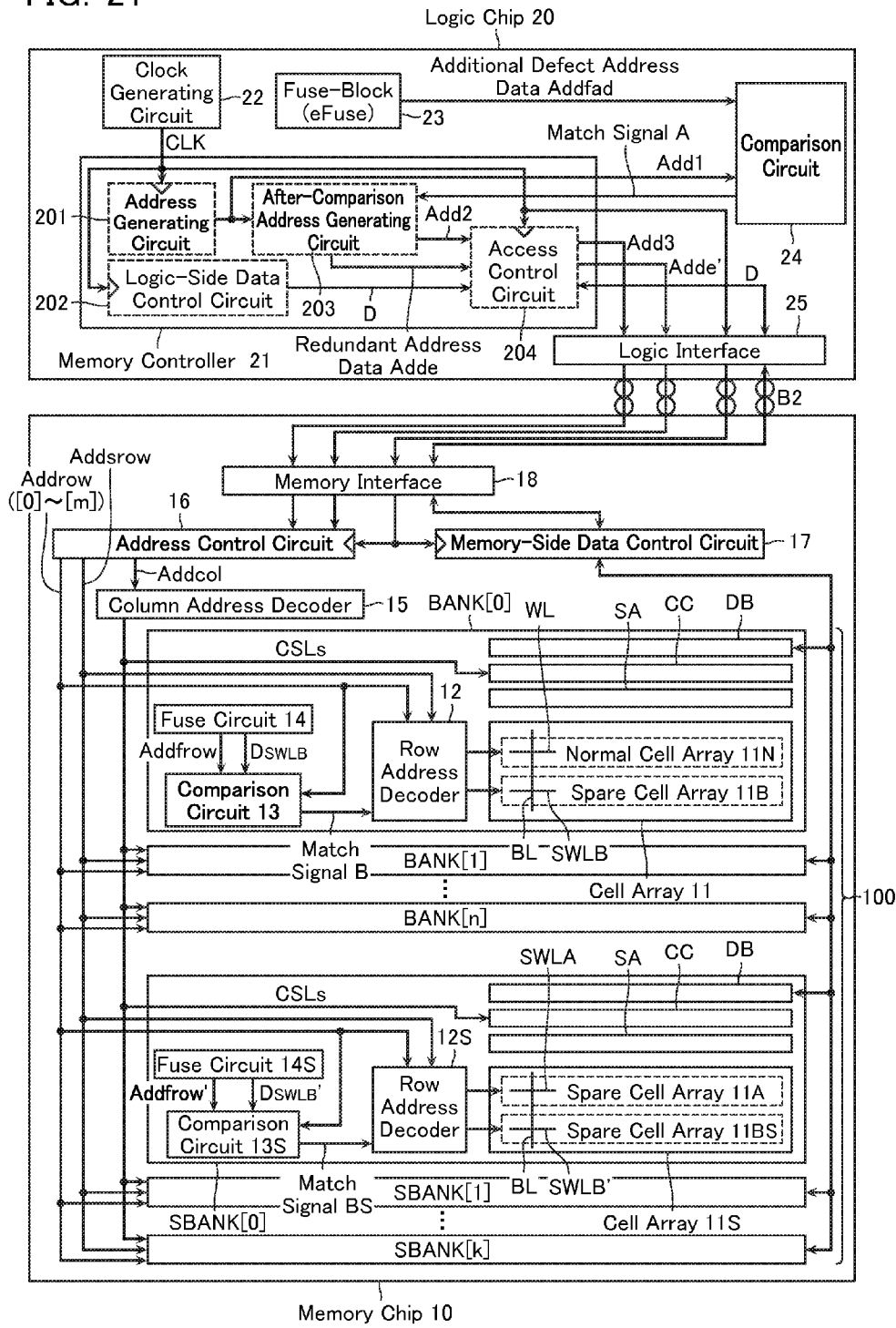
FIG. 21 is a block diagram showing an example of specific configurations of a memory chip 10 and a logic chip 20 included in a semiconductor device 1000 according to an eleventh embodiment.

Next, a semiconductor device according to the eleventh embodiment will be explained with reference to FIG. 21. In FIG. 21, any components that are the same as the components in FIG. 2 are denoted by the same reference numerals, and hence a detailed explanation about them will not be provided below.

In the present embodiment, in addition to the components of the tenth embodiment, a comparison circuit 13S and a fuse circuit 14S are provided in each of the spare banks SBANK in order to relieve a defective spare word line SWLA that occurs in the spare memory cell array 11A during a wafer process. Furthermore, the memory cell array 11S includes a spare cell array 11A and a spare cell array 11BS. The fuse circuit 14S stores defective row address data Addfrow' indicating the address of a defective spare word line SWLA in the spare cell array 11A, and spare word line usage information $D_{SWLB}$' specifying a spare word line SWLB' among spare word lines SWLB' in the spare cell array 11BS that is used for defect relieving. Row address data Addrow[0] to [m] is input into the comparison circuit 13S, and compared with the defective row address data Addfrow'. When the row address data Addrow[0] to [m] matches with any defective row address data Addfrow', the comparison circuit 13S outputs a match signal BS. Based on the match signal BS, the row decoder 12S selects a desired spare word line SWLB' instead of the spare word line SWLA that is designated by the row address data Addrow[0] to [m] and spare row address data Addsrow. The present embodiment is the same as the tenth embodiment in the other points.

[Twelfth Embodiment]

Figure 22:
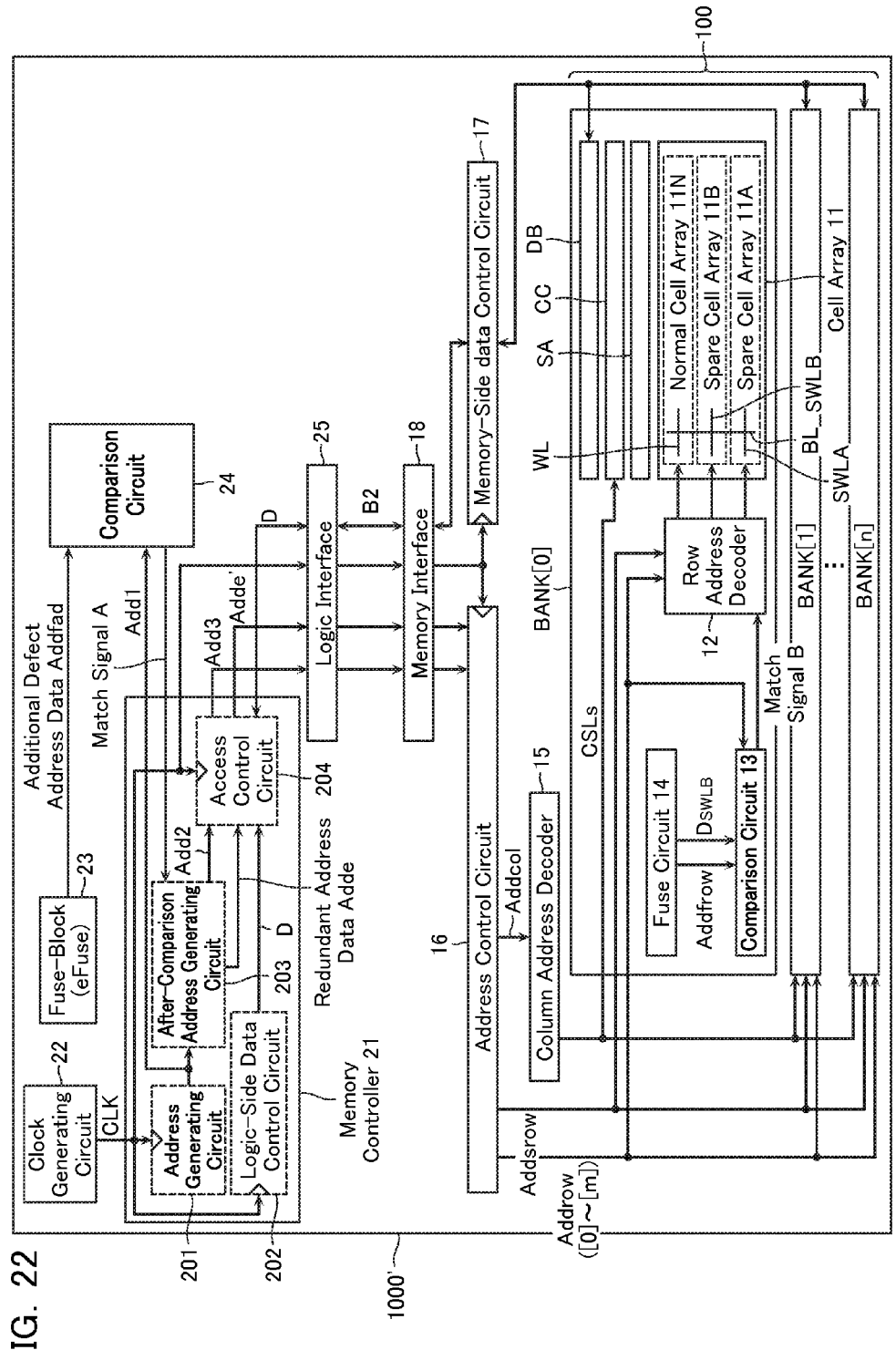
FIG. 22 is a block diagram showing an example of specific configurations of a memory chip 10 and a logic chip 20 included in a semiconductor device 1000 according to a twelfth embodiment.

Next, a semiconductor device according to the twelfth embodiment will be explained with reference to FIG. 22. In FIG. 22, any components that are the same as the components in FIG. 2 are denoted by the same reference numerals, and hence a detailed explanation about them will not be provided below. In the present embodiment, a mixed-mounted memory system (System on Chip: SoC) in which the functions of the logic chip 20 and the functions of the memory chip 10 are mounted on the same wafer is employed. Various circuits having the functions of the logic chip 20 are the same as the circuits on the logic chip 20, and the same is true for the memory chip 10. This configuration can also achieve the same effect as that achieved by the embodiments described above.

[Thirteenth Embodiment]

Next, a semiconductor device according to the thirteenth embodiment will be explained with reference to FIG. 23.

Figure 23:
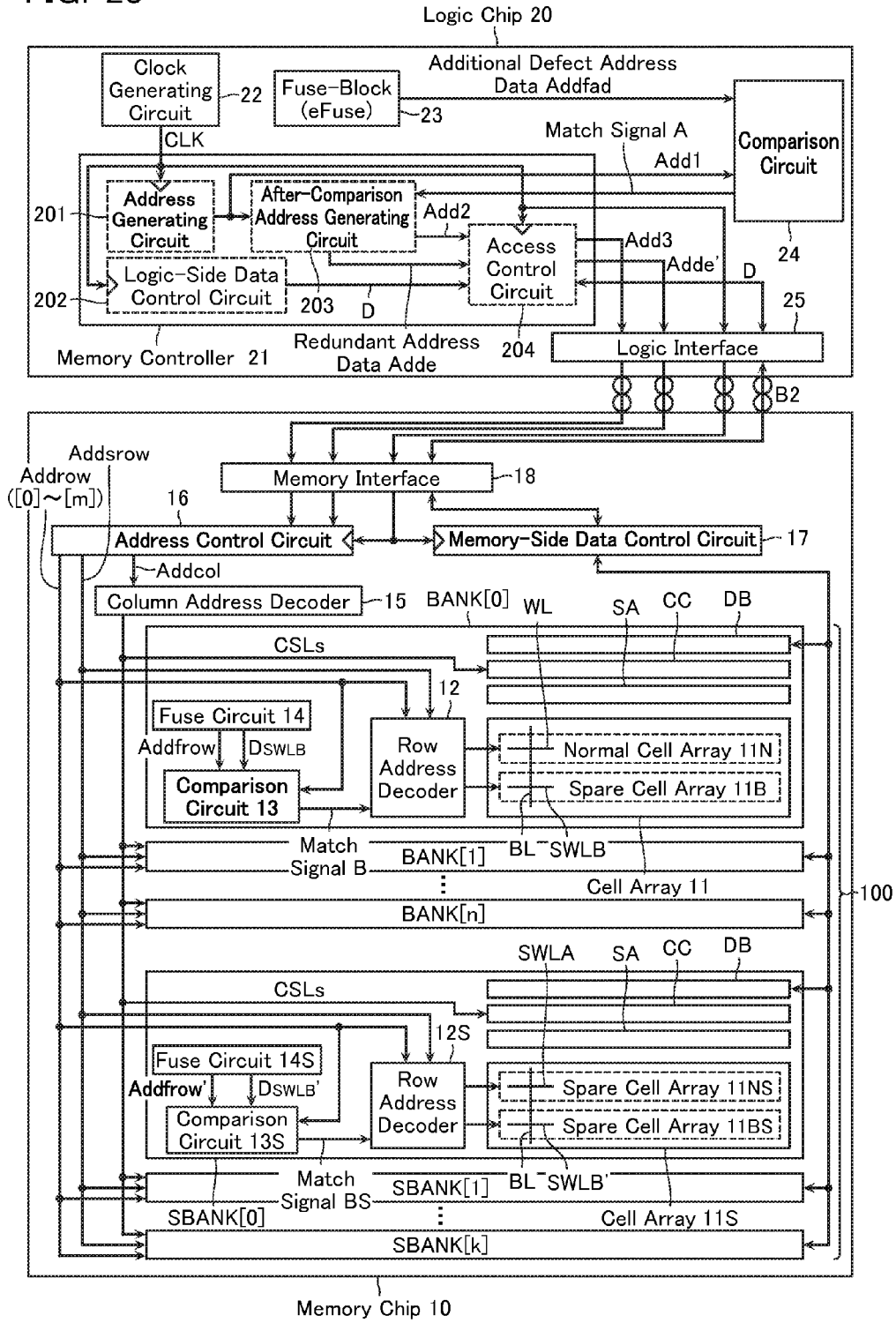
FIG. 23 is a block diagram showing an example of specific configurations of a memory chip 10 and a logic chip 20 included in a semiconductor device 1000 according to a thirteenth embodiment.

In FIG. 23, any components that are the same as the components in FIG. 21 (eleventh embodiment) are denoted by the same reference numerals, and hence a detailed explanation about them will not be provided below. This thirteenth embodiment differs from previous embodiments in the point that, when a defect has occurred during or after the packaging process, a bank BANK[i] where the defect has occurred is replaced entirely with a spare bank SBANK[i].

In the thirteenth embodiment, because a configuration where the bank BANK[i] is replaced entirely with the spare bank SBANK[i] is adopted in this way, the spare cell banks SBANK[0]-[k] each comprise not only a spare cell array 11S but also a normal cell array 11NS. In this viewpoint, the thirteenth embodiment differs from the eleventh embodiment where the spare banks SBANK comprise only a spare cell array 11S.

The fuse circuit 23 in the logic chip 20 stores the bank address of the bank BANK[i] where a defect has occurred during or after the packaging process as additional defect address data Addfad. When this additional defect address data Addfad and the address data Add1 match, the spare row address data is "1". As a result, the bank BANK[i] is entirely excluded from being accessed, and, in its place, the spare bank SBANK[i] is accessed. Because the comparison circuit 24 of the logic chip 20 is only required to compare the bank address of the address data Add1 with the additional defect address data Addfad indicating the bank address, this embodiment allows speeding up of processing in the logic chip 20 compared to in the eleventh embodiment.

[Fourteenth Embodiment]

Next, a semiconductor device according to the fourteenth embodiment will be explained with reference to FIG. 24.

Figure 24:
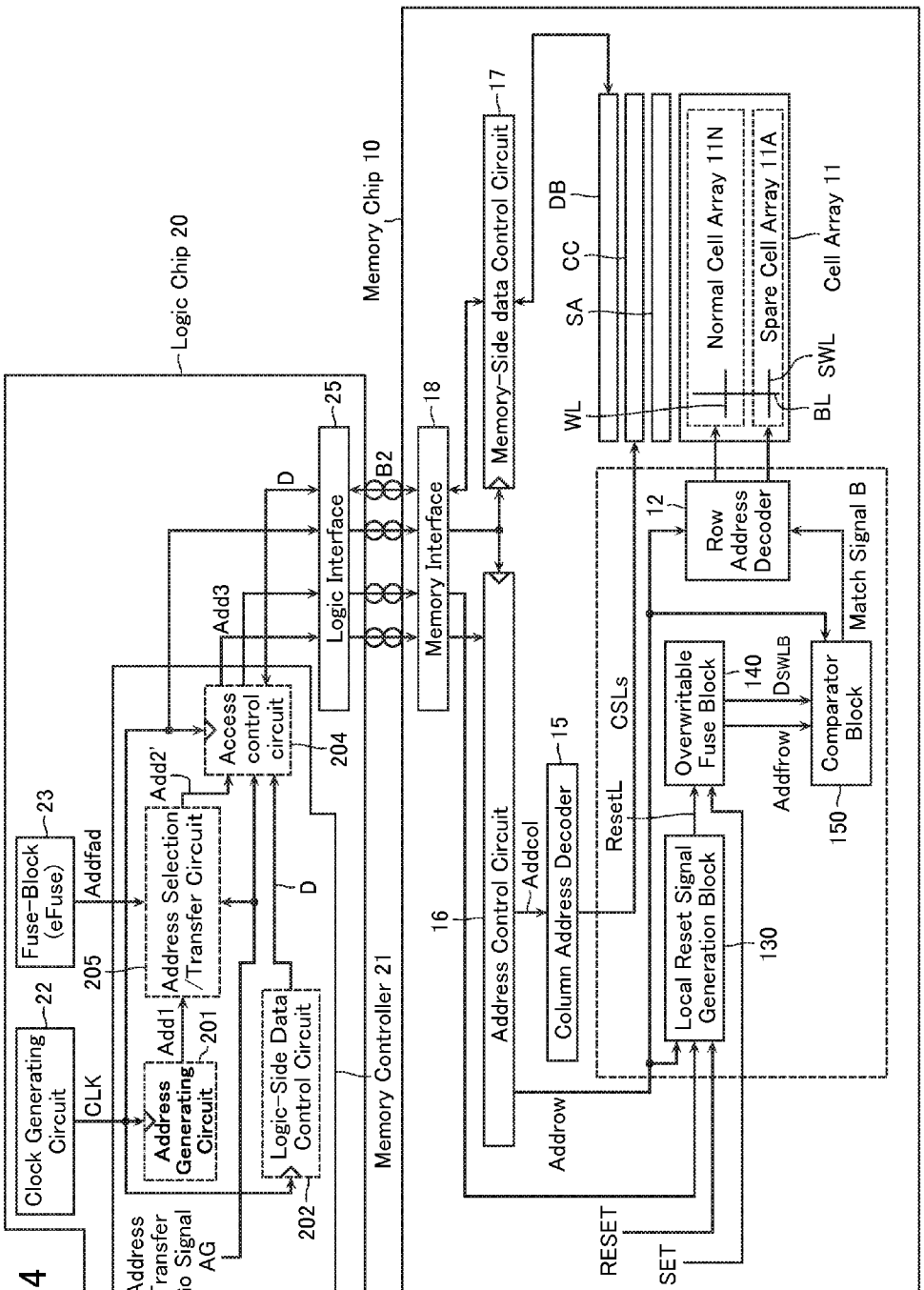
FIG. 24 is a block diagram showing an example of specific configurations of a memory chip 10 and a logic chip 20 included in a semiconductor device 1000 according to a fourteenth embodiment.

In FIG. 24, any components that are the same as the components in FIG. 2 (first embodiment) are denoted by the same reference numerals, and hence a detailed explanation about them will not be provided below.

In the foregoing first through thirteenth embodiments, not only does the memory chip 10 comprise the comparison circuit 13, but the logic chip 20 also comprises the comparison circuit 24. That is, the address of a defective cell that has occurred during or after the packaging process is stored in the fuse circuit 23 of the logic chip 20, and this is compared with the address data Add1 in the comparison circuit 24 in the logic chip 20.

In contrast, in the semiconductor device of the fourteenth embodiment, this comparison circuit 24 is omitted. In addition, the after-comparison address generating circuit 203 is also omitted. Although the fuse circuit 23 retaining the additional defect address data Addfad is present in the logic chip 20, this additional defect address data Addfad is read from the fuse circuit 23 after a power-on operation of the semiconductor device, transferred from the logic chip 20 to the memory chip 10 via the address data line along which the address data Add3 is transferred, to be stored in the memory chip 10. In this point, the fourteenth embodiment differs from the first through thirteen embodiments in that the additional defect address data Addfad is compared with the address data Add1 in the comparison circuit 24 in the logic chip 20.

In this way, the fourteenth through twenty-fifth embodiments described below differ from the first through thirteenth embodiments in presence/absence of the comparison circuit 24 and its peripheral circuits. However, in other respects, the first through thirteenth embodiments and the fourteenth through twenty-fourth embodiments are identical. Therefore, it is of course possible to appropriately combine configurations of the first through thirteenth embodiments with the fourteenth through twenty-fifth embodiments.

Explanation will go back to the description of the fourteenth embodiment. The memory chip 10 in the fourteenth embodiment comprises, as configurations for processing/storing the additional defect address Addfad transferred from the logic chip 20, a local reset signal generation block 130, an overwritable fuse block 140, and a comparator block 150. The comparator block 150 has a configuration corresponding to the comparison circuit 13 in the foregoing embodiments. The overwritable fuse circuit 140 is configured to store address data of the defective cell detected during the wafer process, and in addition, overwrite the additional defect address Addfad. In this viewpoint, the overwritable fuse block 140 differs from the fuse circuit 14 in the foregoing embodiments in that the latter stores only the address data of a defective cell detected in the wafer process. Note that the local reset signal generation block 130 is a circuit block for controlling the data read operation from this overwritable fuse block 140, and the write operation (overwrite operation).

As will be mentioned later, the overwritable fuse block 140 includes a plurality of fuse circuits, at least a portion of which are configured as data overwritable fuse circuits. After the additional defect address data Addfad is transferred from the logic chip 20 to be stored in this overwritable fuse block 140, ordinary operation is enabled. That is, generation of the address data Add1 enables an ordinary write operation and read operation while executing defect relief of not only a defective cell detected in the wafer process, but also a defective cell that has occurred during or after packaging. Details will be mentioned later.

In addition, the logic chip 20 comprises, as a circuit for transferring this additional defect address data Addfad to the memory chip 10, an address selection/transfer circuit 205. As a result of the address transfer GO signal AG attaining "H" after a power-on operation of the semiconductor device 1000, the address selection/transfer circuit 205 and the access control circuit 204 execute an operation transferring the additional defect address data Addfad toward the memory chip 10. The present embodiment allows a defective cell that has occurred during or after the packaging process to be efficiently relieved, similarly to in the first through thirteenth embodiments.

Figure 25:
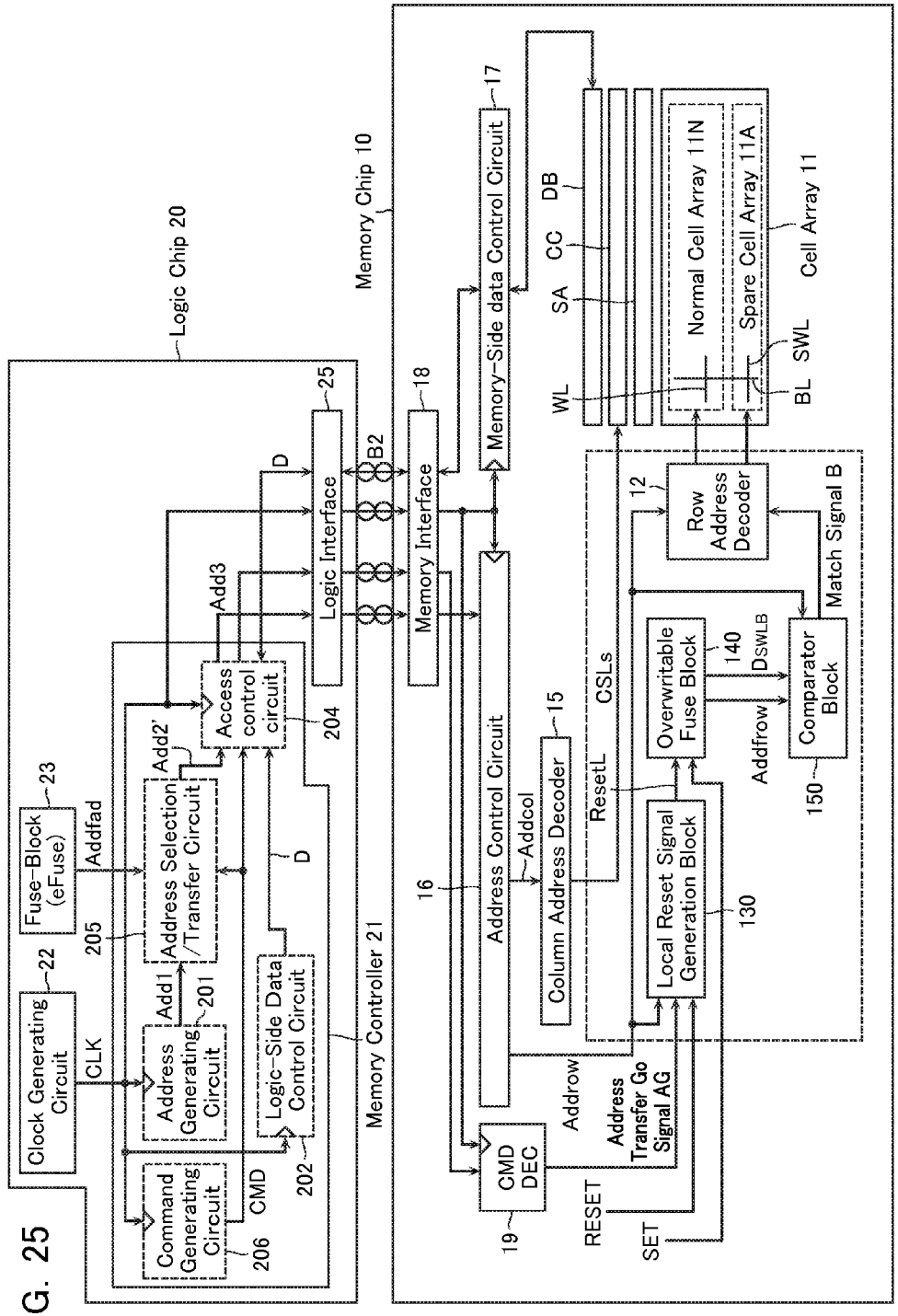
FIG. 25 is a block diagram showing an example of specific configurations of a memory chip 10 and a logic chip 20 included in a semiconductor device 1000 according to a modified example of the fourteenth embodiment.

A modified example of the semiconductor device according to the fourteenth embodiment will be described with reference to FIG. 25. In FIG. 25, any components that are the same as the components in FIG. 2 (first embodiment) are denoted by the same reference numerals, and hence a detailed explanation about them will not be provided below. This modified example, instead of driving the address selection/transfer circuit 205 based on the address transfer GO signal AG, drives the address selection/transfer circuit 205 by a command CMD generated by a command generating circuit 206. This command CMD is transmitted to a command decoder 19 provided in the memory chip 10, via the address control circuit 204, the logic interface 25 and the memory interface 18.

(Local Reset Signal Generation Block 130, Overwritable Fuse Block 140, and Comparator Block 150)

Next, an example of specific configurations of the local reset signal generation block 130, the overwritable fuse block 140, and the comparator block 150 in FIG. 24 will be described with reference to FIG. 26. To simplify explanation, in this example the case will be described where only one spare word line SWL(m) from among (m+1) pieces of spare word lines in the spare cell array 11A is utilized for relieving a defective cell that has occurred during or after the packaging process, and the remaining m pieces of spare word lines are utilized for relieving a defective cell that has occurred in the wafer process. However, the present invention is of course not limited to this case.

Figure 26:
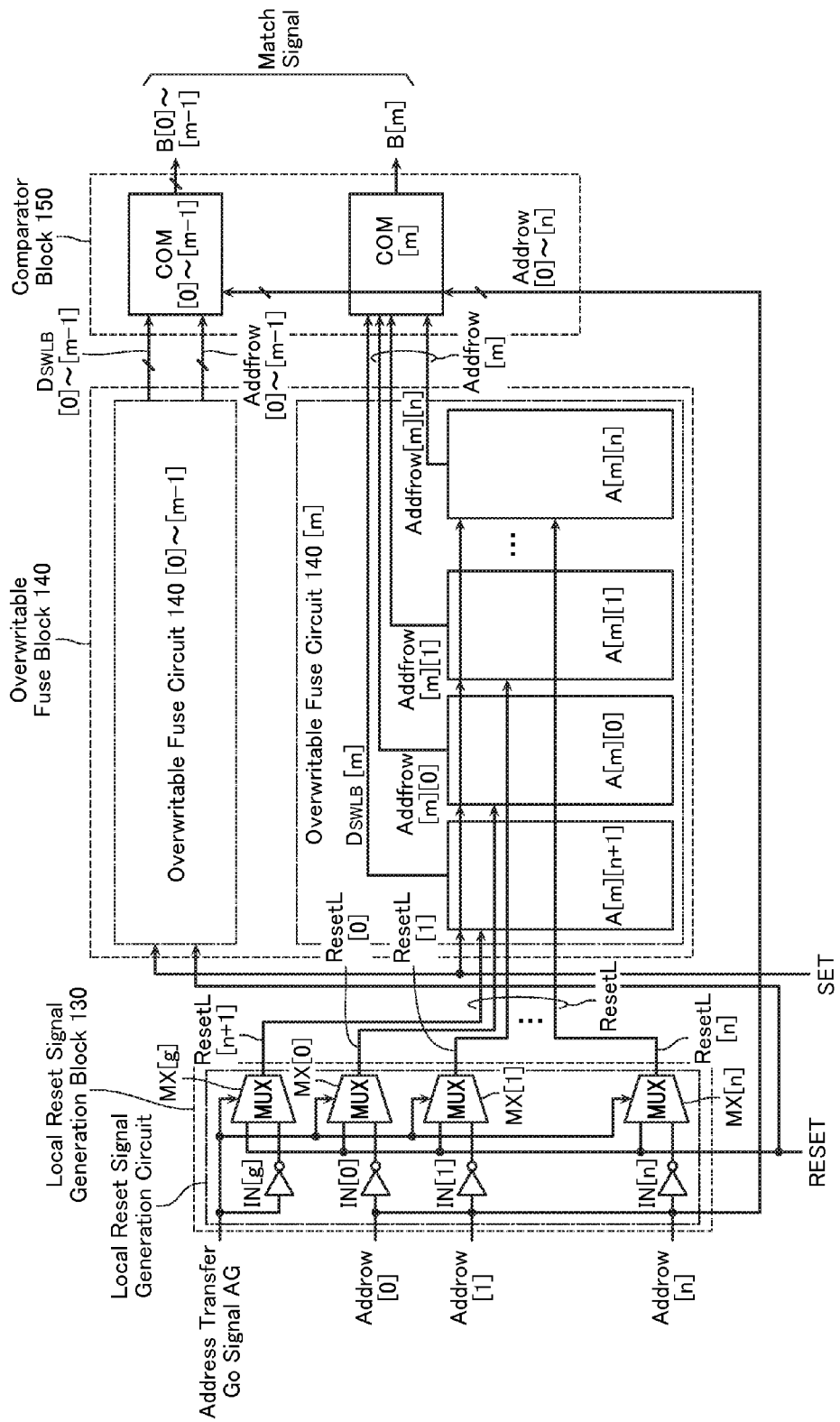
FIG. 26 is a circuit diagram explaining an example of specific configurations of a local reset signal generation block 130, an overwritable fuse block 140, and a comparator block 150 in FIG. 24.

As shown in FIG. 26, the local reset signal generation block 130 in the present embodiment comprises a plurality of inverter circuits IN[g] and IN[0]~[n], and a plurality of multiplexers MX[g] and MX[0]~[n]. The inverter circuit IN[g] has its input terminal supplied with the previously mentioned address transfer GO signal AG. Moreover, the inverter circuits IN[0]~[n] are supplied with row address data Addrow [0]~[n] respectively. The multiplexers MX[g] and MX[0]~[n] have their input terminals supplied with the reset signal RESET and output signals of the inverter circuits IN[g] and IN[0]~[n], and, in accordance with logic of the address transfer GO signal AG, selectively output either of the two input signals as output signals (local reset signals ResetL[n+1] and ResetL[0]~[n]).

The overwritable fuse block 140 comprises (m+1) pieces of overwritable fuse circuits 140[0]~140[m]. The overwritable fuse circuits 140[0]~140[m] are provided corresponding to the (m+1) pieces of spare word lines SWL[0]~[m] in the spare cell array 11A, respectively. As previously mentioned, in this example, only the spare word line SWL(m) is utilized for relieving a defective cell that has occurred during or after the packaging process. Therefore, only the overwritable fuse circuit 140[m] of the overwritable fuse circuits 140[0]~[m] is configured capable of being overwritten with the additional defect address Addfad. The other overwritable fuse circuits 140[0]~[m–1] are only provided with a function of being written with a defect address detected in the wafer process by laser blow, and a function of reading this defect address detected in the wafer process. They do not have a function of being overwritten with the additional defect address Addfad. Needless to say, it is possible to configure these overwritable fuse circuits 140[0]~[m–1] to be overwritably provided with the additional defect address Addfad, and the present invention is not to exclude such a configuration. That is, the number of overwritable fuse circuits 140 configured to be overwritable is not specifically limited.

Note that each of the overwritable fuse circuits 140[0]~[m] comprises (n+2) individual fuse circuits A[i][0]~[n+1] (i=0~m). The individual fuse circuits A[i][0]~[n] are circuits for storing defect address data Addfrow (or the additional defect address Addfad) supplied as row address data Addrow [0]~[n]. In addition, the individual fuse circuit A[i][n+1] is a circuit for retaining the spare word line usage information $D_{SWLB}$ indicating whether a corresponding spare word line SWL is being used or not.

The comparator block 150 comprises (m+1) individual comparison circuits COM[0]~[m] corresponding to the above-mentioned (m+1) overwritable fuse circuits 140[0]~[m]. Each of the individual comparison circuits COM[0]~[m] compares the defect row address data Addfrow[0]~[m] stored in the overwritable fuse circuits 140[0]~[m] and the address data Addrow to output match signals B[0]~[m].

(Example of Specific Configuration of Overwritable Fuse Circuits 140[0]~140[m])

Figure 27:
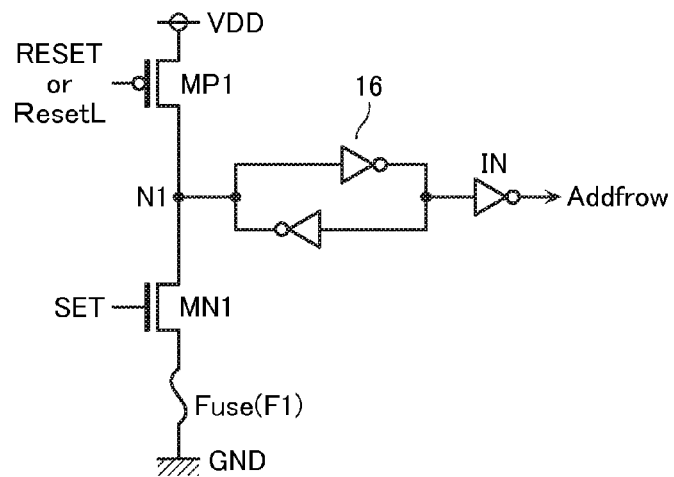
FIG. 27 shows an example of specific configurations of overwritable fuse circuits 140[0]-140[m] according to the fourteenth embodiment.

FIG. 27 shows an example of a specific configuration of the overwritable fuse circuits 140[0]~140[m]. Each of the individual fuse circuits A in these overwritable fuse circuits 140 [0]~140[m] is configured having a PMOS transistor MP1, an NMOS transistor MN1, and a laser fuse F1 (referred to below simply as "fuse F1") connected in series, and a latch circuit 16 and an inverter IN connected to a node N1 between the PMOS transistor MP1 and the NMOS transistor MN1. The gate of the PMOS transistor MP1 is inputted with the previously mentioned reset signal RESET or local reset signal ResetL. Specifically, the PMOS transistor MP1 of the overwritable fuse circuits 140[0]~[m–1] is inputted with the reset signal RESET only (as a result, overwrite is not performed in the overwritable fuse circuits 140[0]~[m–1]). On the other hand, the PMOS transistor MP1 of the overwritable fuse circuit 140[m] is inputted with the local reset signal ResetL only (due to the additional defect address Addfad being reflected in the local reset signal ResetL, the additional defect address Addfad is overwritten in the overwritable fuse circuit 140 [m]).

Meanwhile, the gate of the NMOS transistor MN1 is inputted with the set signal SET.

(Read Operation in Overwritable Fuse Circuits 140[0]~[m–1])

Figure 28:
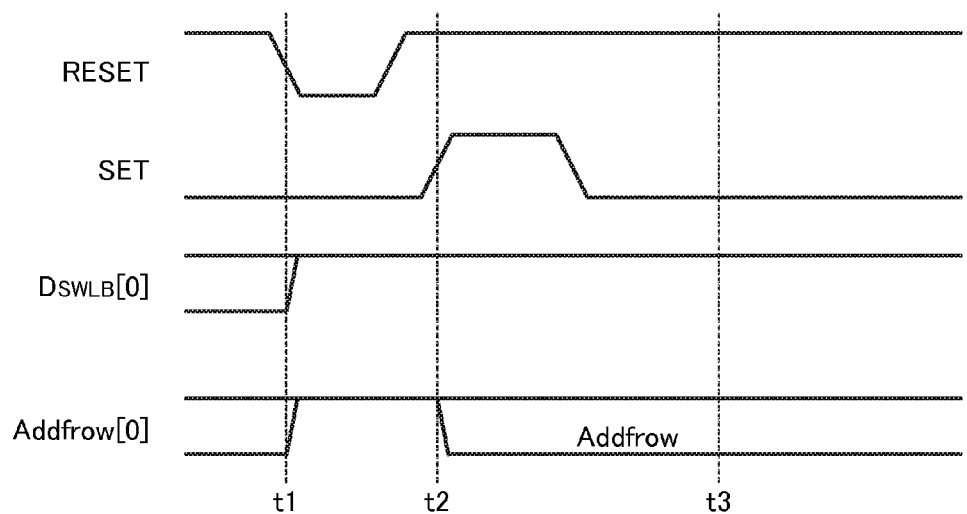
FIG. 28 is a timing chart explaining a read operation in the overwritable fuse circuits 140[0]-140[m−1] in the fourteenth embodiment.

Next, a read operation in the overwritable fuse circuits 140[0]~[m–1] storing only the address of a defective cell that has occurred in the wafer process will be described with reference to the timing chart of FIG. 28. First, at time t1, the reset signal RESET is lowered from "H" to "L" for a certain time period. As a result, the PMOS transistor MP1 in FIG. 27 is conductive for the certain time period and the node N1 is pre-charged to the power supply voltage VDD. Then, at time t2, the set signal SET is raised to "H" for a certain time period. As a result, the NMOS transistor MN1 is conductive for the certain time period. At this time, if the fuse F1 is melted by "laser blow", a potential of the node N1 is maintained unchanged at the power supply voltage VDD, while if the fuse F1 is not melted, the potential of the node N1 is discharged to the ground voltage GND. In such a way, data stored in the latch circuit 16 changes according to whether the fuse F1 is melted or not. The data stored in the latch circuit 16 is outputted toward the comparator block 150 as defect row address data Addfrow.

(Overwrite Operation of Additional Defect Address in Overwritable Fuse Circuit 140[m])

Next, an overwrite operation of the address of a defective cell that has occurred during or after the packaging process (additional defect address Addfad) in the overwritable fuse circuit 140[m] having a function of overwriting the additional defect address Addfad will be described with reference to FIG. 29. The operation at times t1-t2 is similar to the case of FIG. 28. At this stage, the defect address data Addrow[0]~[m–1] of defective cells that have occurred in the wafer process are read out from the overwritable fuse circuits 140[0]~[m–1]. However, in the overwritable fuse circuit 140[m], the fuse F1 is not melted, hence the defect address row data Addfrow[m][0]-Addfrow[m][n] and the spare word line usage information $D_{SWLB}$ that are outputted from the overwritable fuse circuit 140[m] are all "L".

At following time t3, when the address transfer GO signal AG rises to "H" for a certain time period, the local reset signals ResetL[0]~[n] are outputted from the local reset signal generation block 130 as signals corresponding to the address data Addrow (additional defect address Addfad). Also, the local reset signal ResetL[n+1] becomes "L" to set the spare word line usage information $D_{SWLB}$. As a result, the spare word line usage information $D_{SWLB}$ and the defect row address data Addfrow corresponding to the additional defect address Addfad is stored (overwritten) in the latch circuit 16. (Separate Example of Configurations of Local Reset Signal Generation Block 130, Overwritable Fuse Block 140, and Comparator Block 150)

Figure 30:
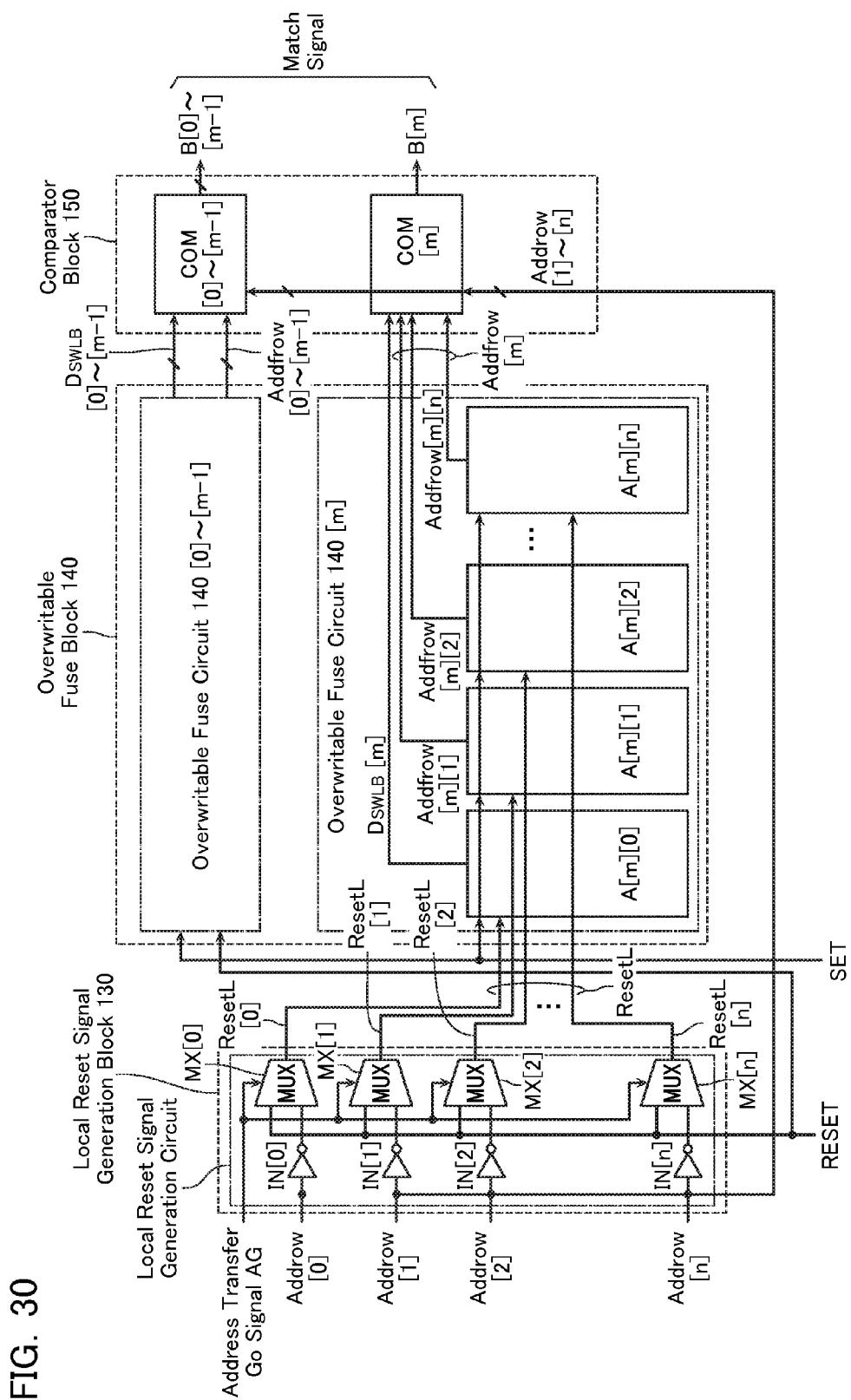
FIG. 30 is a block diagram showing a separate example of configurations of a local reset signal generation block 130, an overwritable fuse block 140, and a comparator block 150.
Figure 31:
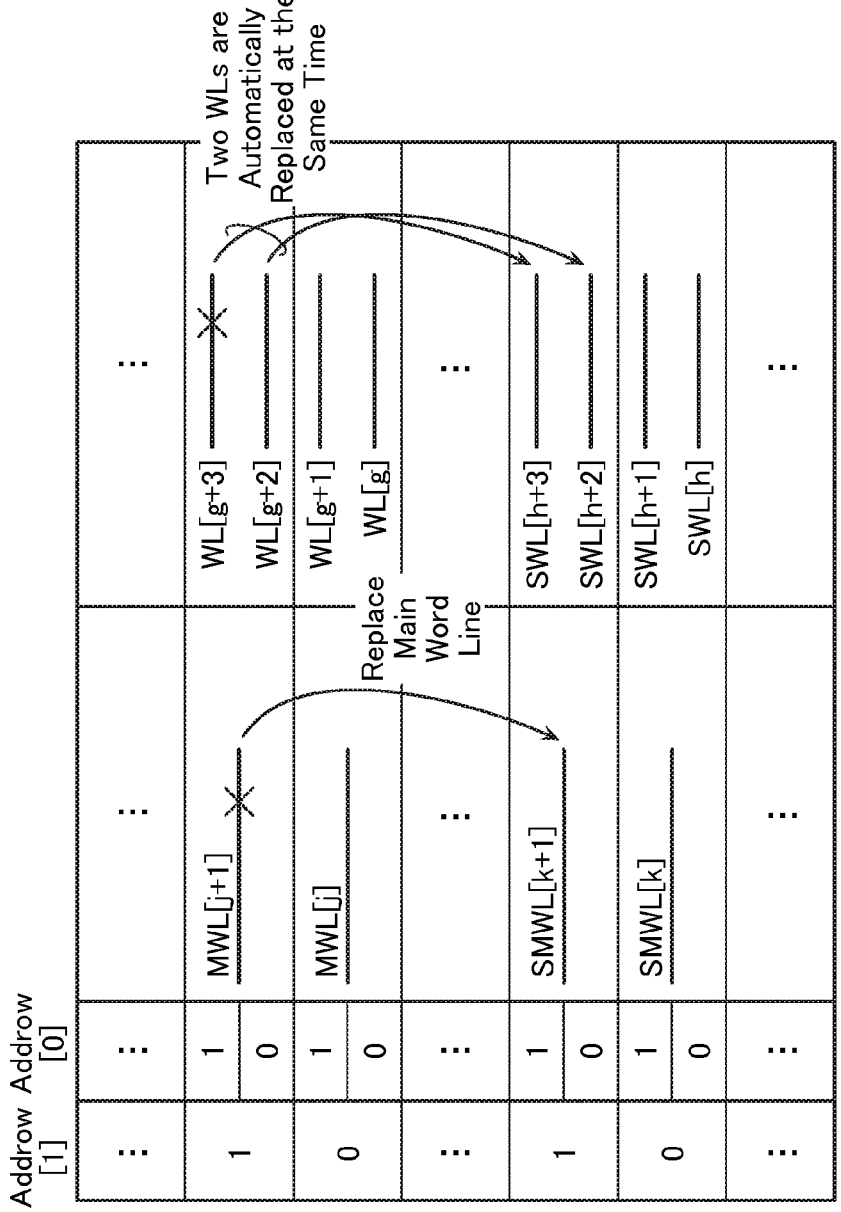
FIG. 31 is a schematic view explaining operation in the case of executing defect relief in a word line of word lines in a hierarchical structure by the circuit in FIG. 30.

Next, a separate example of configurations of the local reset signal generation block 130, the overwritable fuse block 140, and the comparator block 150 will be described with reference to FIG. 30. In this circuit of FIG. 30, since the row address data Addrow[0] is not subject to address comparison, the spare word line usage information $D_{SWLB}$ is transferred via a signal line for the row address data Addrow[0]. The row address data Addrow[0] is sent to the overwritable fuse block 140 via the inverter IN[0] and the multiplexer MX[0]. For example, as shown in FIG. 31, when a main word line MWL is subject to defect relief, the two sub-word lines WL in the layer below the main word line MWL are also automatically subject to defect relief. Therefore, the number of inverters and multiplexers in the local reset signal generation block 130 also is one less compared to FIG. 26.

[Fifteenth Embodiment]

Next, a semiconductor device according to the fifteenth embodiment will be explained with reference to FIG. 32. The fifteenth embodiment has its features in configurations of the local reset signal generation block 130, the overwritable fuse block 140, and the comparator block 150. Other configurations are substantially similar to those of the fourteenth embodiment, hence a detailed explanation about them will not be provided.

An example of configurations of the local reset signal generation block 130, the overwritable fuse block 140, and the comparator block 150 according to the fifteenth embodiment will be described with reference to FIG. 32. This circuit of FIG. 32 is a circuit for the case where (i+1) pieces of spare word lines SWL(m−i)~SWL(m) from among the (m+1) pieces of spare word lines SWL in the spare cell array 11A are employed for relieving a defective cell that has occurred during or after the packaging process.

Figure 32:
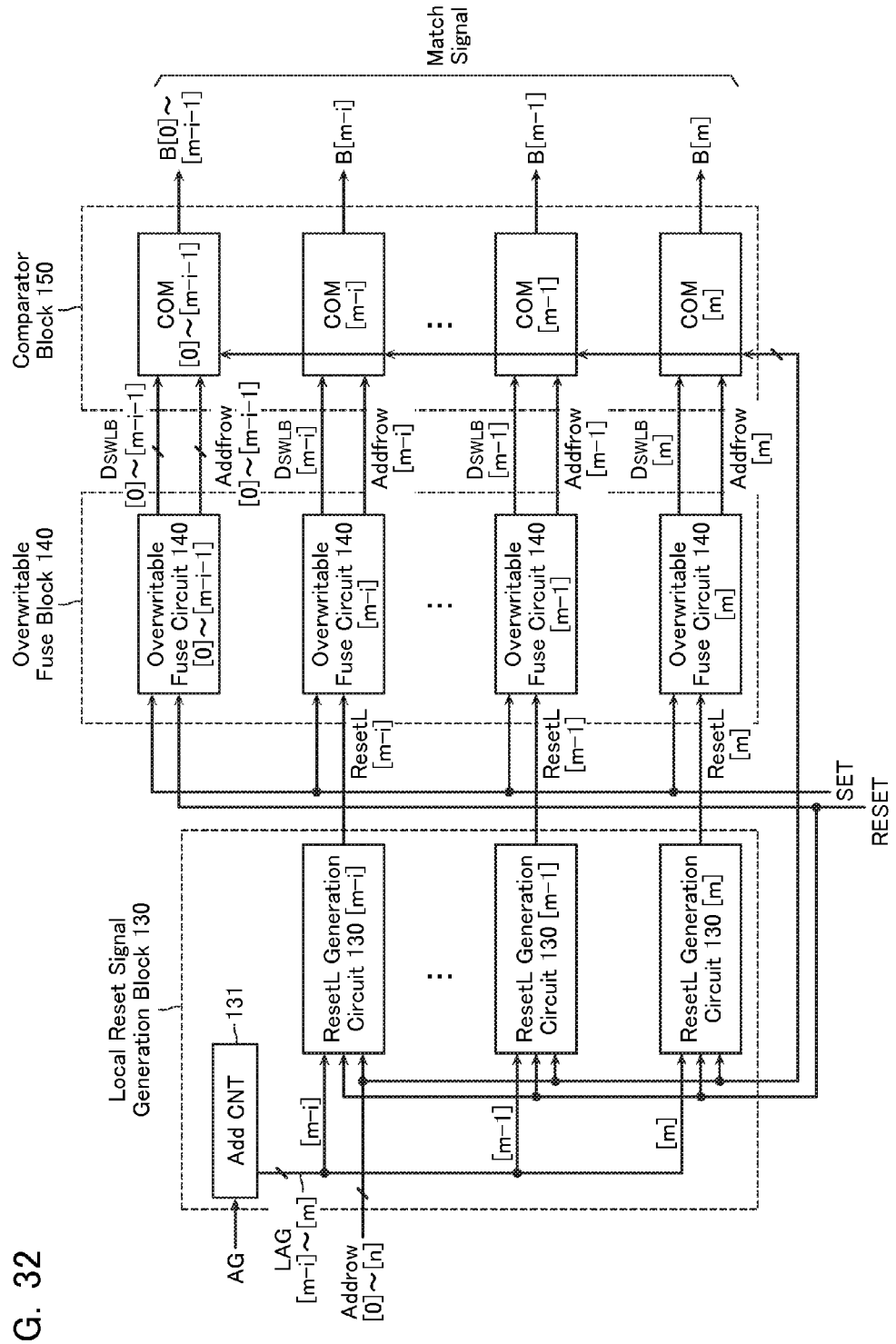
FIG. 32 is a block diagram showing an example of specific configurations of a semiconductor device 1000 (a block diagram showing configurations of a local reset signal generation block 130, an overwritable fuse block 140, and a comparator block 150) according to a fifteenth embodiment.

The local reset signal generation block 130 of this FIG. 32 comprises an address counter 131 for counting the number of times that the address transfer GO signal AG is inputted. Note that in FIG. 32, the local reset signal generation circuits 130[m−i]~[m] correspond to the inverters IN and multiplexers MX in FIG. 30.

Every time the address transfer GO signal AG is inputted, the address counter 131 increments a counter value and outputs a local address transfer GO signal LAG[j](j=m−i~m) corresponding to the counter value. Any one of the local reset signal generation circuits 130[m−i]~[m] corresponding to the outputted local address transfer GO signals LAG[j] is activated to output the local reset signal ResetL. As a result, any one of the (i+1) overwritable fuse circuits A[m−i]~[m] is selected, and that selected overwritable fuse circuit A is overwritten with the additional defect address data Addfad.

[Sixteenth Embodiment]

Figure 33:
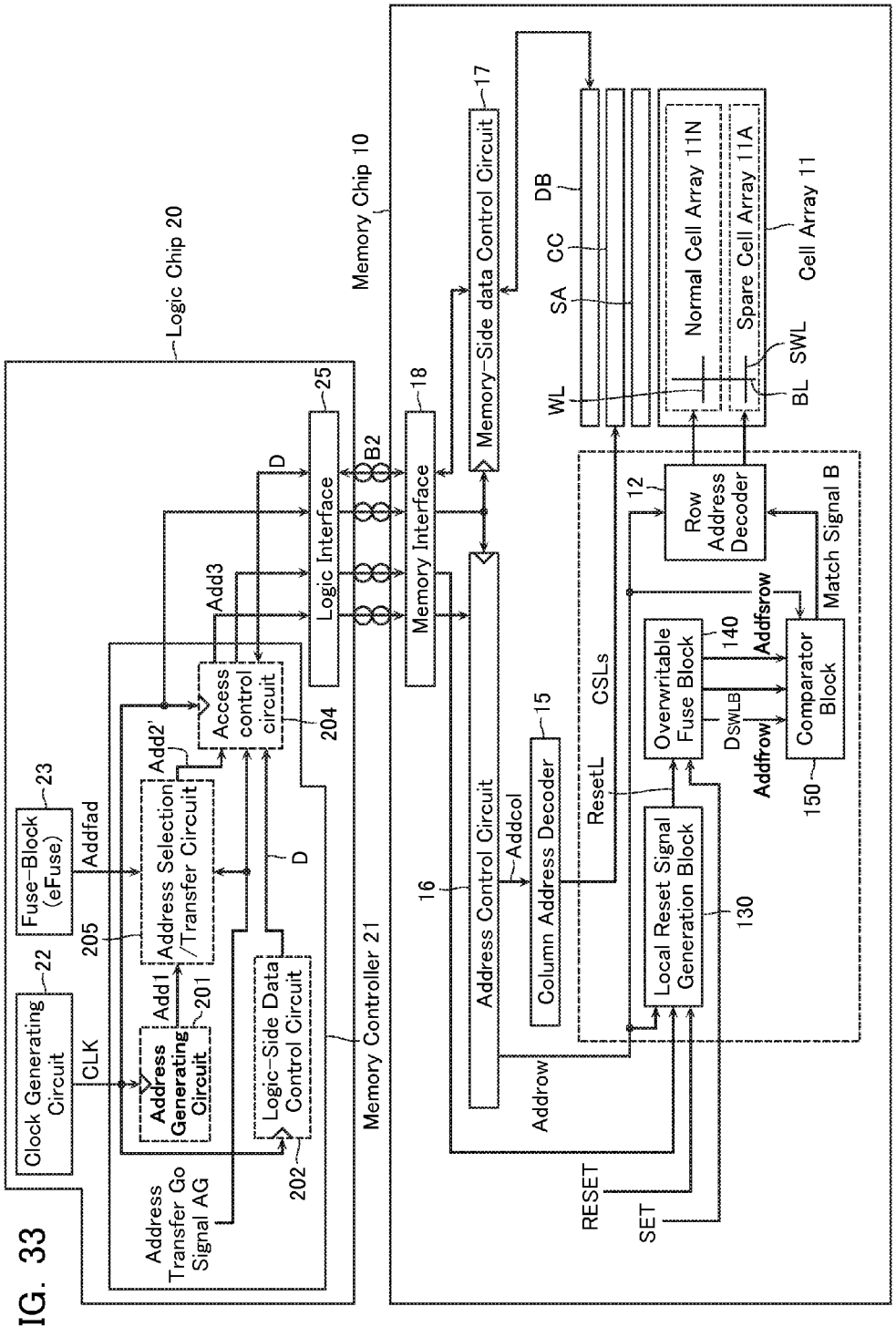
FIG. 33 is a block diagram showing an example of specific configurations of a memory chip 10 and a logic chip 20 included in a semiconductor device 1000 according to a sixteenth embodiment.
Figure 34:
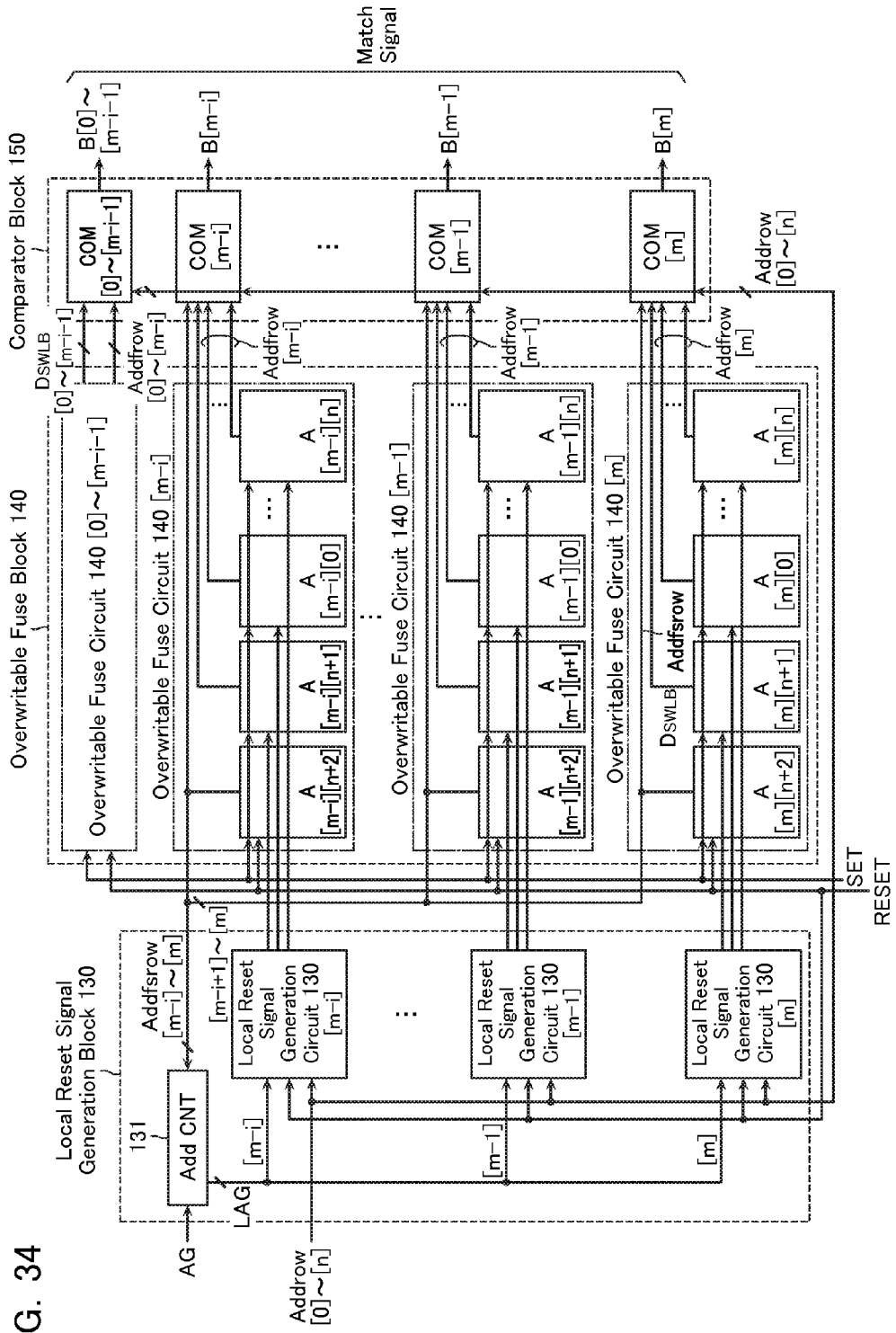
FIG. 34 is a block diagram showing specific configurations of a local reset signal generation block 130, an overwritable fuse block 140, and a comparator block 150 in the semiconductor device 1000 according to the sixteenth embodiment.

Next, a semiconductor device according to the sixteenth embodiment will be explained with reference to FIGS. 33 and 34. FIG. 33 is a block diagram showing the whole configuration of the semiconductor device according to the sixteenth embodiment, and FIG. 34 is a block diagram showing an example of specific configurations of the local reset signal generation block 130, the overwritable fuse block 140, and the comparator block 150. In FIGS. 33 and 34, any components that are the same as the components in the fourteenth embodiment (FIGS. 24~26) are denoted by the same reference numerals, and hence a detailed explanation about them will not be provided below.

As shown in FIG. 33, the sixteenth embodiment differs from the fourteenth embodiment in having the overwritable fuse block 140 configured capable of storing not only the defect row address data Addfrow and the spare word line usage information $D_{SWLB}$, but also defect spare row address data Addfsrow indicating whether a defect spare word line is present in the spare cell array 11A or not. Therefore, as shown in FIG. 34, in the overwritable fuse block 140, each of the overwritable fuse circuits 140[m−i]~[m] further comprises an individual fuse circuit A[i] [n+2] for overwriting this defect spare row address data Addfsrow. As shown in for example FIG. 35, this embodiment makes it possible, in the case where a defect has occurred in the spare word line SWL[m−1] in the wafer process, to overwrite the corresponding overwritable fuse circuit 140[m−1] with the defect spare row address data Addfsrow="1", whereby said spare word line SWL[m−1] is not used but replaced by another spare word line SWL.

When the defect spare row address data Addfsrow="1" is stored in the overwritable fuse circuits 140[m−i]~[m], that defect spare row address data Addfsrow="1" is transferred toward the address counter 131. For example, as shown in FIG. 35, when the spare word line SWL[m−1] is a defect spare word line, the defect spare row address data Addfsrow="1" is stored in the corresponding overwritable fuse circuit 140[m−1]. In this case, the address counter 131 receives the defect spare row address data Addfsrow="1", further count up its own count value, skips the address of the spare word line SWL[m−1], and designates the next spare word line SWL.

[Seventeenth Embodiment]

Next, a semiconductor device according to the seventeenth embodiment will be explained with reference to FIGS. 36 and 37. The seventeenth embodiment has its features in configurations of the local reset signal generation block 130, the overwritable fuse block 140, and the comparator block 150. Other configurations are substantially similar to those of the fourteenth through sixteenth embodiments, hence a detailed explanation about them will not be provided.

This seventeenth embodiment relates to a semiconductor device configured capable of, in the case where a defect has occurred in a spare word line SWL that has once been employed in defect relief in the wafer process, replacing that spare word line by a separate spare word line. As an example, FIG. 37 shows diagrammatically the case where the spare word line SWL[3] is employed for relieving a certain defective normal word line WL in the wafer process and the spare word line usage information $D_{SWLB}$="1" is stored by "laser blow" in the overwritable fuse circuit 140[3] corresponding to the spare word line SWL[3] but the spare word line SWL[3] has become defective during or after the packaging process. In this case, the spare word line SWL[3] is replaced by any of the spare word lines SWL[m−i]~[m] prepared for relieving a defect that has occurred during or after the packaging process.

Figure 36:
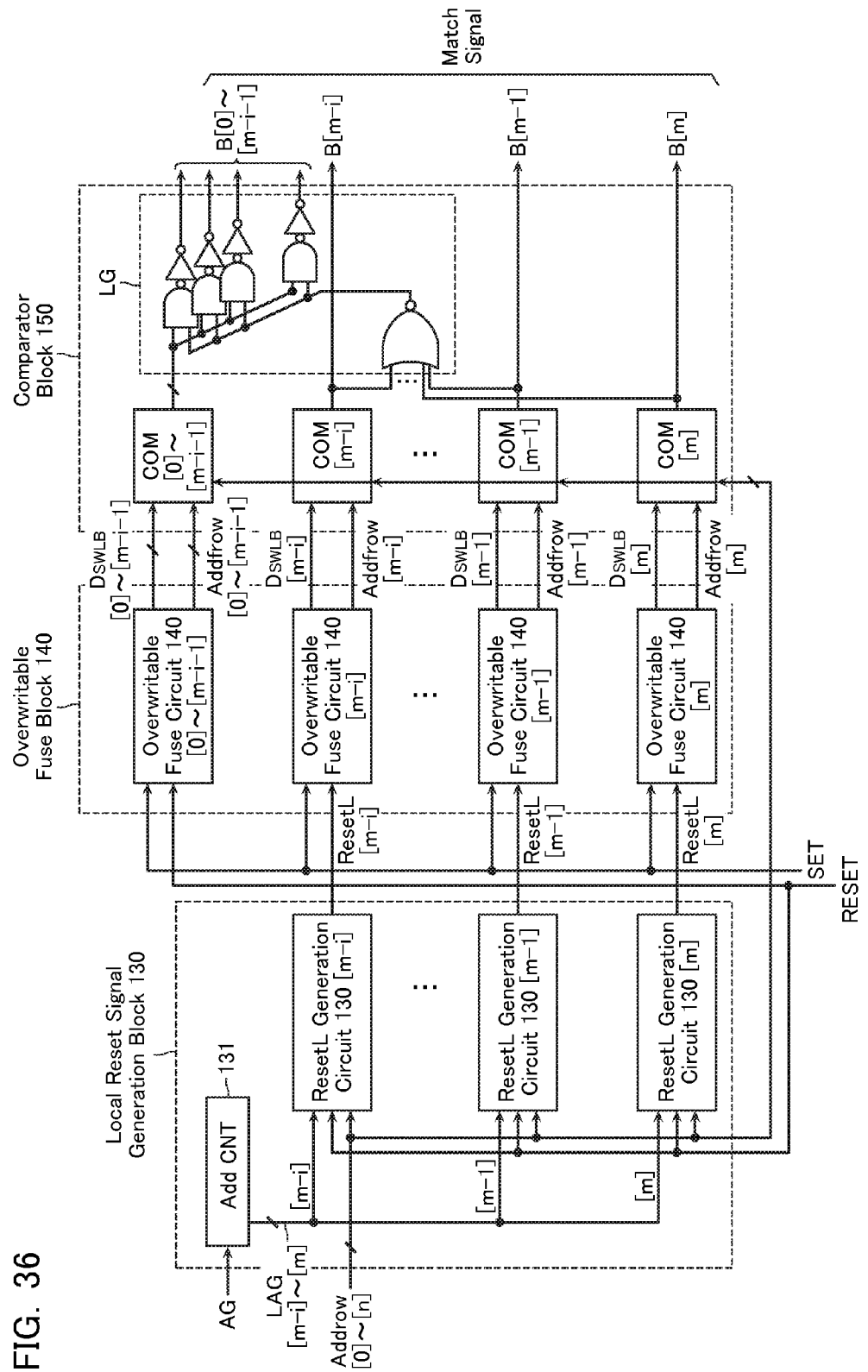
FIG. 36 is a block diagram showing an example of specific configurations of a semiconductor device 1000 (a block diagram showing configurations of a local reset signal generation block 130, an overwritable fuse block 140, and a comparator block 150) according to a seventeenth embodiment.
Figure 37:
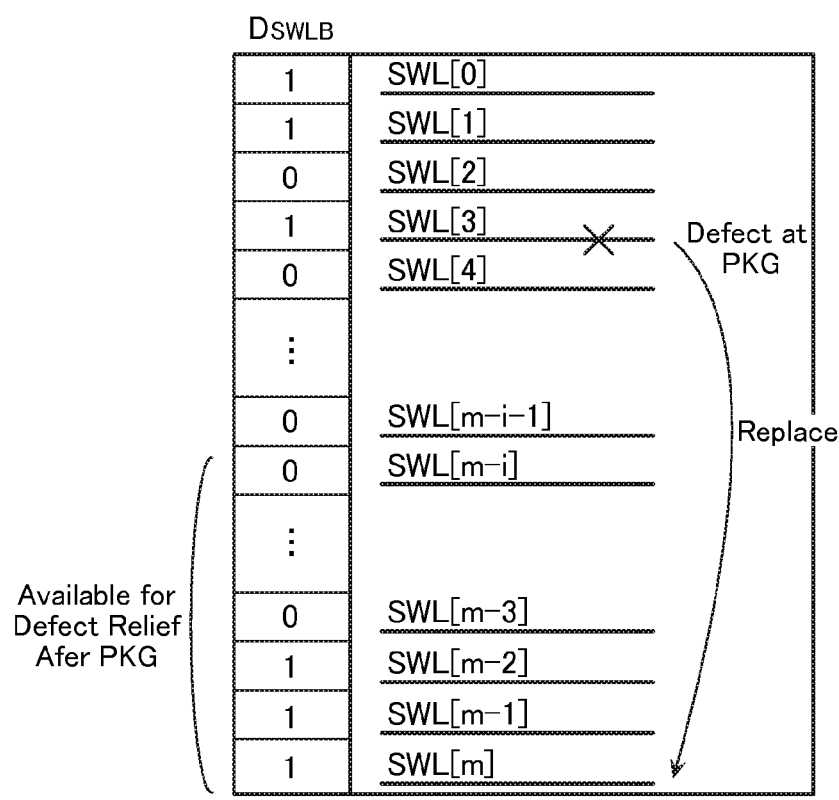
FIG. 37 is a schematic view showing operation in the seventeenth embodiment.

The circuit of FIG. 36 comprises a logic gate circuit LG for rendering executable the defect relief operation of the kind shown in this FIG. 37. As shown in FIG. 37, this logic gate circuit LG is a circuit for disabling selection of a spare word line (for example, SWL[3]) which was employed in defect relief in the wafer process but which itself experienced a defect during or after the packaging process. When the spare word line SWL[m] is selected in place of the spare word line SWL[3], the spare word line usage information $D_{SWLB}$="1" is stored in the corresponding overwritable fuse circuit 140[m]. In this case, the individual comparison circuit COM[3] and the individual comparison circuit COM[m] output the match signal B[3]="1" and B[m]="1", respectively. However, the output signal of the individual comparison circuit COM[3] is forcibly cancelled to "0" by the logic gate circuit LG. As a result, the operation of FIG. 37 is executed. That is, a spare word line SWL judged defective during or after the packaging process is never accessed, and a separate spare word line SWL is accessed instead.

[Eighteenth Embodiment]

Figure 38:
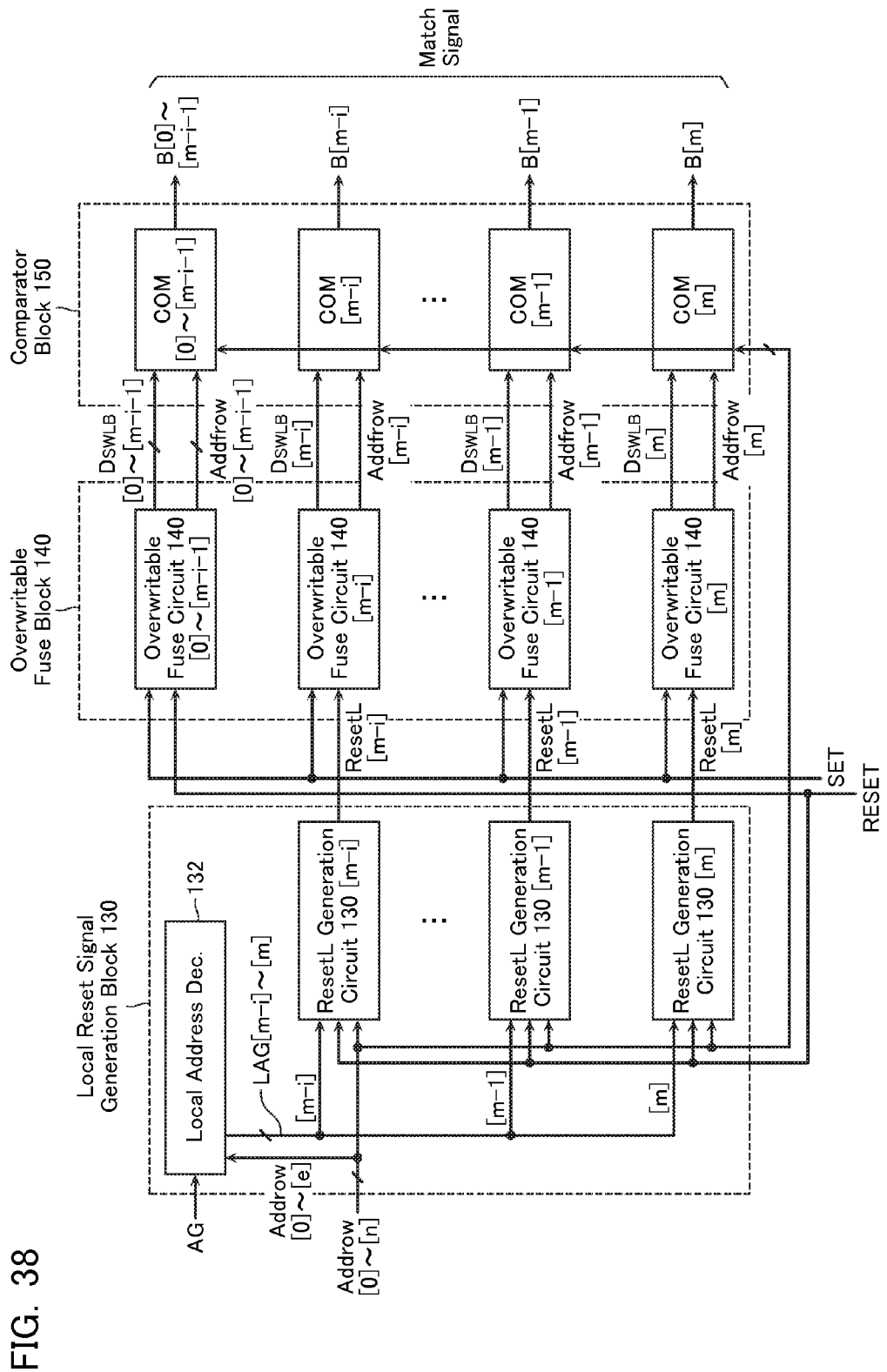
FIG. 38 is a block diagram showing an example of specific configurations of a semiconductor device 1000 (a block diagram showing configurations of a local reset signal generation block 130, an overwritable fuse block 140, and a comparator block 150) according to an eighteenth embodiment.
Figure 40:
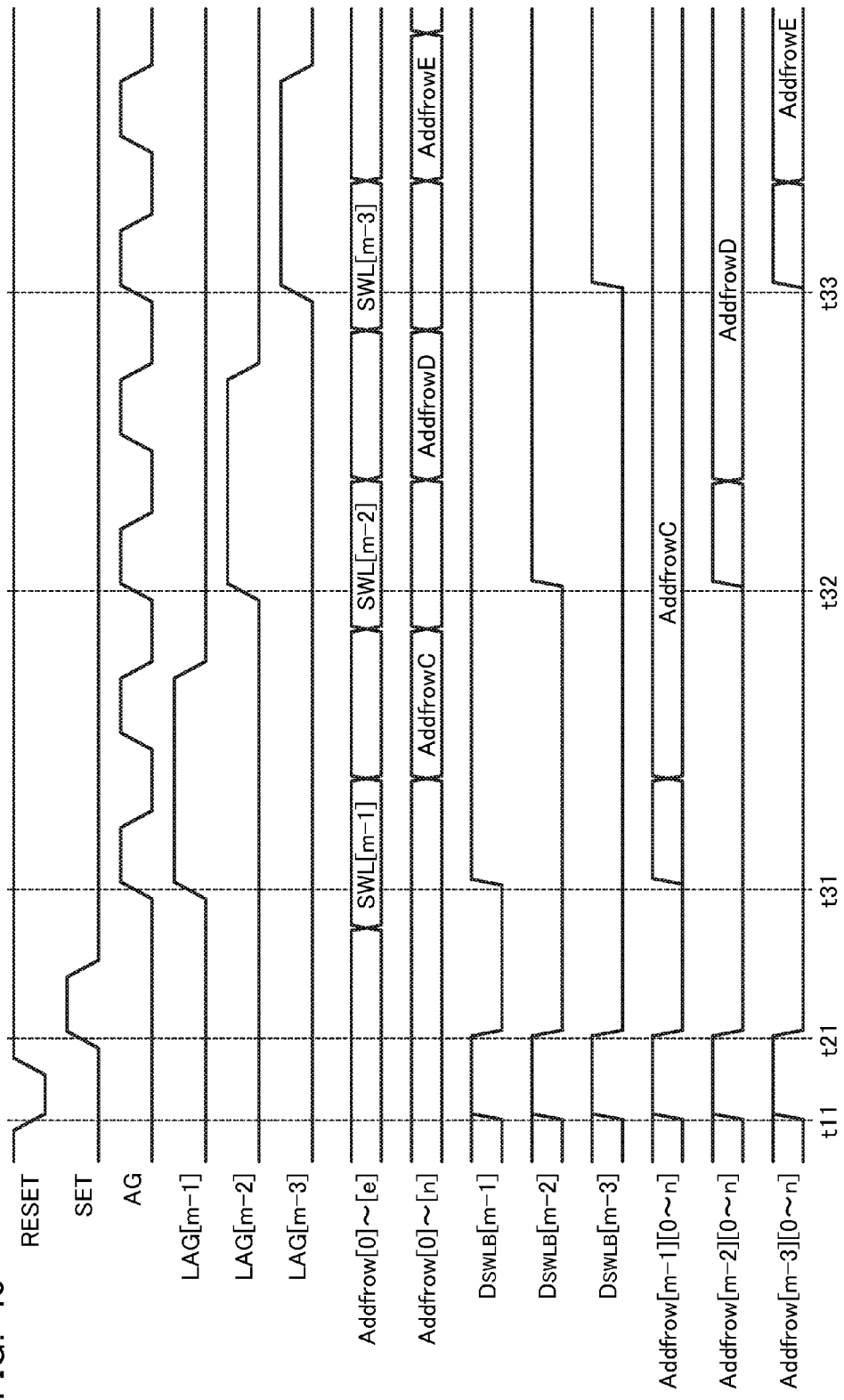
FIG. 40 is a timing chart showing operation in the eighteenth embodiment.

Next, a semiconductor device according to the eighteenth embodiment will be explained with reference to FIGS. 38 to 40. As shown in FIG. 38, the eighteenth embodiment has its features in configurations of the local reset signal generation block 130, the overwritable fuse block 140, and the comparator block 150. Other configurations are substantially similar to those of the fourteenth through sixteenth embodiments, hence a detailed explanation about them will not be provided.

As shown in FIG. 39, this eighteenth embodiment relates to a semiconductor device configured capable of, in the case where a defect has occurred during or after the packaging process in a spare word line SWL which is desired to be used for defect relief of a defective cell that has occurred during or after the packaging process (for example, the spare word line SWL[m] in FIG. 39), replacing that spare word line SWL[m] by a separate spare word line (for example, the spare word lines SWL[m−1]~SWL[m−3] in FIG. 39).

In order to enable execution of the defect relief operation of the kind shown in this FIG. 39, the circuit of FIG. 38 comprises a local address decoder 132. The local address decoder 132, each time it is inputted with the address transfer GO signal AG, outputs a local address transfer GO signal LAG[j] (j=m-i~m) based on the row address data Addrow[0]~[e] which is a portion of the row address data Addrow[0]~[n]. In the case where a defect has occurred in for example the spare word line SWL[m] during or after the packaging process as previously mentioned, the row address data Addrow[0]~[e] causes a spare word line SWL[m−1]~[m−i] other than the spare word line SWL[m] to be designated. This enables the operation of FIG. 39 to be realized.

The operation of the circuit in FIG. 38 is described with reference to the timing chart of FIG. 40. Described here as an example is the case where the additional defect address Addfad is overwritten in the three spare word lines SWL[m−1]~[m−3]. The operation at times t11-t21 is similar to the case of FIG. 29. Then, at time t31, the address transfer GO signal AG attains "H" for a certain time period, and substantially simultaneously to this, the row address data Add[0]~[e] designating the spare word line SWL[m−1] is inputted to the local address transfer GO signal-dedicated address decoder 132. When this is done, the local address transfer GO signal LAG[m−1] outputted from the local reset signal generation circuit 130[m−1] rises to "H" for a certain time period, whereby the spare word line usage information $D_{SWLB}$[m−1] and the defect row address data Addfrow[m−1] [0~n] are outputted from the overwritable fuse circuit 140[m−1]. Similar operations are executed also in the local reset signal generation circuits 130[m−2] and 130[m−3] at times t32 and t33.

[Nineteenth Embodiment]

Figure 41:
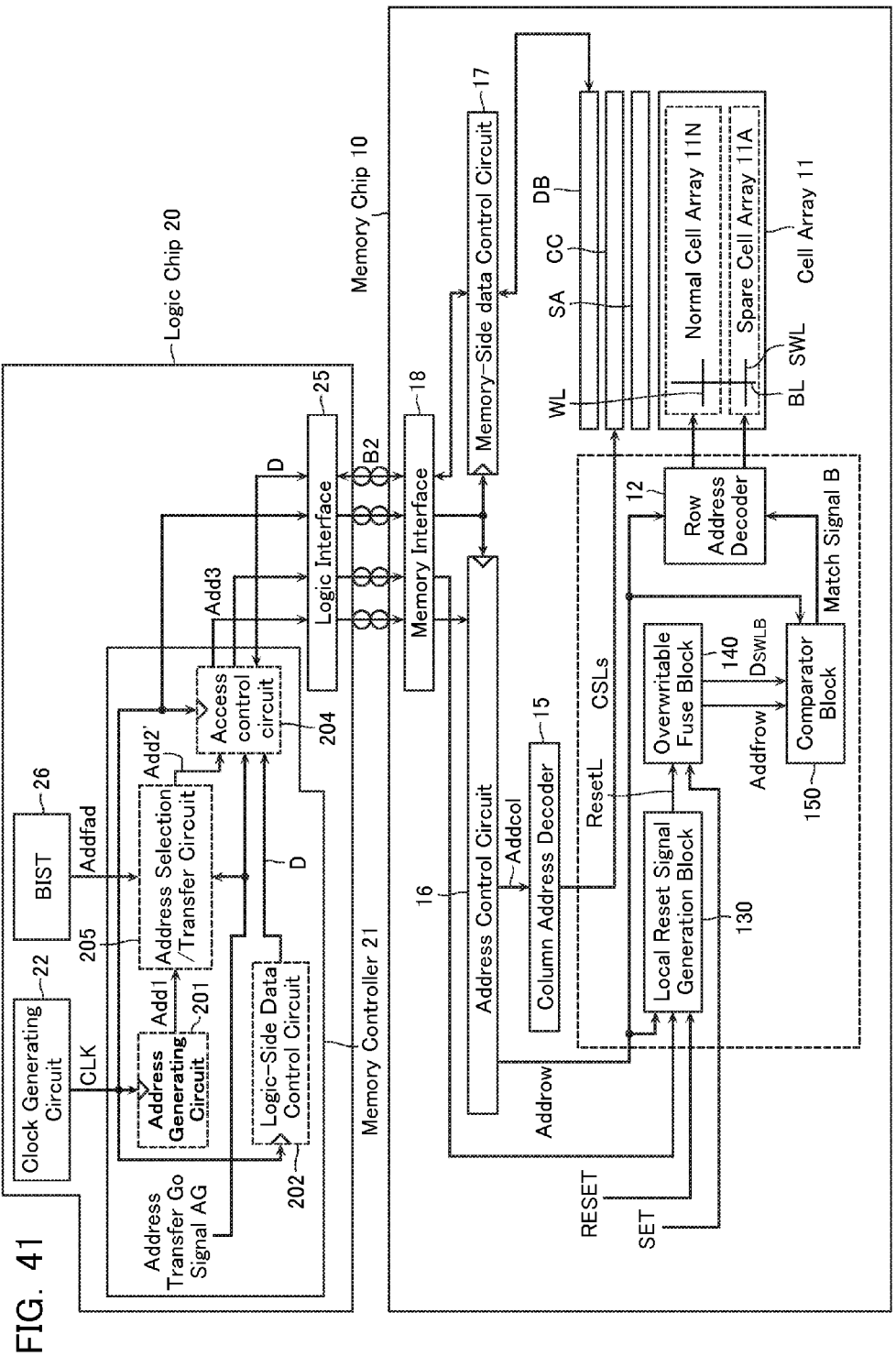
FIG. 41 is a block diagram showing an example of specific configurations of a memory chip 10 and a logic chip 20 included in a semiconductor device 1000 according to a nineteenth embodiment.

Next, a semiconductor device according to the nineteenth embodiment will be explained with reference to FIG. 41. The whole configuration of the present embodiment is the same as the fourteenth embodiment (FIG. 24). In this nineteenth embodiment, similarly to in the sixth embodiment, the logic chip 20 comprises the BIST circuit 26 in place of the fuse circuit 23. Other configurations are similar to the fourteenth embodiment.

[Twentieth Embodiment]

Figure 42:
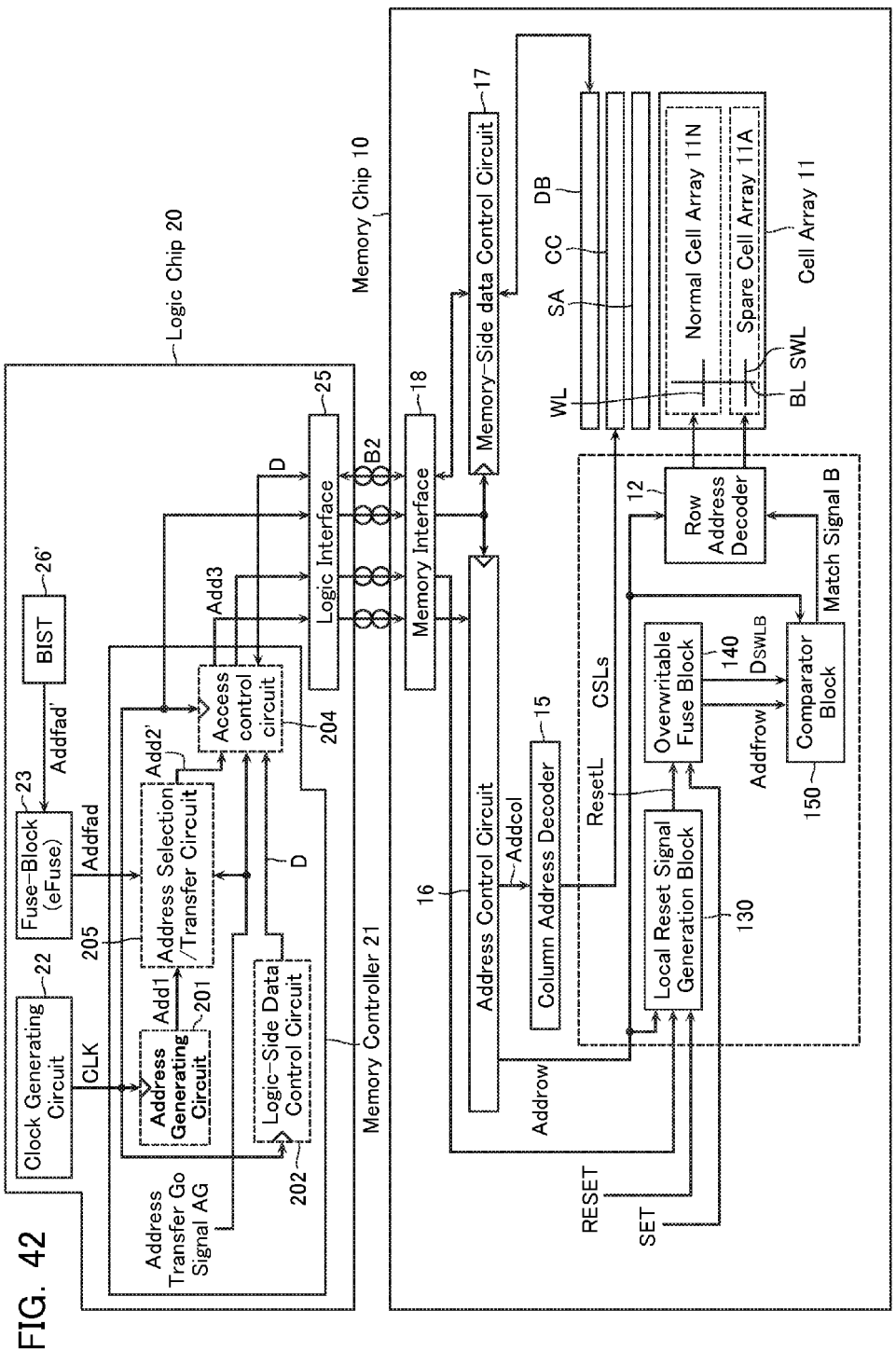
FIG. 42 is a block diagram showing an example of specific configurations of a memory chip 10 and a logic chip 20 included in a semiconductor device 1000 according to a twentieth embodiment.

Next, a semiconductor device according to the twentieth embodiment will be explained with reference to FIG. 42. In this twentieth embodiment, similarly to in the seventh embodiment, a configuration is adopted enabling the additional defect address data Addfad' specified by the BIST circuit 26 to be automatically written to the fuse circuit 23. Other configurations are similar to the fourteenth embodiment.

[Twenty-first Embodiment]

Figure 43:
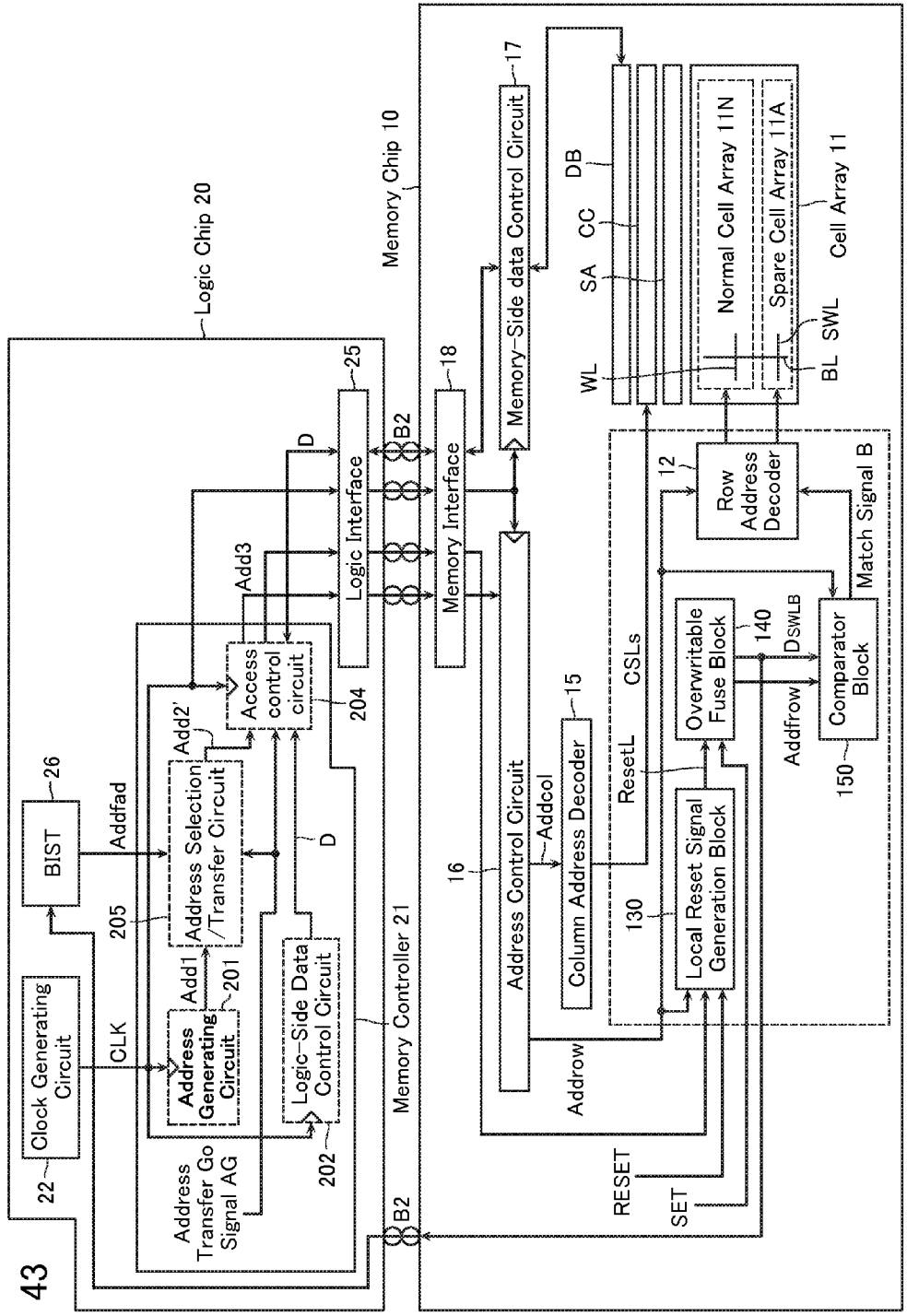
FIG. 43 is a block diagram showing an example of specific configurations of a memory chip 10 and a logic chip 20 included in a semiconductor device 1000 according to a twenty-first embodiment.

Next, a semiconductor device according to the twenty-first embodiment will be explained with reference to FIG. 43. In this twenty-first embodiment, similarly to in the eighth embodiment, the spare word line usage information $D_{SWLB}$ is sent from the fuse circuit 140 of the memory chip 10 to the BIST circuit 26 of the logic chip 20 to be used in a test of the memory chip 10 and generation of the additional defect address data Addfad. Other configurations are similar to the fourteenth embodiment.

[Twenty-second Embodiment]

Figure 44:
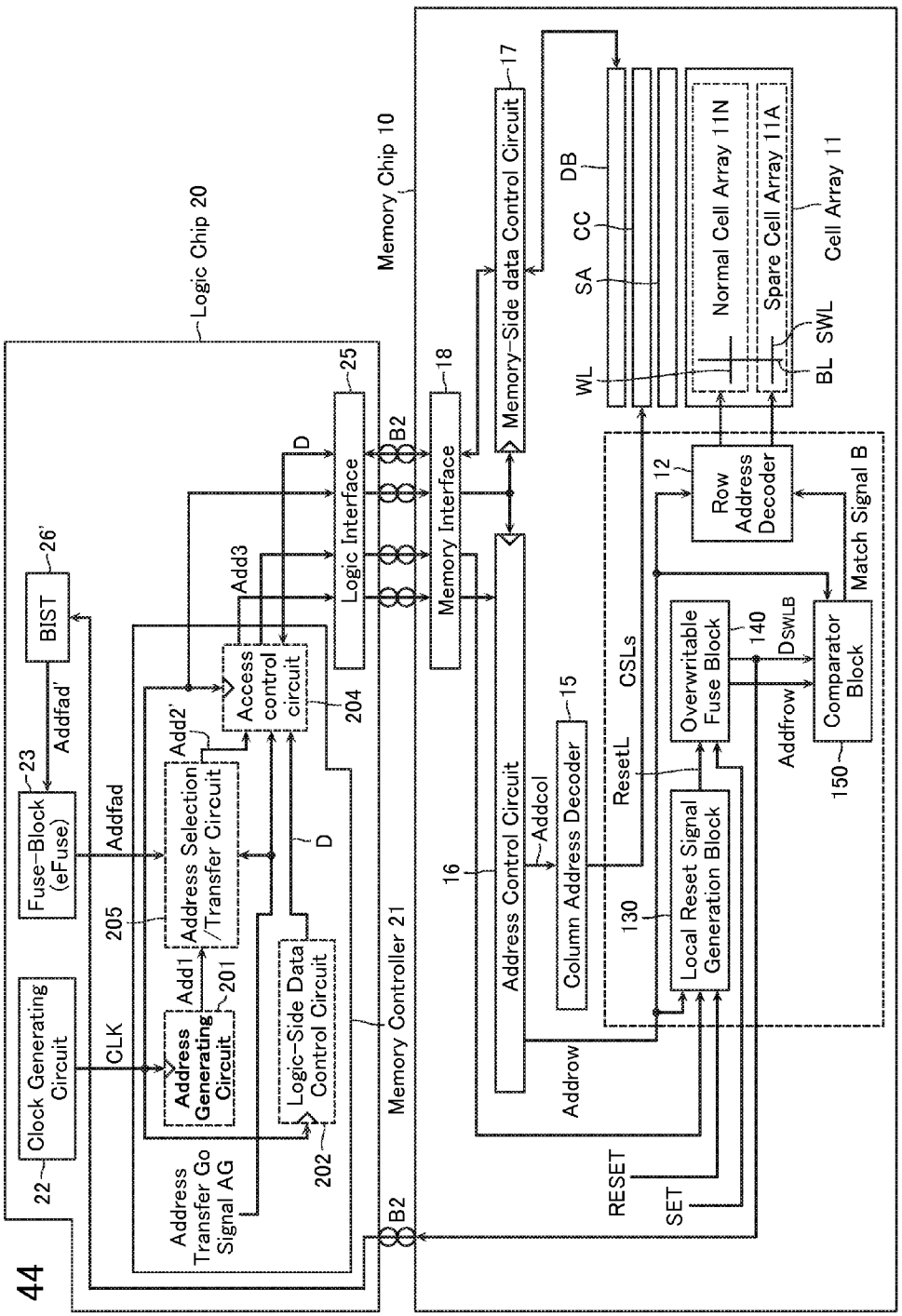
FIG. 44 is a block diagram showing an example of specific configurations of a memory chip 10 and a logic chip 20 included in a semiconductor device 1000 according to a twenty-second embodiment.

Next, a semiconductor device according to the twenty-second embodiment will be explained with reference to FIG. 44. In this embodiment, similarly to in the twenty-first embodiment, the spare word line usage information $D_{SWLB}$ is sent from the fuse circuit 140 of the memory chip 10 to the BIST circuit 26 of the logic chip 20 to be used in a test of the memory chip 10 and generation of the additional defect address data Addfad. However, in this embodiment, both the BIST circuit 26 and the fuse circuit 23 are provided.

[Twenty-third Embodiment]

Next, a semiconductor device according to the twenty-third embodiment will be explained with reference to FIG. 45.

Figure 45:
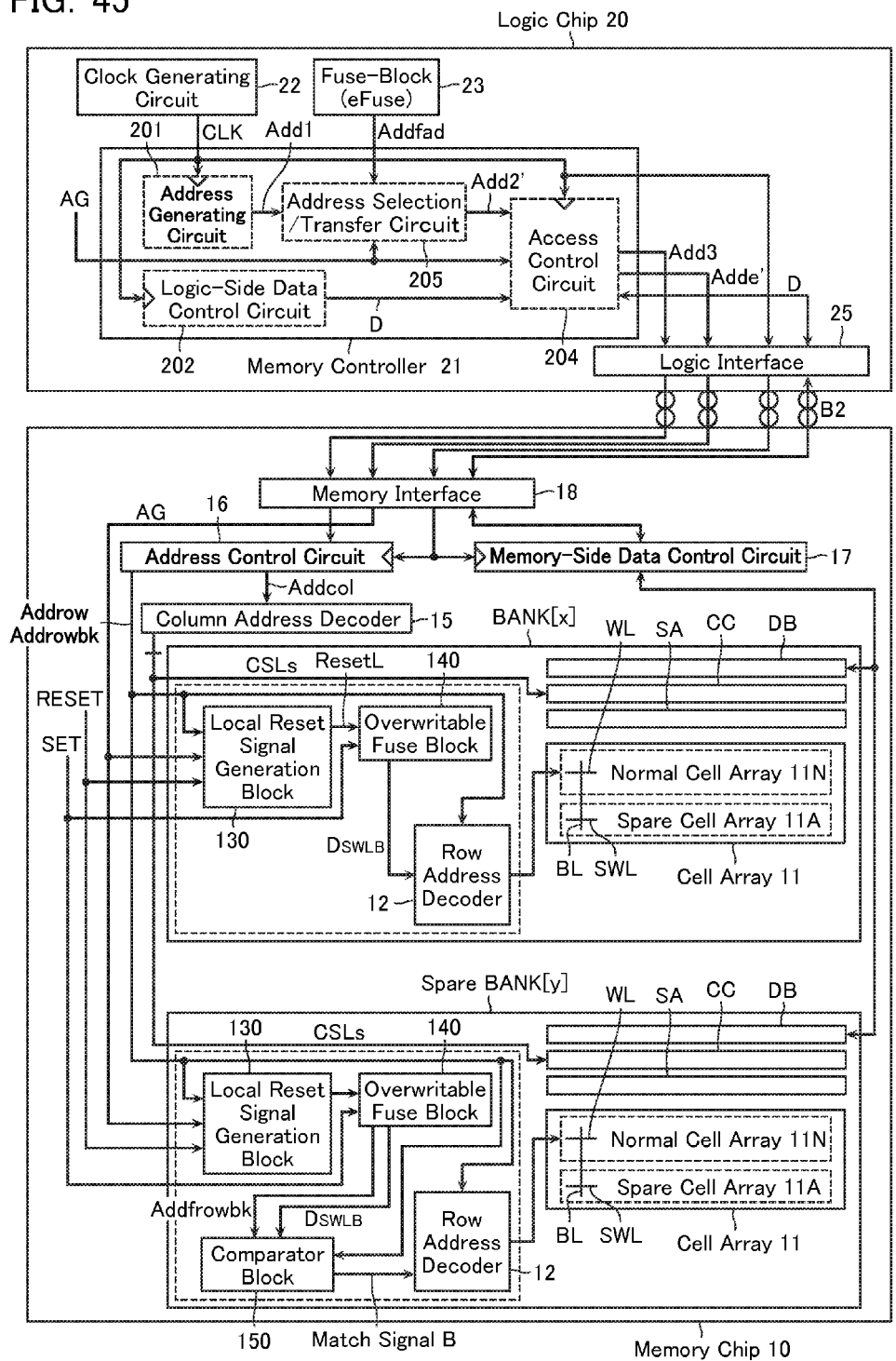
FIG. 45 is a block diagram showing an example of specific configurations of a memory chip 10 and a logic chip 20 included in a semiconductor device 1000 according to a twenty-third embodiment.

In FIG. 45, any components that are the same as the components in FIG. 24 (fourteenth embodiment) are denoted by the same reference numerals, and hence a detailed explanation about them will not be provided below.

In this twenty-third embodiment, similarly to in the thirteenth embodiment, when a defect has occurred during or after the packaging process, the bank BANK[x] where that defect occurred is replaced entirely by the spare bank Spare BANK[y].

The fuse circuit 23 in the logic chip 20 stores the bank address (defect bank address data) Addrowbk of the bank BANK[x] where the defect occurred during or after the packaging process, as the additional defect address data Addfad.

When this defect bank address data Addrowbk is inputted to the local reset signal generation circuit 130 of the bank BANK[x] along with the address transfer GO signal AG, the overwritable fuse block 140 is overwritten by the defect bank address data Addrowbk in accordance with the local reset signal ResetL. As a result, the bank BANK[x] becomes entirely unusable and is replaced by the spare bank Spare BANK[y].

Figure 46:
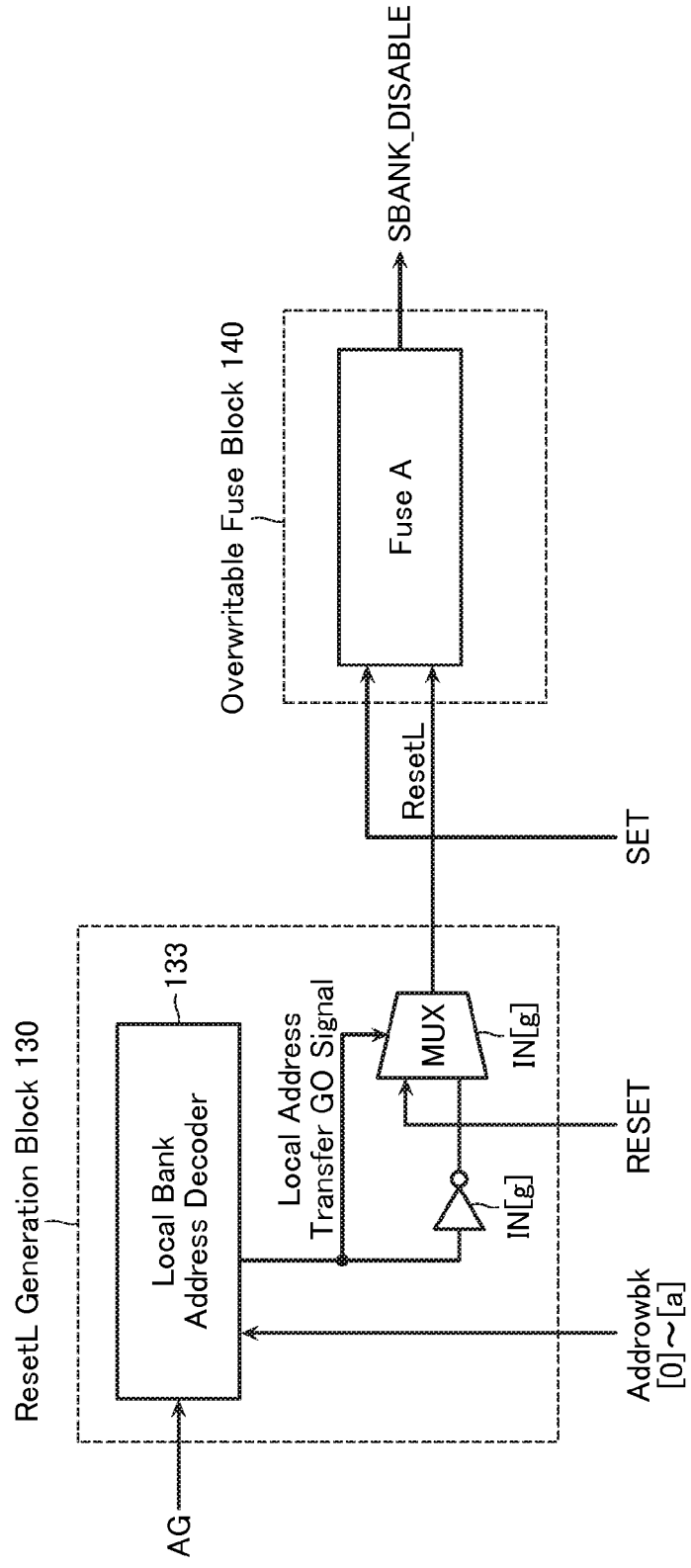
FIG. 46 is a more detailed block diagram of a local reset signal generation block 130 and an overwritable fuse block 140 in a bank BANK[x].

FIG. 46 is a more detailed block diagram of the local reset signal generation block 130 and the overwritable fuse block 140 in the bank BANK[x].

Figure 29:
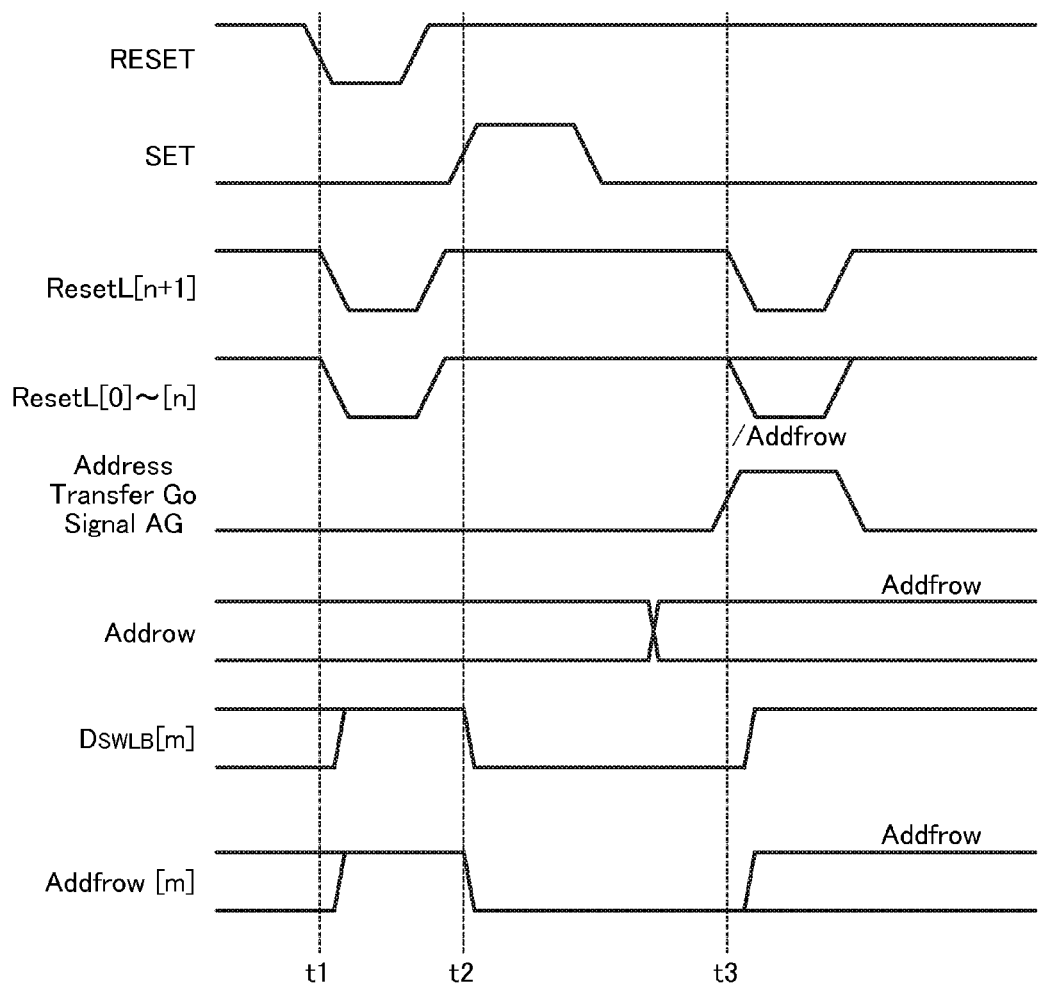
FIG. 29 is a timing chart explaining an overwrite operation of an additional defect address in the overwritable fuse circuit 140[m] in the fourteenth embodiment.

First, as shown in the timeline before time t2 in FIG. 29, the reset signal RESET and the set signal SET experience logic changes. Thereafter, the local address decoder 133 in the local reset signal generation block 130 is inputted with the address transfer GO signal AG and the defect bank address data Addrowbk[0]~[a] assigned with the bank BANK[x]. Then, the local address decoder 133 outputs the local address transfer GO signal LAG. The reset signal and the local address transfer GO signal LAG are inputted to the multiplexer MX(g). Then, the logic of the local reset signal ResetL changes. Thereby, information indicating that the bank BANK[x] specified by the defect bank address data Addrowbk cannot be used is written to the fuse circuit A in the overwritable fuse block 140 to output the spare bank disable signal SBANK_DISABLE. As a result, the bank BANK[x] becomes entirely unusable and is replaced by the spare bank Spare BANK[y].

Figure 47:
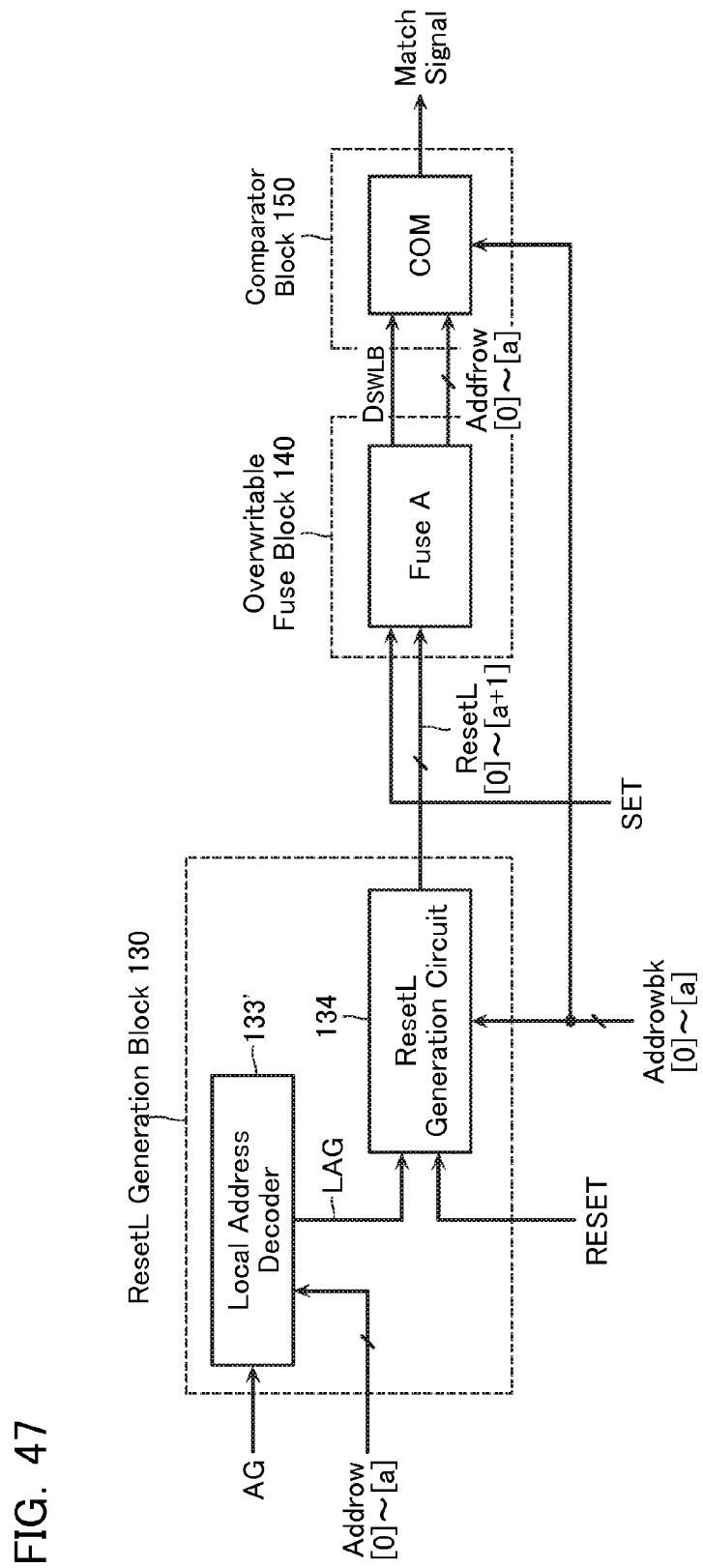
FIG. 47 is a more detailed block diagram of a local reset signal generation block 130, an overwritable fuse block 140, and a comparator block 150 in a spare bank Spare BANK[y].

FIG. 47 is a more detailed block diagram of the local reset signal generation block 130, the overwritable fuse block 140, and the comparator block 150 in the spare bank Spare BANK [y]. When the local decoder 133 is inputted with the address transfer GO signal AG and the row address data Addrow[0]~[a] for specifying the bank BANK[y] for relieving the bank BANK[x], the corresponding local address transfer GO signal LAG is outputted from the local decoder 133. When the local address transfer GO signal LAG is inputted to the local reset signal generation circuit 134 along with the defect bank address Addrowbk, local reset signals[0]~[a+1] are generated. As a result, the overwritable fuse block 140 is overwritten with the additional defect address Addfad.

[Twenty-fourth Embodiment]

Figure 48:
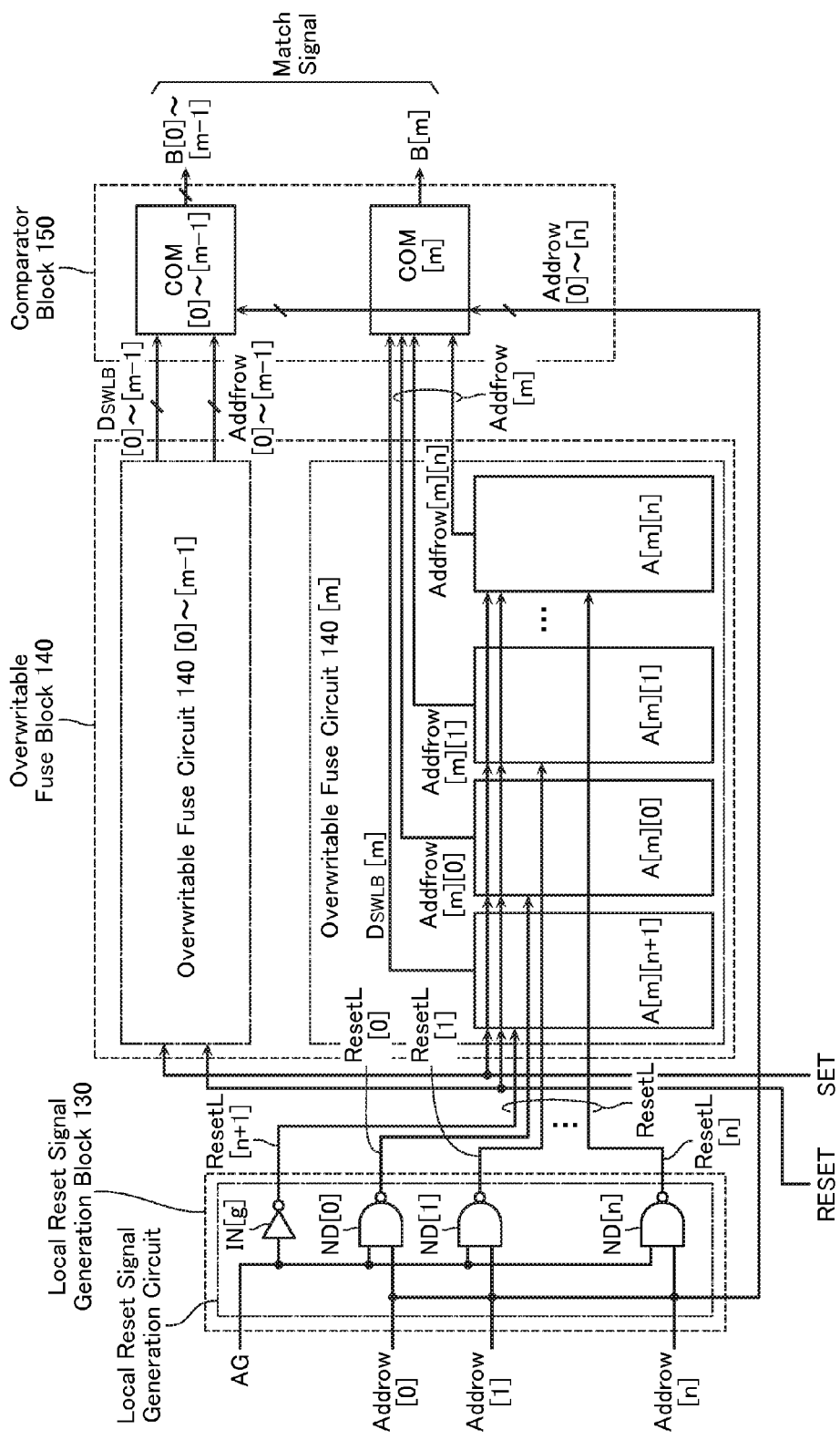
FIG. 48 is a block diagram showing an example of specific configurations of a semiconductor device 1000 (a block diagram showing configurations of a local reset signal generation block 130, an overwritable fuse block 140, and a comparator block 150) according to a twenty-fourth embodiment.

Next, a semiconductor device according to the twenty-fourth embodiment will be explained with reference to FIG. 48.

In this embodiment, specific configurations of the local reset signal generation block 130, the overwritable fuse block 140, and the comparator block 150 differ from those of the fourteenth embodiment. Other configurations are substantially similar to the fourteenth embodiment.

The local reset signal generation block 130 in this embodiment differs from the local reset signal generation block 130 of the fourteenth embodiment in comprising an inverter IN(g) and a plurality of NAND gates ND[0]~[n]. The latter comprise multiplexers MX for selectively outputting the reset signal RESET or the row address data Addrow, while the former does not have a configuration corresponding to that of the multiplexers MX. The overwritable fuse block 140 has the configuration corresponding to that of the multiplexers MX.

Figure 49:
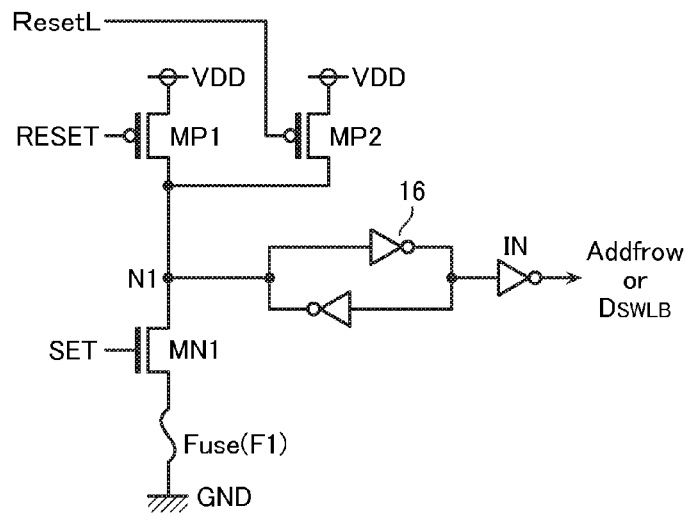
FIG. 49 is a circuit diagram explaining a specific configuration of an individual overwritable fuse circuit A in the overwritable fuse block 140 according to the twenty-fourth embodiment.

Next, a specific configuration of the individual overwritable fuse circuit A in the overwritable fuse block 140 will be explained with reference to FIG. 49. Any configurations that are the same as the configurations in the fourteenth embodiment (FIG. 27) are denoted by the same reference numerals, and hence a detailed explanation about them will not be provided.

Figure 50:
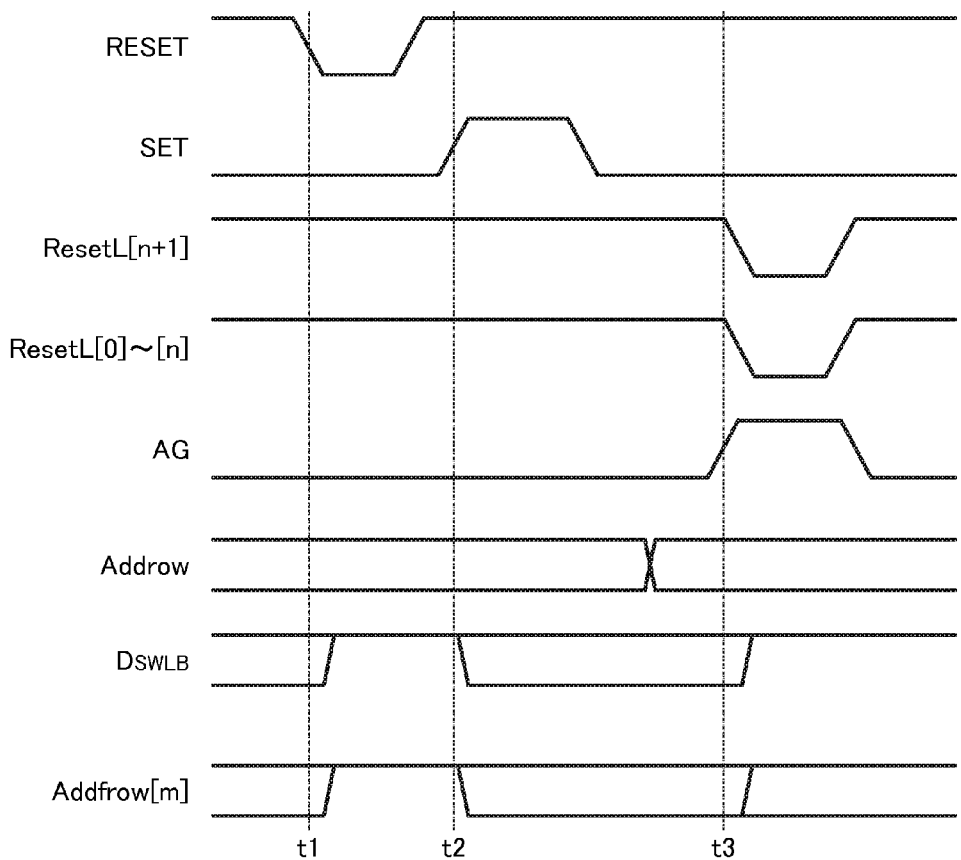
FIG. 50 is a timing chart showing operation in the twenty-fourth embodiment.

The individual fuse circuit A of this twenty-fourth embodiment differs from that of the fourteenth embodiment in comprising a PMOS transistor MP2 connected to the node N1. The PMOS transistor MP2 has its gate inputted with the local reset signal ResetL. On the other hand, the PMOS transistor MP1 has its gate inputted with the reset signal RESET only. As a result, the individual fuse circuit A is selectively inputted with the reset signal RESET or the local reset signal ResetL, hence can fulfill an identical function to the fourteenth embodiment (refer to FIG. 50).

[Twenty-fifth Embodiment]

Figure 51:
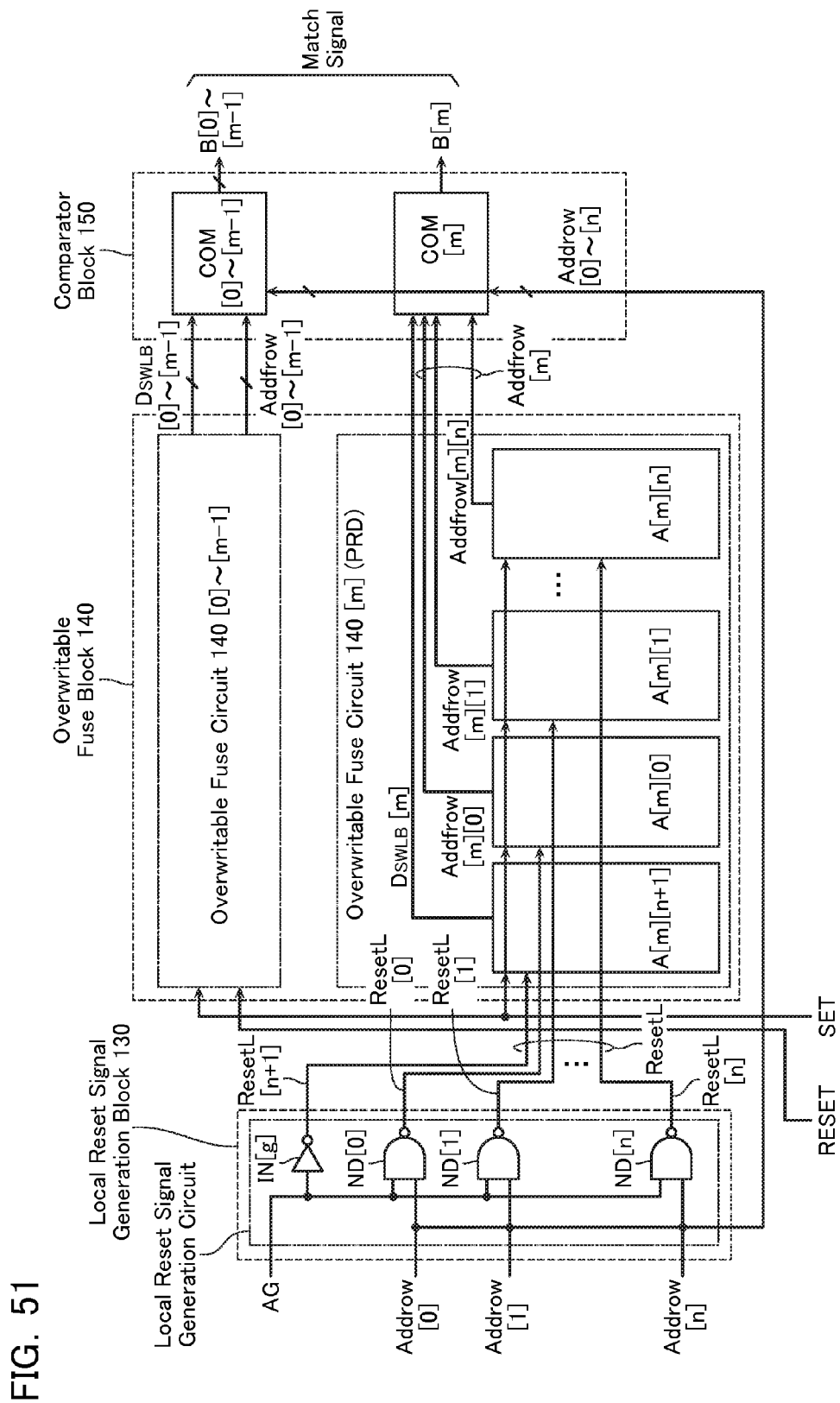
FIG. 51 is a block diagram showing an example of specific configurations of a semiconductor device 1000 (a block diagram showing configurations of a local reset signal generation block 130, an overwritable fuse block 140, and a comparator block 150) according to a twenty-fifth embodiment.

Next, a semiconductor device according to the twenty-fifth embodiment will be explained with reference to FIGS. 51 to 53.

This embodiment is different from the twenty-fourth embodiment in the configuration of the overwritable fuse block 140. The other configurations are the same as the twenty-fourth embodiment.

The overwritable fuse block 140 of this embodiment is different from that of the twenty-fourth embodiment in that the overwritable fuse circuit 140[m] (PRD) is used for relieving a defective cell that has occurred during or after a packaging process, and is not used for relieving a defective cell detected during the wafer process. Note that the configurations of the overwritable fuse circuits 140[0]-[m−1] may be identical to those in the above-described embodiments.

Next, the detailed configurations of the individual fuse circuit A[m][0]-[n+1] in the overwritable fuse circuit 140[m][0] (PRD) will be explained with reference to FIG. 52. Any components that are the same as the components of the twenty-fourth embodiment (FIG. 49) are denoted by the same reference numerals, and hence an explanation thereof will be omitted hereinbelow.

The individual fuse circuit A in the twenty-fifth embodiment is different from the individual fuse circuit A of the twenty-fourth embodiment in that the individual fuse circuit A does not have a fuse F1 because it is not used for relieving a defective cell detected in the wafer process as described above. That is, the source of the NMOS transistor MN1 is directly connected to a ground terminal GND. For the same reason, the PMOS transistor MP1 is also omitted.

Figure 52:
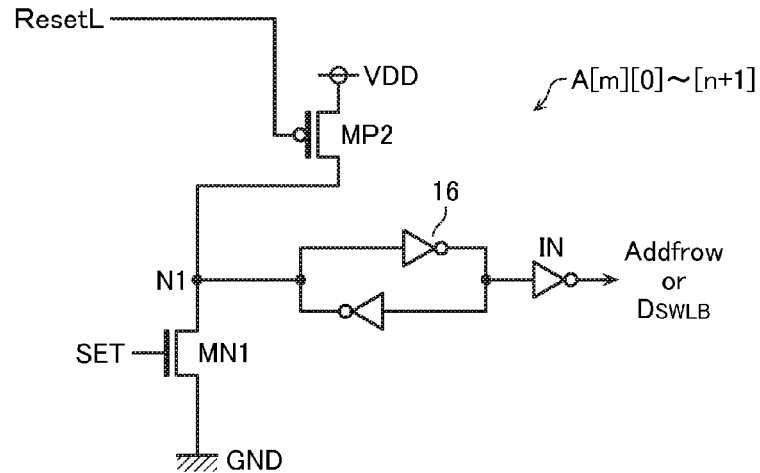
FIG. 52 is a circuit diagram explaining a specific configuration of an individual overwritable fuse circuit A in the overwritable fuse block 140 according to a twenty-fifth embodiment.
Figure 53:
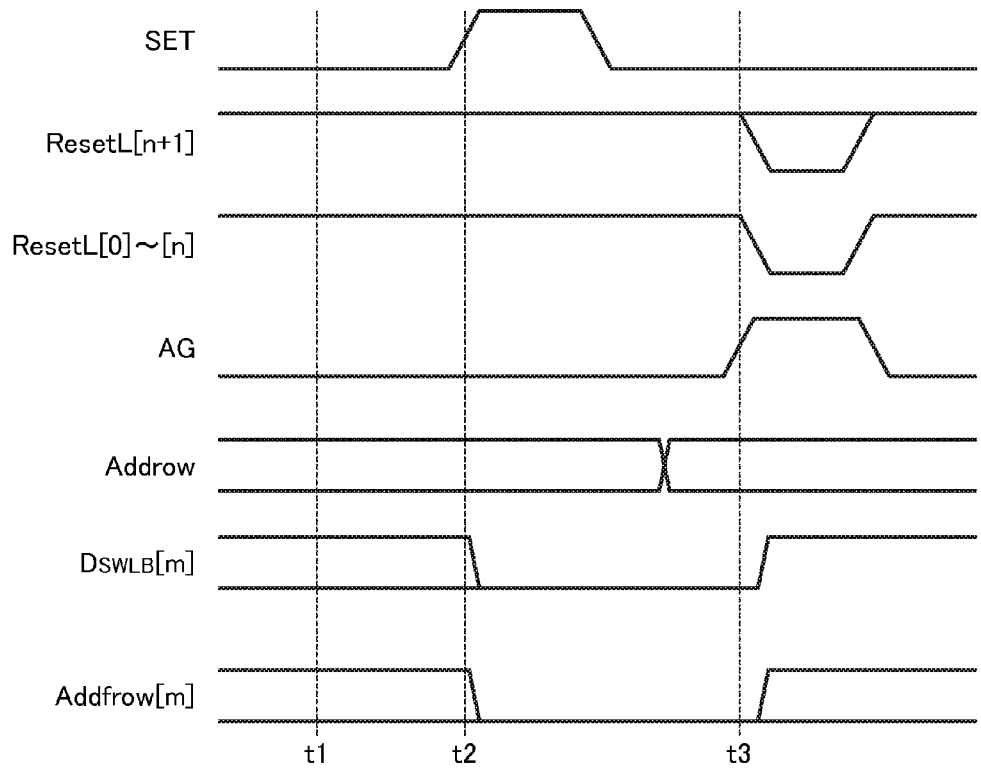
FIG. 53 is a timing chart showing operation in the twenty-fifth embodiment.

In addition, since the individual fuse circuit A in FIG. 52 is not used for relieving a defective cell detected in the wafer process, it operates as shown in a timing chart in FIG. 53. That is, the reset signal RESET is not inputted thereto, and an operation for reading row address data of a defective cell that has occurred in the wafer process is not conducted.

[Twenty-sixth Embodiment]

Next, a semiconductor device according to the twenty-sixth embodiment will be explained with reference to FIGS. 54 to 57.

Similar to the seventeenth embodiment (FIG. 36 and FIG. 37), this twenty-sixth embodiment relates to a semiconductor memory circuit which is enabled to, when a spare word line SWL[x] (x=0 to m) used for a defect relieving operation during a wafer process is detected as having a defect during a packaging process and thereafter, replace the the spare word line SWL [x] by another spare word line SWL [y] (y=0 to m, x≠y).

Figure 54:
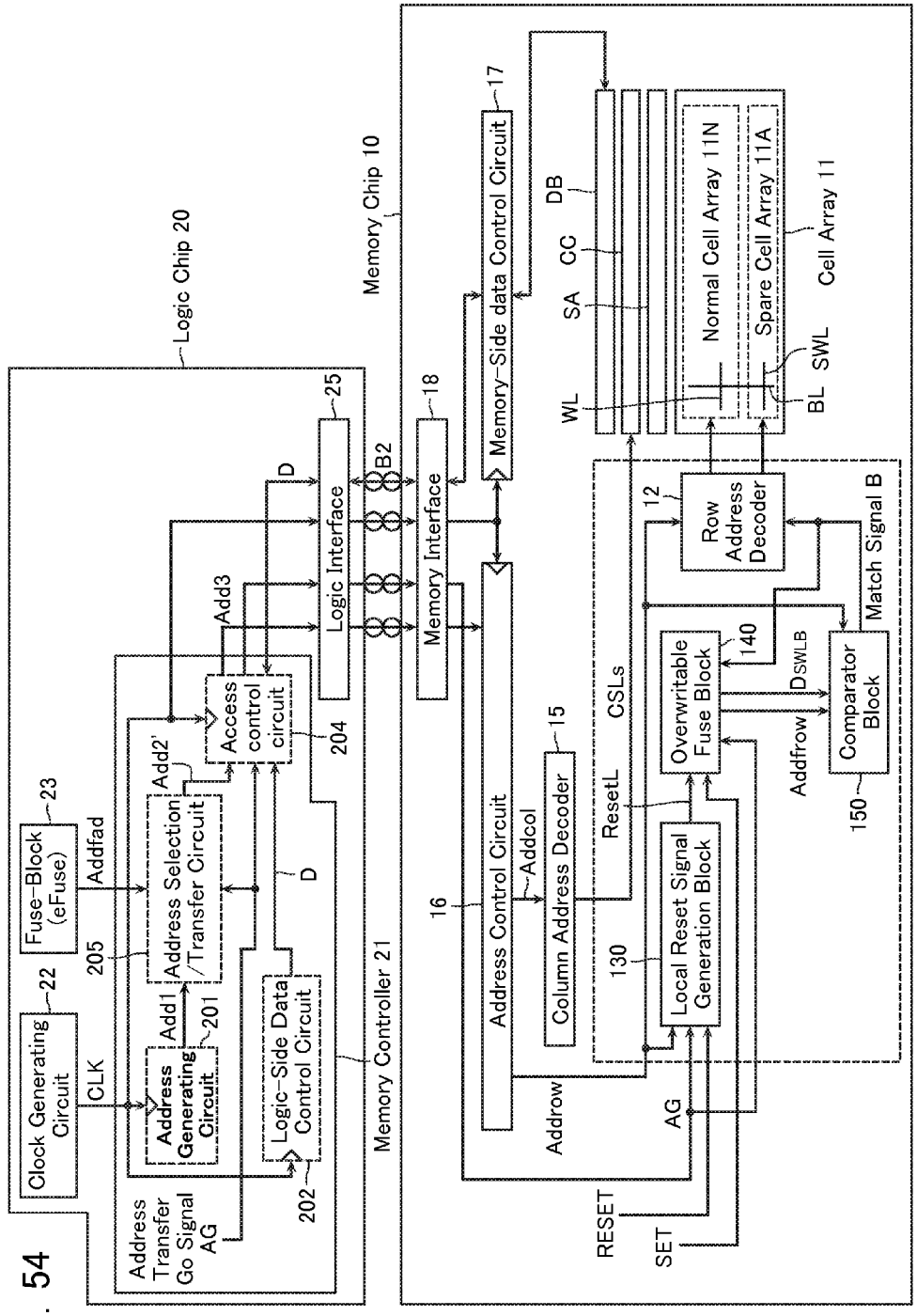
FIG. 54 is a block diagram showing an example of specific configurations of a memory chip 10 and a logic chip 20 included in a semiconductor device 1000 according to a twenty-sixth embodiment.

As shown in FIG. 54, in the semiconductor device according to the twenty-sixth embodiment, a match signal B from the comparator block 150 is fed back not only to the row address decoder 12 but also to the overwritable fuse block 140. Due to the feedback of the match signal B, the spare word line usage information $D_{SWLB}$ is rewritten in the overwritable fuse block 140, thereby the operation of the seventeenth embodiment (FIG. 37) may be performed. The detailed explanation thereof will follow.

Figure 55:
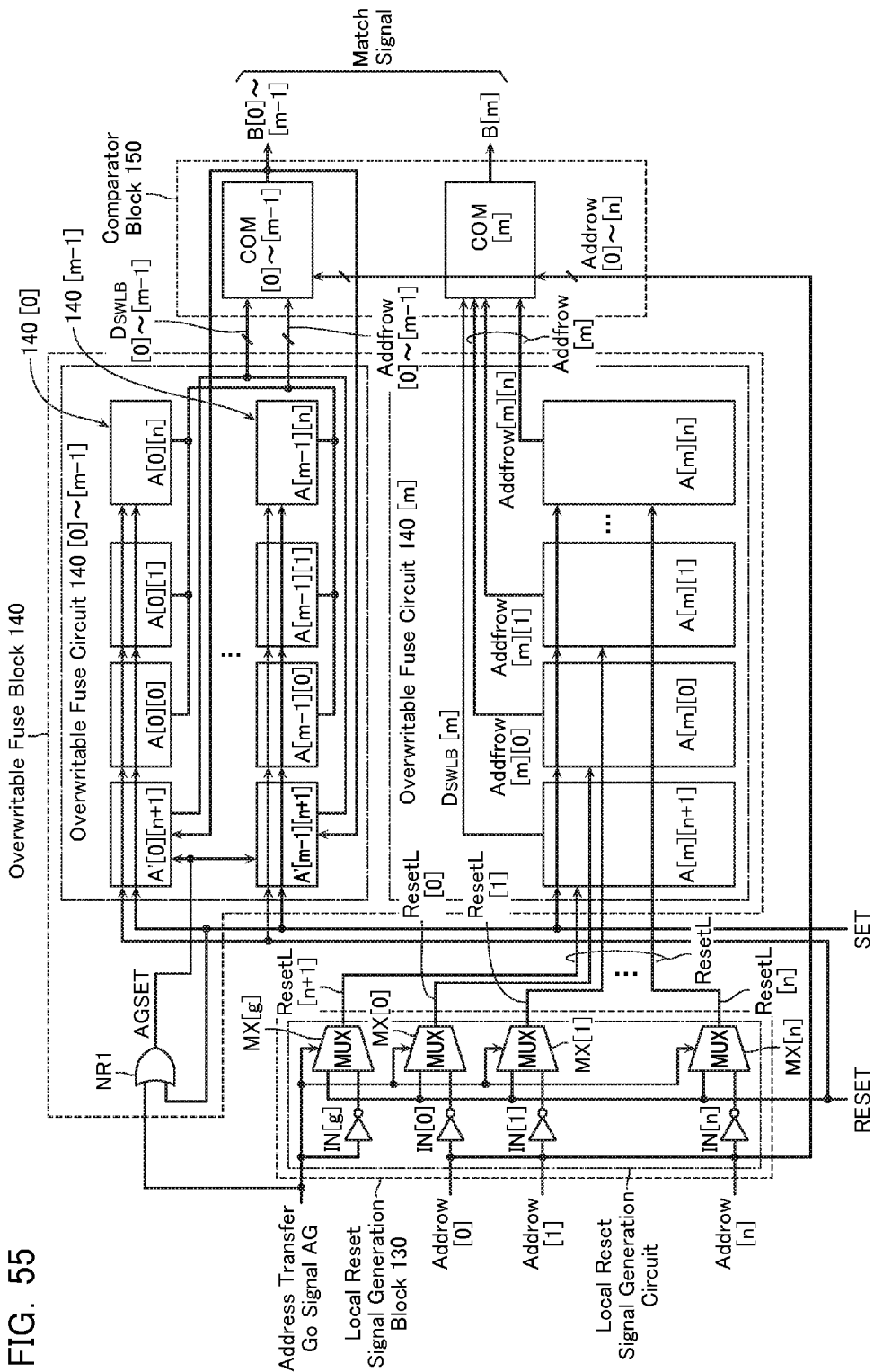
FIG. 55 is a block diagram showing an example of specific configurations of a semiconductor device 1000 (a block diagram showing configurations of a local reset signal generation block 130, an overwritable fuse block 140, and a comparator block 150) according to a twenty-sixth embodiment.

Referring now to FIG. 55, an example of specific configurations of the local reset signal generation block 130, the overwritable fuse block 140, and the comparator block 150 according to the twenty-sixth embodiment will be described. In FIG. 55, any components that are the same as the components in the above-described embodiments are denoted by the same reference numerals, and hence a overlapped explanation about them will not be provided below. Note that, in the circuit of FIG. 55, only one spare word line SWL [m] from among (m+1) pieces of spare word lines SWL [0]-[m] is used for relieving a defective cell that has occurred during or after a packaging process. Then, the remaining m pieces of spare word lines SWL[0]-[m−1] are used for relieving a defective cell that has occurred during a wafer process.

In this circuit of FIG. 55, the match signals B [0]-[m−1] that are output from the individual comparators COM[0]-[m−1] in the comparator block 150 are fed back to the individual fuse circuits A'[0][n+1]-[m−1][n+1]. In addition, a signal AGSET which is a logical sum of the address transfer GO signal AG and the set signal SET is input to the individual fuse circuits A'[0][n+1] to [m−1][n+1].

The signal AGSET may be obtained by inputting the address transfer GO signal AG and the set signal SET into an OR gate NR1. By inputting the match signals B[0] to [m−1] and the signal AGSET, the spare word line usage information $D_{SWLB}$ stored in the individual fuse circuits A'[0]-[m−1] is rewritten. That is, when there is a spare word line SWL[x] that was once selected in a wafer process but detected as being defective during or after a packaging process, selection of such the spare word line SWL[x] is cancelled. As a result, an similar operation to that of the seventeenth embodiment may be performed.

Figure 56:
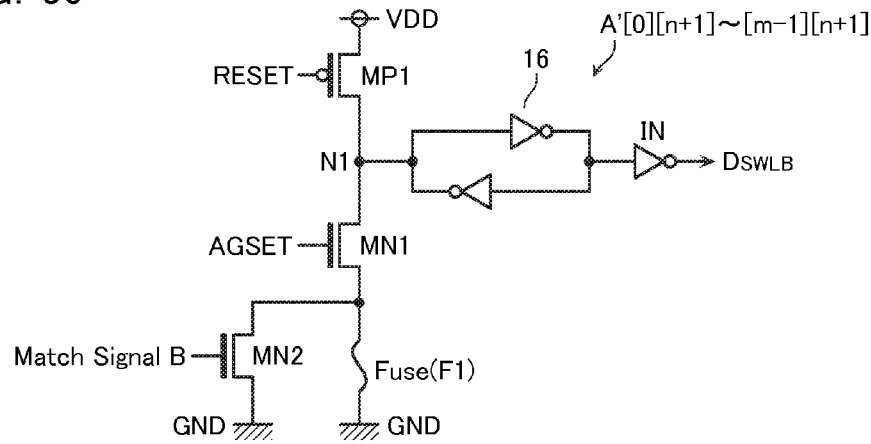
FIG. 56 is a circuit diagram explaining a specific configuration of an individual overwritable fuse circuit A' in the overwritable fuse block 140 according to a twenty-sixth embodiment.

FIG. 56 is a circuit diagram showing a configuration example of the individual fuse circuits A'[0][n+1] to [m−1][n+1] according to the twenty-sixth embodiment. These individual fuse circuits A'[0] [ n+1] to [m−1] [ n+1] each has a structure in which an NMOS transistor MN2 is added to the structure of the individual fuse circuit according to the fourteenth embodiment (FIG. 27). The NMOS transistor MN2 is connected in parallel with the fuse F1.

However, the reset signal RESET is input into a gate of the PMOS transistor MP1, and the signal AGSET is input into a gate of the NMOS transistor MN1, and the match signal B is input into a gate of the NMOS transistor MN2.

Figure 57:
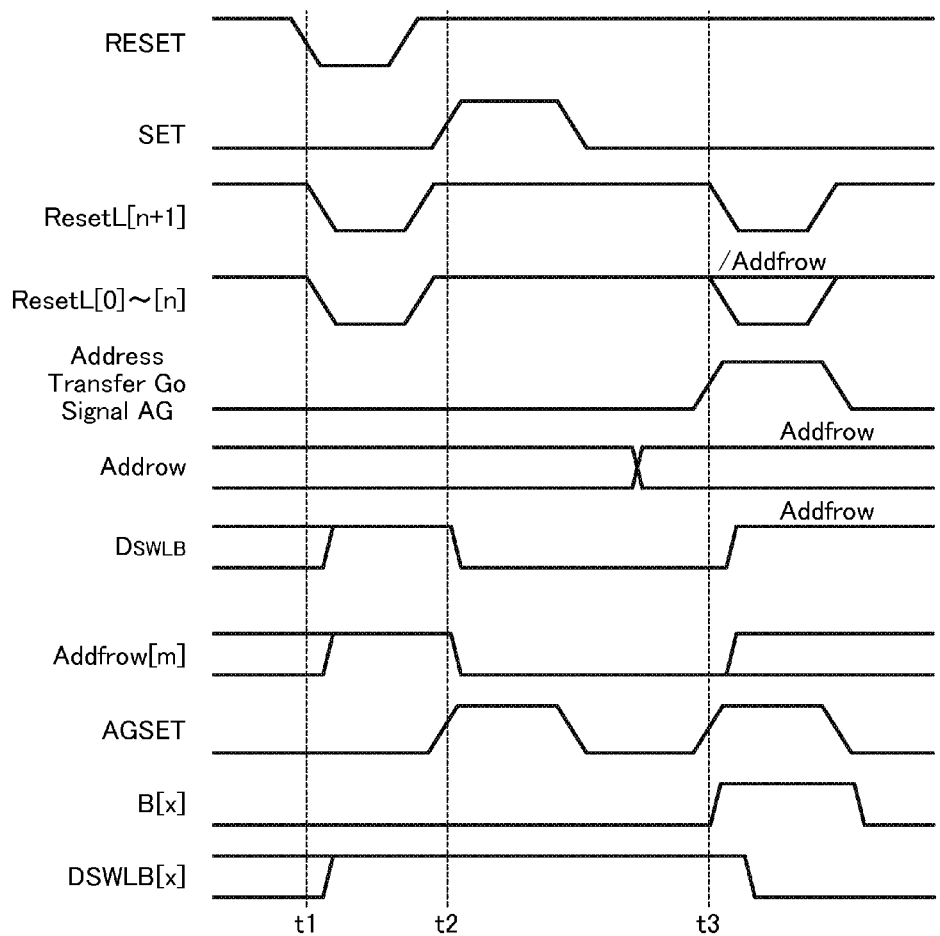
FIG. 57 is a timing chart showing operation in the twenty-sixth embodiment.

FIG. 57 is a timing chart showing operation of this twenty-sixth embodiment. The operation between time t1 and t2 is generally the same as that of fourteenth embodiment.

A first pulse of the signal AGSET is generated between time t2 and t3. Thus, the latch circuit 16 of the individual fuse circuit A' may latch data that changes according to whether the fuse F1 is melted or not, similarly to the individual fuse circuit A. When the fuse F1 is not melted, the node N1 is discharged to the ground potential GND by the generation of a pulse of the signal AGSET between time t2 and t3. Accordingly, data held in the individual fuse circuit A' does not change by the generation of the signal AGSET at time t3, which is described later.

Thereafter, when the address transfer GO signal AG becomes "H" for a certain period at time t3, the signal AGSET becomes "H" at the same time.

In this case, when the fuse F1 is not melted (that is, when the spare word line SWL [x] has not been used yet for substitution of a defect word line detected in a wafer process), the potential of the node N1 is kept at the ground voltage GND.

On the other hand, when the fuse F1 is melted (that is, when the spare word line SWL[x] is already used for substitution of a defect word line detected in a wafer process), the potential of the node N1 is kept at the power supply voltage VDD. However, when the match signal B="H" is input, the potential of the node N1 is discharged, and the potential of the node N1 becomes the ground voltage GND, even if the fuse F1 is melted. This allows the spare word line usage information $D_{SWLB}$[x] of the spare word line SWL[x] to be reset from "1" to "0", even if the spare word line SWL [x] has been already used for relief of a defect word line detected in a wafer process. Due to this, the spare word line SWL [x] is not used, and another spare word line SWL [y] is thereby used instead.

[Twenty-seventh Embodiment]

Figure 58:
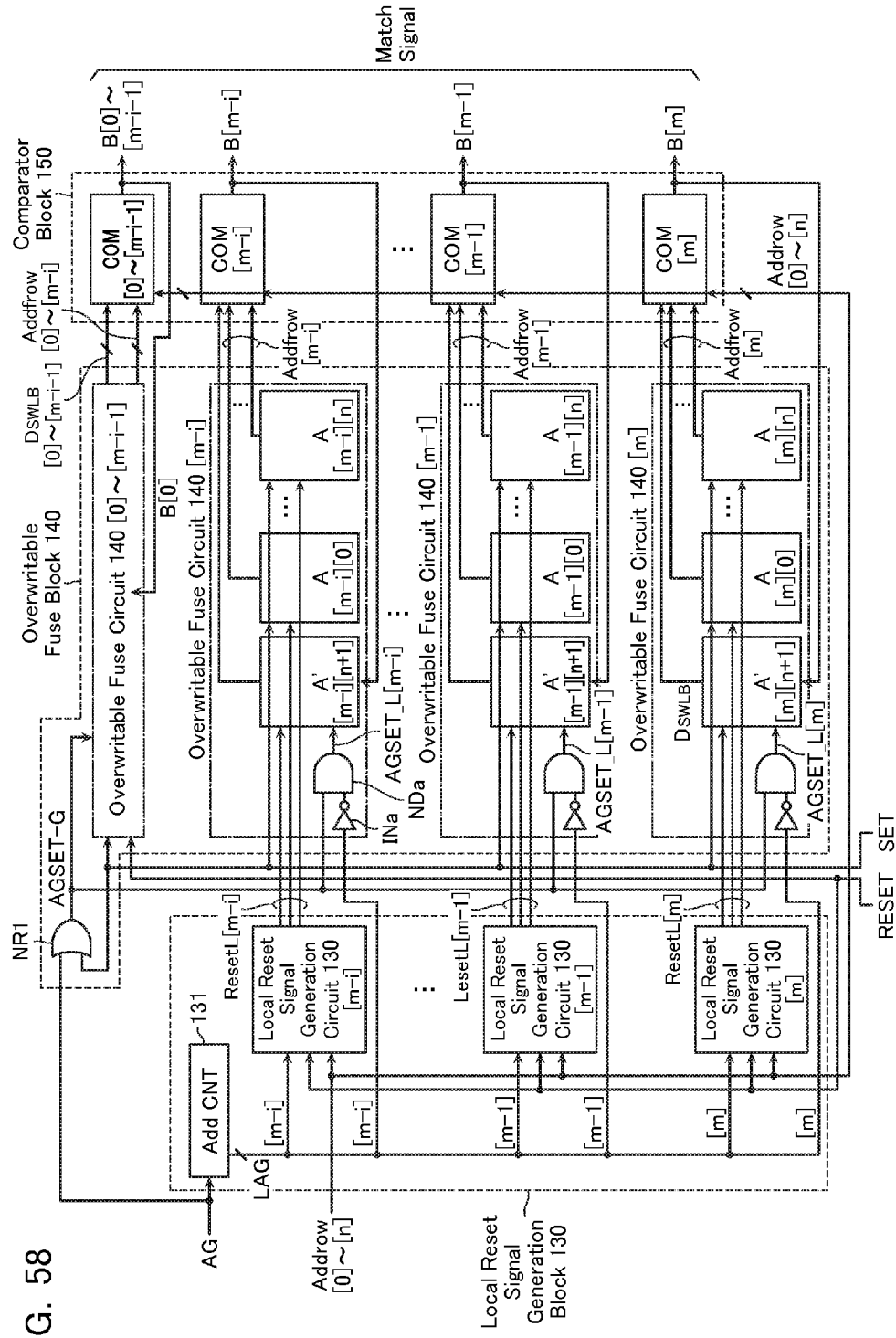
FIG. 58 is a block diagram showing an example of specific configurations of a semiconductor device 1000 (a block diagram showing configurations of a local reset signal generation block 130, an overwritable fuse block 140, and a comparator block 150) according to a twenty-seventh embodiment.

FIG. 58 illustrates a semiconductor device according to the twenty-seventh embodiment. The semiconductor device according to this twenty-seventh embodiment has a circuit structure as shown in FIG. 58. Any components that are the same as the components in the fifteen embodiment (FIG. 32) are denoted by the same reference numerals, and hence a overlapped explanation about them will not be provided below.

In this circuit, (i+1) pieces of spare word lines SWL [m-i]-[m] from among (m+1) pieces of spare word lines SWL[0]-[m] are used not only for relieving a defective cell that occurs in a wafer process, but also for relieving a defective cell that occurs during or after a packaging process. The remaining (m-i) pieces of spare word lines SWL[0]-[m-i-1] are used only for relieving a defective cell that occurs in a wafer process. Accordingly, the overwritable fuse circuits 140 [m−i]-[m] according to the twenty-seventh embodiment comprises an inverter INa and an AND gate NDa. Note that the individual fuse circuits A'[m−i][n+1]-[m][n+1] in the overwritable fuse circuit 140[m−i]-[m] have a structure that is the same as that of the individual fuse circuit A' in FIG. 56. However, the signal AGSET_L is input into a gate of the NMOS transistor MN1.

The inverter INa generates an inverted signal /LAG of the local address transfer GO signal LAG.

The AND gate NDa is included in each of the in fuse circuit 140[m−i]-[m]. The AND gates NDa output signals AGSET_L [m−i]-[m], each of which is a logical product signal of the signal AGSET_G and the signal /LAG, to the individual fuse circuits A'[m−i][n+1]-[m][n+1]. Note that a signal AGSET_G from the NOR gate NR1 is input into the individual fuse circuit A'[0][n+1]-[m−i−1][n+1] in the overwritable fuse circuits 140[0] to [m−i−1]. The signal AGSET_G is a signal which is the same as the above-mentioned signal AGSET.

On the other hand, in the overwritable fuse circuits 140[m−i]-[m], the signal AGSET_G is input into the AND gate NDa first. The individual fuse circuits A'[m−i][n+1]-[m][n+1] are provided with output signals AGSET_L[m−i]-[m] of the AND gate NDa. The inverter INa and the AND gate NDa are provided to prevent the spare word line usage information $D_{SWLB}$ from being reset to "0" in the overwritable fuse circuits 140[m−i]-[m] to which additional defect address Addfad has been transferred, when the match signal B[m−i]-[m] becomes "H".

Figure 59:
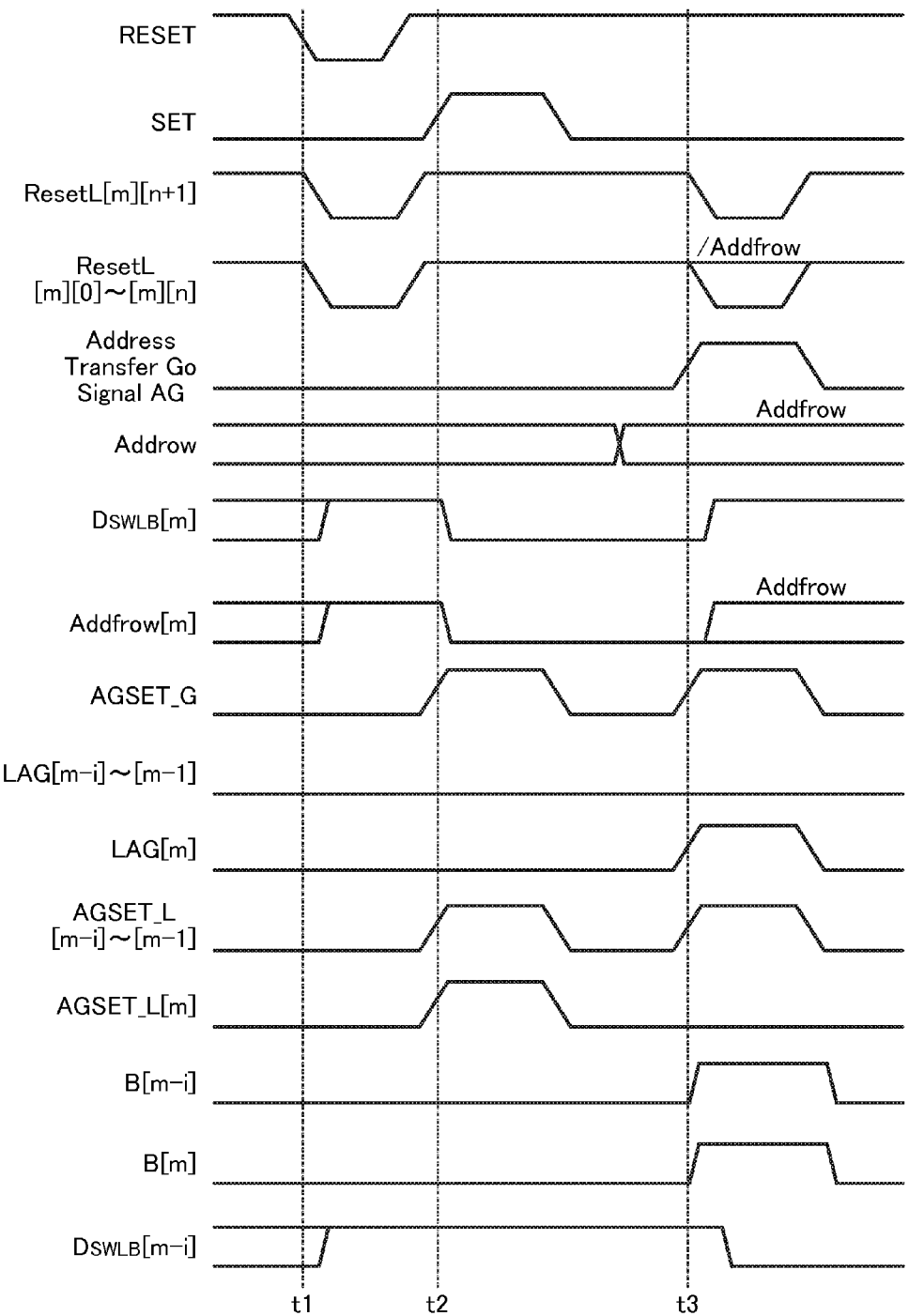
FIG. 59 is a timing chart showing operation in the twenty-seventh embodiment.

FIG. 59 is a timing chart showing the operation of the twenty-seventh embodiment. Here, a case where the spare word line SWL[m−i] is used for relieving a defective cell detected in a wafer process, but the spare word line SWL[m−i] is detected as defective during or after a packaging process, and is replaced by a spare word line SWL[m], will be explained as one example. That is, the additional defect address Addfad is transferred to the spare word line SWL[m]. It should be noted that, in a defect relieving operation performed during a wafer process, the spare word line SWL[0] is used first, and other spare word lines are used in an ascending order, in order to improve the relief efficiency. In a defect relieving operation performed during a packaging process or thereafter, the spare word line SWL[m] is used first, and other spare word lines are used in an descending order, in order to improve the relief efficiency.

The operation between time t1 and t2 is similar to above-mentioned embodiments, and data held in the fuse F1 is transferred and held in the latch circuit 16. In this case, since the spare word line SWL [m−i] is already used for defect relief in a wafer process, the spare word line usage information $D_{SWLB}$[m−i] held in the individual fuse circuit A' [m−i] [n+1] is "1". On the other hand, the spare word line SWL [m] is not used for defect relief in a wafer process, the spare word line usage information $D_{SWLB}$[m] kept in the individual fuse circuit A' [m] [n+1] is "0".

Then, at time t3, the address transfer GO signal AG becomes "H" for a certain period. This allows the signal AGSET_G to become "H" at the same time. In addition, the local address transfer GO signal LAG [m] corresponding to the overwritable fuse circuit 140[m] to which the additional defect address Addfad is to be transferred also becomes "H". The other local address transfer GO signals LAG [m−i]-[m−1] are kept at "L". Due to these operations, defect row address data Addfrow[m] corresponding to the additional defect address Addfad is thereby written in the overwritable fuse circuit 140[m], and the spare word line usage information $D_{SWLB}$[m]="1" is stored therein.

In this case, the individual comparator COM [m] outputs the match signal B[m]="H". It is necessary to prevent the spare word line usage information $D_{SWLB}$[m] stored in the overwritable fuse circuit 140[m] from being destroyed by this match signal B[m]. In this twenty-seventh embodiment, the signal AGSET_L[m] is kept at "L" because the local address transfer signal LAG [m] is set at "H" at time t3. The signal AGSET_L[m] is input into a gate of the transistor MN1 in the individual fuse circuit A'[m][n+1] (FIG. 56). Since the signal AGSET_L[m] is kept at "L", the potential of the node N1 is not discharged, even if the match signal B[m] becomes "H". Accordingly, the spare word line usage information $D_{SWLB}$[m] held in the individual fuse circuit A'[m][n+1] is kept at "1".

On the other hand, the local address transfer GO signals LAG[m−i]-[m−1] are kept at "L". Accordingly, a signal "H" is input into one input terminal of the AND gate NDa, and, as a result, the signals AGSET L[m−i]-[m−1] are each thereby input into a gate of the NMOS transistor MN1 shown in FIG. 56. When the individual comparator COM[m−i] outputs B[m−i]="H" in such a state, the node N1 of the individual fuse circuit A'[m−i][n+1] is discharged to a ground voltage GND, and the spare word line usage information $D_{SWLB}$[m−i] held in the individual fuse circuit A'[m−i][n+1] is thereby rewritten from "1" to "0". As a result, the spare word line SWL[m−i] is not selected, and the spare word line SWL [m] is thereby selected instead.

[Other]

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

For example, in the embodiments described above, a row redundancy scheme of replacing a word line connected to a defective cell with another word line has been explained. However, the present invention may also be applied when a column redundancy scheme is employed instead.

What is claimed is:

1. A semiconductor device, comprising:
a first semiconductor chip including a semiconductor memory device and provided in a package;
a second semiconductor chip including a control circuit configured to control the semiconductor memory device and provided in the package;
the first semiconductor chip including:
a memory cell array including a normal cell array configured by arranging memory cells at intersections of a plurality of first lines and a plurality of second lines, and a spare cell array configured by arranging spare cells for replacing the normal cell array;
a first defect address data storage circuit configured to store first defect address data indicating an address of a defective memory cell in the memory cell array;
a first comparison circuit configured to compare address data indicating an address of a memory cell with the first defect address data to output a first match signal in case of matching; and
a decoder configured to decode the address data to select the memory cell in the normal cell array, or, when the first match signal is output, to select a first spare cell in the spare cell array instead of the memory cell in the normal cell array,
the second semiconductor chip including:
a control circuit configured to control an operation of the first semiconductor chip;
a second defect address data storage circuit configured to store second defect address data indicating an address of a defective memory cell in the memory cell array; and
a second comparison circuit configured to compare the address data with the second defect address data to output a second match signal in case of matching, and
the decoder being configured to select a second spare cell in the spare cell array when the second match signal is output,
wherein the first semiconductor chip includes a normal bank and a spare bank,
the normal bank includes the normal cell array and a first spare cell array, and
the spare bank includes the normal cell array and a second spare cell array.

2. The semiconductor device according to claim 1,
wherein the second semiconductor chip further includes an address generating circuit configured to newly generate address data indicating an address in the spare cell array based on the address data when the second match signal is output.

3. A semiconductor device, comprising:
a first semiconductor chip including a semiconductor memory device and provided in a package;
a second semiconductor chip including a control circuit configured to control the semiconductor memory device and provided in the package;
the first semiconductor chip including:
a memory cell array including a normal cell array configured by arranging memory cells at intersections of a plurality of first lines and a plurality of second lines, and a spare cell array configured by arranging spare cells for replacing the normal cell array;
a first defect address data storage circuit configured to store first defect address data indicating an address of a defective memory cell in the memory cell array and to be overwritable;

a comparison circuit configured to compare address data indicating an address of a memory cell with the first defect address data to output a match signal in case of matching; and a decoder configured to decode the address data to select the memory cell in the normal cell array, and select a first spare cell in the spare cell array instead of the memory cell in the normal cell array when the match signal is output, the second semiconductor chip including:

a control circuit configured to control an operation of the first semiconductor chip;

a second defect address data storage circuit configured to store second defect address data indicating an address of a defective memory cell in the memory cell array; and an address transfer circuit configured to transfer the second defect address data to the first defect address data storage circuit in accordance with an address transfer instruction signal.

4. The semiconductor device according to claim 3, wherein the first defect address data storage circuit includes:

a fuse configured to be capable of being written with the first defect address data before sealing by the package;

a latch circuit configured to be capable of retaining data stored by the fuse; and a switching circuit configured to transfer the second defect address data to the latch circuit, and wherein the second defect address data storage circuit is a fuse circuit configured to be capable of being written with the second defect address data after sealing by the package.

5. The semiconductor device according to claim 3, wherein the first defect address data storage circuit retains defect address data about the normal cell array and defect address data about the spare cell array as the first defect address data.

6. The semiconductor device according to claim 3, wherein the first defect address data storage circuit retains line usage information specifying a usable first line among a plurality of first lines in the spare cell array.

7. The semiconductor device according to claim 3, wherein the second defect address data storage circuit is included in a BIST circuit.

8. The semiconductor device according to claim 7, further comprising a fuse circuit configured to retain defect address data specified based on a test performed by the BIST circuit.

9. The semiconductor device according to claim 7, wherein the first defect address data storage circuit retains line usage information specifying a usable first line among a plurality of first lines in the spare cell array, and the line usage information is sent to the BIST circuit.

10. The semiconductor device according to claim 3, wherein the first defect address data storage circuit further includes a first storage circuit and a second storage circuit, and the second storage circuit is configured to store the second defect address data only.

11. The semiconductor device according to claim 10, wherein the second storage circuit further includes:

a latch circuit configured to store data; and a switching circuit configured to transfer the second defect address data to the latch circuit.

12. The semiconductor device according to claim 6, wherein the first defect address data storage circuit rewrites the line usage information based on the match signal.

13. The semiconductor device according to claim 3, wherein the first defect address data storage circuit includes:

a fuse configured to be capable of being written with the first defect address data before sealing by the package;

a latch circuit configured to be capable of retaining data stored by the fuse;

a first switching circuit configured to turn on when reading the first defect address data from the fuse; and a second switching circuit configured to transfer the second defect address data to the latch circuit, wherein the second defect address data storage circuit is a fuse circuit configured to be capable of being written with the second defect address data after sealing by the package.

14. The semiconductor device according to claim 3, wherein the first defect address data storage circuit includes an counter configured to count the number of transmission of the address transfer instruction signal, and the first defect address data storage circuit determines where the second defect address data is to be overwritten therein based on the number.

15. The semiconductor device according to claim 3, wherein the comparison circuit includes a circuit configured to disable the match signal.

16. The semiconductor device according to claim 3, wherein the first defect address data storage circuit includes a local address decoder configured to receive an address signal to output a local address signal based on the address signal, and the first defect address data storage circuit determines where the second defect address data is to be overwritten therein based on the local address signal.

17. The semiconductor device according to claim 3, wherein the first semiconductor chip includes a normal bank and a spare bank, the normal bank includes the normal cell array and a first spare cell array, and the spare bank includes the normal cell array and a second spare cell array.

18. The semiconductor device according to claim 12, wherein the first defect address data storage circuit includes an counter configured to count the number of transmission of the address transfer instruction signal, and the first defect address data storage circuit determines where the second defect address data is to be overwritten therein based on the local address signal.

\* \* \* \* \*